(12) United States Patent
Yanagita et al.

(10) Patent No.: US 7,579,257 B2
(45) Date of Patent: Aug. 25, 2009

(54) SAMPLE SEPARATING APPARATUS AND METHOD, AND SUBSTRATE MANUFACTURING METHOD

(75) Inventors: Kazutaka Yanagita, Yokohama (JP); Kazuaki Ohmi, Yokohama (JP); Kiyofumi Sakaguchi, Yokohama (JP)

(73) Assignee: Canon Kabuhsiki Kaisha, Tokyo (JP)

( * ) Notice: Subject to any disclaimer, the term of this patent is extended or adjusted under 35 U.S.C. 154(b) by 305 days.

(21) Appl. No.: 10/963,483

(22) Filed: Oct. 12, 2004

(65) Prior Publication Data

US 2005/0045274 A1 Mar. 3, 2005

Related U.S. Application Data

(62) Division of application No. 10/330,705, filed on Dec. 27, 2002, now abandoned, which is a division of application No. 09/434,740, filed on Nov. 5, 1999, now Pat. No. 6,527,031.

(30) Foreign Application Priority Data

Nov. 6, 1998 (JP) .................... 10-316574
Sep. 27, 1999 (JP) .................... 11-272987

(51) Int. Cl.
H01L 21/30 (2006.01)
(52) U.S. Cl. ..................... 438/455
(58) Field of Classification Search ........... 438/455, 438/458; 83/177, 22, 24, 53, 98; 156/344, 156/584

See application file for complete search history.

(56) References Cited

U.S. PATENT DOCUMENTS 2,191,513 A 2/1940 Bigelow
2,517,394 A 8/1950 Tellier (Continued)

FOREIGN PATENT DOCUMENTS

EP 0560439 9/1993

(Continued)

OTHER PUBLICATIONS

EPO Search Report issued Jul. 8, 2004, for counterpart application EP 99308761.8.
"Single-Crystal Silicon on Non-Single-Crystal Insulators", G.W. Cullen, *Journal of Crystal Growth*, vol. 63, No. 3, pp. 429-590, 1983.
"Crystalline Quality of Silicon Layer Formed by FIPOS Technology", Kazuo Imai et al., *Journal of Crystal Growth*, vol. 63, pp. 547-553, 1987.

(Continued)

*Primary Examiner*—Mark A Osele
(74) *Attorney, Agent, or Firm*—Canon U.S.A., Inc., IP Division

(57) ABSTRACT

This invention is to provide a technique of separating bonded substrate stacks having porous layers at a high yield. A separating apparatus (100) has a pair of substrate holding portions (270, 280). A bonded substrate stack (50) is sandwiched from upper and lower sides and horizontally held by the substrate holding portions (270, 280) and rotated. A jet is ejected from a nozzle (260) and injected into the porous layer of the bonded substrate stack (50), thereby separating the bonded substrate stack (50) into two substrates at the porous layer. Another separating apparatus (5000) has a pair of substrate holding portions (270, 280), a nozzle (260) of rejecting a fluid to the porous layer of a bonded substrate stack (50), and an abrupt operation prevention mechanism (4000) for preventing the lower substrate holding portion (280) from abruptly moving downward but allowing it to moderately move when separating the bonded substrate stack (50).

21 Claims, 40 Drawing Sheets

U.S. PATENT DOCUMENTS

| | | | |
|---|---|---|---|
| 3,094,207 A | 6/1963 | Millhiser et al. | |
| 3,489,608 A | 1/1970 | Jacobs et al. | |
| 3,493,155 A | 2/1970 | Litant et al. | |
| 3,549,446 A | 12/1970 | Bennett et al. | |
| 3,667,661 A | 6/1972 | Farmer | |
| 3,730,410 A | 5/1973 | Altshuler | |
| 3,970,471 A | 7/1976 | Bankes et al. | |
| 4,047,973 A | 9/1977 | Williams | |
| 4,208,760 A | 6/1980 | Dexter et al. | |
| 4,215,928 A | 8/1980 | Bayley et al. | |
| 4,850,381 A | 7/1989 | Moe et al. | |
| 4,887,904 A | 12/1989 | Nakazato et al. | |
| 4,915,564 A | 4/1990 | Eror et al. | |
| 4,962,879 A | 10/1990 | Goesele et al. | |
| 4,985,722 A | 1/1991 | Ushijima et al. | |
| 5,100,544 A | 3/1992 | Izutani et al. | |
| 5,248,886 A | 9/1993 | Asakawa et al. | |
| 5,255,853 A | 10/1993 | Munoz | |
| 5,292,393 A | 3/1994 | Maydan et al. | |
| 5,357,645 A | 10/1994 | Onodera | |
| 5,374,564 A | 12/1994 | Bruel | |
| 5,379,235 A | 1/1995 | Fisher et al. | |
| 5,447,596 A | 9/1995 | Hayase | |
| 5,510,019 A | 4/1996 | Yabumoto et al. | |
| 5,570,994 A | 11/1996 | Somekh et al. | |
| 5,653,247 A | 8/1997 | Murakami | |
| 5,679,405 A | 10/1997 | Thomas et al. | |
| 5,697,405 A | 12/1997 | Dornier et al. | |
| 5,700,127 A | 12/1997 | Harada et al. | |
| 5,746,565 A | 5/1998 | Tepolt | |
| 5,747,387 A | 5/1998 | Koizumi et al. | |
| 5,783,022 A | 7/1998 | Cha et al. | |
| 5,792,709 A | 8/1998 | Robinson et al. | |
| 5,795,401 A | 8/1998 | Itoh et al. | |
| 5,803,932 A | 9/1998 | Akimoto et al. | |
| 5,810,028 A | 9/1998 | Ichikawa et al. | |
| 5,811,348 A | 9/1998 | Matsushita et al. | |
| 5,820,329 A | 10/1998 | Derbinski et al. | |
| 5,849,602 A | 12/1998 | Okamura et al. | |
| 5,876,497 A | 3/1999 | Atoji | |
| 5,928,389 A | 7/1999 | Jevtic | |
| 5,934,856 A | 8/1999 | Asakawa | |
| 5,954,888 A | 9/1999 | Gupta et al. | |
| 5,994,207 A | 11/1999 | Henley et al. | |
| 6,007,675 A | 12/1999 | Toshima | |
| 6,058,945 A | 5/2000 | Fujiyama et al. | |
| 6,092,578 A * | 7/2000 | Machida et al. | 156/358 |
| 6,122,526 A | 9/2000 | Nguyen et al. | |
| 6,131,589 A | 10/2000 | Vogtmann et al. | |
| 6,168,499 B1 | 1/2001 | Jang | |
| 6,221,740 B1 | 4/2001 | Bryan et al. | |
| 6,277,234 B1 | 8/2001 | Freund et al. | |
| 6,321,134 B1 | 11/2001 | Henley et al. | |
| 6,382,292 B1 | 5/2002 | Ohmi et al. | |
| 6,391,740 B1 | 5/2002 | Cheung et al. | |
| 6,418,999 B1 | 7/2002 | Yanagita et al. | |
| 6,507,187 B1 * | 1/2003 | Olivas et al. | 324/207.21 |
| 6,527,031 B1 | 3/2003 | Yanagita et al. | |
| 6,534,383 B1 * | 3/2003 | Iwane et al. | 438/458 |
| 6,672,358 B2 | 1/2004 | Yanagita et al. | |
| 6,827,809 B2 * | 12/2004 | Anker | 156/249 |
| 6,884,694 B2 * | 4/2005 | Park et al. | 438/455 |
| 2004/0166653 A1 * | 8/2004 | Kerdiles et al. | 438/458 |

FOREIGN PATENT DOCUMENTS

| | | | |
|---|---|---|---|
| EP | 0 709 876 A1 | 5/1996 | |
| EP | 0798762 | 10/1997 | |
| EP | 0837494 | 4/1998 | |
| EP | 0 840 381 A2 | 5/1998 | |
| EP | 0 843 345 A2 | 5/1998 | |
| EP | 0843340 | 5/1998 | |
| EP | 0 867 917 A2 | 9/1998 | |
| EP | 0 886 300 A2 | 12/1998 | |
| EP | 0 926 719 A2 | 6/1999 | |
| EP | 0 999 578 A2 | 5/2000 | |
| EP | 1 026 729 A2 | 8/2000 | |
| EP | 1 045 448 A1 | 10/2000 | |
| JP | 56-30650 | 3/1981 | |
| JP | 60-5530 | 1/1985 | 134/902 |
| JP | A60-005530 | 12/1985 | |
| JP | 63-16455 | 1/1988 | |
| JP | 4-293236 | 10/1992 | 134/902 |
| JP | 5-21338 | 1/1993 | |
| JP | 7-302889 | 11/1995 | |
| JP | 9-8095 * | 1/1997 | |
| JP | 9-167724 | 6/1997 | |
| JP | 10-064870 A | 3/1998 | |
| JP | 10-270533 A | 10/1998 | |
| JP | 10-284403 A | 10/1998 | |
| KR | 1998-33377 | 7/1998 | |
| WO | WO 98/02911 | 1/1998 | |
| WO | WO 99/06110 | 2/1999 | |
| WO | WO 99/06110 | 11/1999 | |
| WO | WO 01/04933 | 1/2001 | |
| WO | WO 01/10644 A1 | 2/2001 | |

OTHER PUBLICATIONS

"Silicon-On-Insulator by Wafer Bonding: A Review", W.P. Maszara, *Journal of Electrochemical Society*, vol. 138, pp. 341-347, 1991.

"Light Scattering Topography Characterization of Bonded SOI Wafer", H. Baumgart, et al., *Extended Abstracts*, vol. 91-2, pp. 733-734, 1991.

"Thinning of Bonded Wafer: Etch-Stop Approaches", Charges E. Hunt et al., *Extended Abstracts*, vol. 91-2, pp. 696-697, 1991.

"Epitaxial Layer Transfer by Bond and Etch Back of Porous Si", Takano Yonehara et al., *Applied Physics Letters*, vol. 64, pp. 2108-2110, 1994.

"Electrolytic Shaping of Germanium and Silicon", A. Uhlir et al., *Bell System Technical Journal*, vol. 35, pp. 333-347, 1956.

"Oxidized Porous Silicon and It's Application", K. Nagano et al., *The Transactions of the Institute of Electronics and Communication Engineets, The Institute of Electronics, Information and Communication engineers*, vol. 79, pp. 49-54, SSD 79-9549, 1979.

"A New Dielectric Isolation Method Using Porous Silicon", K. Imai, *Solid-State Electronics*, vol. 224, pp. 159-164, 1981.

"Silicon on Insulator Material by Wafer Bonding", Christine Harendt, Charles E. Hunt e al., *Journal of Electronic Materials*, vol. 20, pp. 267-277, 1991.

Michael Bruel, et al. "Smart-Cut: A New Silicon On Insulator Material Technology Based On Hydrogen Implantation And Wafer Bonding", *Jpn. J. Appl. Phys.* vol. 36, No. 3B, Part 01, Mar. 1, 1997, pp. 1636-1641.

"Water Jet", vol. 1, No. 1, p. 4 (1984).

Patent Abstracts of Japan, 09-167724; Jun. 24, 1997.

English Abstract for JPA 56-30650.

Office Action dated Jan. 14, 2003 from corresponding Korean Patent Application No. 10-1999-0049123.

Chinese Office Action dated Jun. 20, 2003 in counterpart application No. 99123433.2.

A communication for European Application No. 2689130 dated Nov. 18, 2004.

A communication for European Application No. 2689430 dated Nov. 23, 2004.

A communication for European Application No. 2689530 dated Nov. 25, 2004.

Japanese Office Action dated Oct. 17, 2008, issued on JP Patent Application No. 10-316575, which is a counterpart application of U.S. Appl. No. 09/434,741, of which the present application claims domestic priority.

* cited by examiner

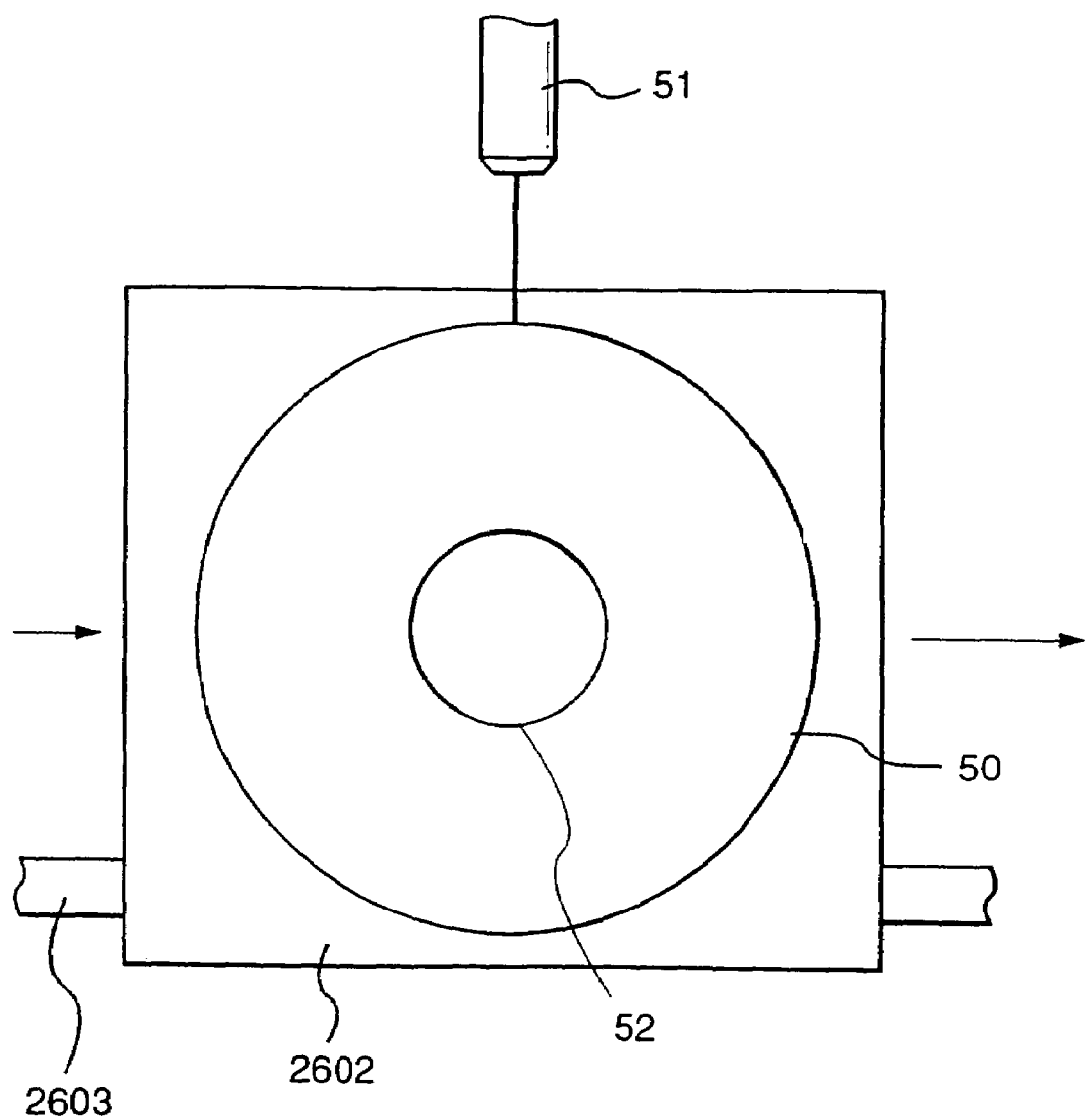
F I G. 36

F I G. 37A
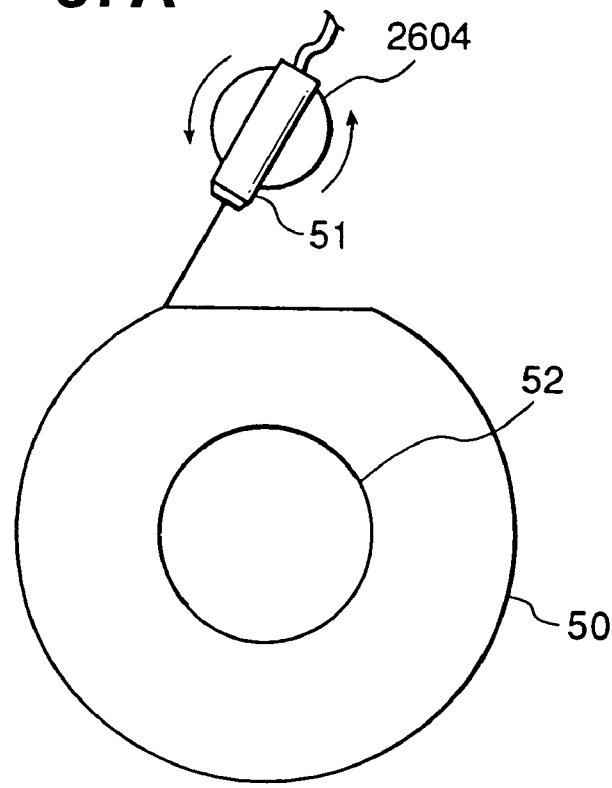
F I G. 37B
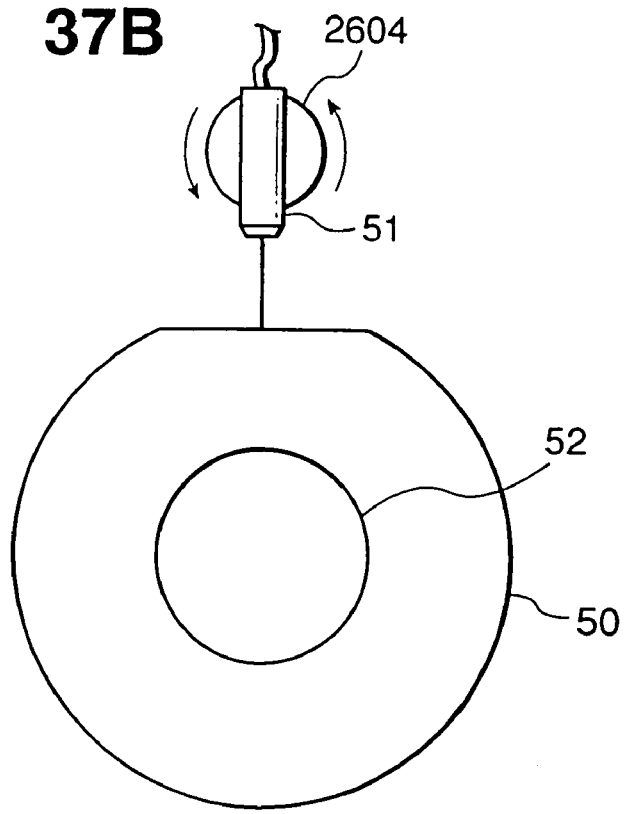

SAMPLE SEPARATING APPARATUS AND METHOD, AND SUBSTRATE MANUFACTURING METHOD

This is a divisional of prior application Ser. No. 10/330,705, filed Dec. 27, 2002, now abandoned which is a divisional of prior application Ser. No. 09/434,740, filed Nov. 5, 1999 now U.S. Pat. No. 6,527,031.

BACKGROUND OF THE INVENTION

1. Field of the Invention

The present invention relates to a sample separating apparatus and method, and a substrate manufacturing method and, more particularly, to a separating method and apparatus for separating a plate-like sample having a separation layer at the separation layer, and a substrate manufacturing method using the method and apparatus.

2. Description of the Related Art

A substrate (SOI substrate) having an SOI (Silicon On Insulator) structure is known as a substrate having a single-crystal Si layer on an insulating layer. A device using this SOI substrate has many advantages that cannot be achieved by ordinary Si substrates. Examples of the advantages are as follows.

(1) The integration degree can be increased because dielectric isolation is easy.

(2) The radiation resistance can be increased.

(3) The operating speed of the device can be increased because the stray capacitance is small.

(4) No well step is necessary.

(5) Latch-up can be prevented.

(6) A complete depletion type field effect transistor can be formed by thin film formation.

Since an SOI structure has the above various advantages, researches have been made on its formation method for several decades.

As one SOI technology, the SOS (Silicon On Sapphire) technology by which Si is heteroepitaxially grown on a single-crystal sapphire substrate by CVD (Chemical Vapor Deposition) has been known for a long time. This SOS technology once earned a reputation as the most matured SOI technology. However, the SOS technology has not been put into practical use to date because, e.g., a large amount of crystal defects are produced by lattice mismatch in the interface between the Si layer and the underlying sapphire substrate, aluminum that forms the sapphire substrate mixes in the Si layer, the substrate is expensive, and it is difficult to obtain a large area.

Various SOI technologies have appeared next to the SOS technology. For these SOI technologies, various methods have been examined to reduce crystal defects or manufacturing cost. The methods include a method of ion-implanting oxygen into a substrate to form a buried oxide layer, a method of bonding two wafers via an oxide film and polishing or etching one wafer to leave a thin single-crystal Si layer on the oxide film, and a method of ion-implanting hydrogen to a predetermined depth from the surface of an Si substrate having an oxide film, bonding the substrate to another substrate, leaving a thin single-crystal Si layer on the oxide film by heating or the like, and peeling one (the other substrate) of the bonded substrates.

The present applicant has disclosed a new SOI technology in Japanese Patent Laid-Open No. 5-21338. In this technology, a first substrate prepared by forming an unporous single-crystal layer (including a single-crystal Si layer) on a single-crystal semiconductor substrate having a porous layer is bonded to a second substrate via an insulating layer. After this, the substrates are separated at the porous layer, thereby transferring the unporous single-crystal layer to the second substrate. This technique is advantageous because the film thickness uniformity of the SOI layer is good, the crystal defect density in the SOI layer can be decreased, the surface planarity of the SOI layer is good, no expensive manufacturing apparatus with special specifications is required, and SOI substrates having about several hundred Å to 10-μm thick SOI films can be manufactured by a single manufacturing apparatus.

The present applicant has also disclosed a technique in Japanese Patent Laid-Open No. 7-302889, in which first and second substrates are bonded, the first substrate is separated from the second substrate without being broken, the surface of the separated first substrate is planarized, a porous layer is formed again, and the porous layer is reused. Since the first substrate is not wasted, this technique is advantageous in greatly reducing the manufacturing cost and simplifying the manufacturing process.

In the above technique, when a substrate (to be referred to as a bonded substrate stack hereinafter) obtained by bonding two substrates is to be separated at the porous layer, it is desired to separate the bonded substrate stack with good reproducibility without damaging the substrates.

SUMMARY OF THE INVENTION

The present invention has been made in consideration of the above situation, and has as its object to provide a technique for separating plate-like samples such as bonded substrate stacks at a high yield.

According to the first aspect of the present invention, there is provided a separating apparatus for separating a plate-like sample having a separation layer at the separation layer, characterized by comprising a holding mechanism for holding the plate-like sample in a substantially horizontal state while rotating the sample, and an ejection portion for ejecting a fluid to the separation layer of the plate-like sample held by the holding mechanism to separate the plate-like sample at the separation layer by the fluid.

In the separating apparatus according to the first aspect of the present invention, the holding mechanism preferably comprises, e.g., a pair of sample holding mechanisms for holding the plate-like sample by sandwiching the sample from upper and lower sides.

In the separating apparatus according to the first aspect of the present invention, the pair of holding mechanisms preferably have, e.g., chuck mechanisms for chucking the plate-like sample, respectively.

In the separating apparatus according to the first aspect of the present invention, preferably, the pair of holding mechanisms have, e.g., an application portion for applying a press force to the plate-like sample in an axial direction, and hold the plate-like sample to which the press force is being applied by the application portion.

In the separating apparatus according to the first aspect of the present invention, preferably, the pair of holding mechanisms have, e.g., an application portion for applying a force to the plate-like sample in an axial direction, and hold the plate-like sample to which the force is being applied by the application portion.

In the separating apparatus according to the first aspect of the present invention, for example, the application portion preferably presses the plate-like sample in the axial direction using a force of a spring.

In the separating apparatus according to the first aspect of the present invention, for example, the application portion preferably presses the plate-like sample in the axial direction using a force generated by a cylinder.

In the separating apparatus according to the first aspect of the present invention, for example, the application portion preferably presses the plate-like sample in the axial direction using pressure of a fluid.

In the separating apparatus according to the first aspect of the present invention, for example, at least one of the pair of sample holding mechanisms preferably comprises a Bernoulli chuck.

In the separating apparatus according to the first aspect of the present invention, preferably, for example, the application portion supplies a fluid to a surface of the plate-like sample and applies the press force to the plate-like sample using the fluid.

In the separating apparatus according to the first aspect of the present invention, the fluid supplied to the surface of the plate-like sample by the application portion is preferably, e.g., a liquid.

In the separating apparatus according to the first aspect of the present invention, the fluid supplied to the plate-like sample by the application portion is preferably, e.g., a gas.

In the separating apparatus according to the first aspect of the present invention, preferably, for example, at least one of the pair of sample holding mechanisms comprises a holding member that comes into contact with the plate-like sample to hold the plate-like sample, and the application portion applies the press force to the plate-like sample via the holding member.

In the separating apparatus according to the first aspect of the present invention, preferably, for example, the application portion presses the holding member using a fluid and applies the press force to the plate-like sample via the holding member.

In the separating apparatus according to the first aspect of the present invention, the fluid supplied to the holding member by the application portion is preferably, e.g., a liquid.

In the separating apparatus according to the first aspect of the present invention, the fluid supplied to the holding member by the application portion is preferably, e.g., a gas.

In the separating apparatus according to the first aspect of the present invention, for example, at least one of the pair of sample holding mechanisms preferably comprises a holding member that comes into contact with the plate-like sample to hold the plate-like sample and a Bernoulli chuck for supporting the holding member.

In the separating apparatus according to the first aspect of the present invention, preferably, for example, the application portion presses the holding member using a magnetic force and applies the press force to the plate-like sample via the holding member.

In the separating apparatus according to the first aspect of the present invention, preferably, for example, the application portion applies the press force to the plate-like sample from a lower sample holding mechanism of the pair of sample holding mechanisms while fixing a vertical position of an upper sample holding mechanism.

In the separating apparatus according to the first aspect of the present invention, preferably, for example, the application portion applies the press force to the plate-like sample from an upper sample holding mechanism of the pair of sample holding mechanisms while fixing a vertical position of a lower sample holding mechanism.

In the separating apparatus according to the first aspect of the present invention, for example, the application portion preferably applies the press force to the plate-like sample from both of the pair of sample holding mechanisms.

In the separating apparatus according to the first aspect of the present invention, for example, the application portion preferably applies the press force to the plate-like sample using a weight.

In the separating apparatus according to the first aspect of the present invention, for example, the application portion preferably changes stepwise the force for pressing the plate-like sample using a plurality of weights.

In the separating apparatus according to the first aspect of the present invention, preferably, for example, the application portion presses the plate-like sample with a relatively small force when a portion near a periphery of the plate-like sample is to be separated, and presses the plate-like sample with a relatively large force when a portion near the center of the plate-like sample is to be separated.

In the separating apparatus according to the first aspect of the present invention, preferably, for example, the application portion presses the plate-like sample with a relatively small force at a first step of separation of the plate-like sample, and presses the plate-like sample with a relatively large force at a second step of separation of the plate-like sample.

In the separating apparatus according to the first aspect of the present invention, for example, the application portion preferably presses the portion near the center of the plate-like sample.

In the separating apparatus according to the first aspect of the present invention, preferably, for example, the application portion presses the plate-like sample with a relatively small force when a portion near a periphery of the plate-like sample is to be separated, and presses the plate-like sample with a relatively large force when a portion near the center of the plate-like sample is to be separated.

In the separating apparatus according to the first aspect of the present invention, preferably, for example, the application portion presses the plate-like sample with a relatively small force at a first step of separation of the plate-like sample, and presses the plate-like sample with a relatively large force at a second step of separation of the plate-like sample.

In the separating apparatus according to the first aspect of the present invention, for example, the application portion preferably presses the portion near the center of the plate-like sample.

In the separating apparatus according to the first aspect of the present invention, for example, the holding mechanism preferably has a structure capable of transferring/receiving the plate-like sample to/from a conveyor mechanism for chucking a surface of the plate-like sample to hold the sample.

In the separating apparatus according to the first aspect of the present invention, for example, the holding mechanism preferably comprises a convex support portion for holding the plate-like sample while forming a gap between a predetermined portion of a surface of the plate-like sample and a predetermined portion of a surface of the holding member.

In the separating apparatus according to the first aspect of the present invention, for example, the holding mechanism preferably holds a substantially central portion of the plate-like sample.

In the separating apparatus according to the first aspect of the present invention, for example, the holding mechanism preferably comprises a sample holding mechanism for holding one surface of the plate-like sample.

In the separating apparatus according to the first aspect of the present invention, for example, the sample holding mechanism preferably comprises a chuck mechanism for chucking the plate-like sample.

In the separating apparatus according to the first aspect of the present invention, for example, the chuck mechanism preferably chucks a plurality of portions of the plate-like sample.

In the separating apparatus according to the first aspect of the present invention, for example, the chuck mechanism preferably chucks a peripheral portion of the plate-like sample.

In the separating apparatus according to the first aspect of the present invention, for example, the chuck mechanism preferably chucks the plate-like sample to warp the plate-like sample.

In the separating apparatus according to the first aspect of the present invention, for example, the holding mechanism preferably has a structure capable of exchanging the plate-like sample with a conveyor mechanism for chucking a surface of the plate-like sample to hold the sample.

In the separating apparatus according to the first aspect of the present invention, for example, the sample holding mechanism preferably comprises a convex support portion at a substantially central portion.

In the separating apparatus according to the first aspect of the present invention, preferably, for example, the chuck mechanism chucks the plate-like sample when a portion near a periphery of the plate-like sample is to be separated, and does not chuck the plate-like sample when a portion near the center of the plate-like sample is to be separated.

In the separating apparatus according to the first aspect of the present invention, preferably, for example, the chuck mechanism chucks the plate-like sample at a first step of separation of the plate-like sample, and does not chuck the plate-like sample at a second step of separation of the plate-like sample.

In the separating apparatus according to the first aspect of the present invention, for example, the holding mechanism preferably comprises an edge portion support member for supporting an edge portion of the plate-like sample.

In the separating apparatus according to the first aspect of the present invention, preferably, for example, the holding mechanism comprises a plurality of edge portion support members for supporting an edge portion of the plate-like sample and a rotation source for rotating at least one of the plurality of edge portion support members, and the plate-like sample is rotated by transmitting a rotational force from the rotated edge portion support member to the plate-like sample.

In the separating apparatus according to the first aspect of the present invention, preferably, for example, the holding mechanism comprises a table for supporting the edge portion support member, and a rotation source for rotating the table, and the plate-like sample is rotated by rotating the table.

In the separating apparatus according to the first aspect of the present invention, for example, the holding mechanism preferably further comprises a convex support portion for partially supporting a lower surface of the plate-like sample.

In the separating apparatus according to the first aspect of the present invention, for example, the holding mechanism further preferably comprises a convex support portion for partially supporting a lower surface of the plate-like sample, the convex support portion being rotated together with the plate-like sample placed on the support portion.

Preferably, for example, the separating apparatus according to the first aspect of the present invention further comprises a driving mechanism for driving the edge portion support member toward the center or outer periphery of the plate-like sample, and when the plate-like sample is to be held, the edge portion support member is driven toward the center by the driving mechanism.

In the separating apparatus according to the first aspect of the present invention, for example, each of the plurality of edge portion support members preferably has a shape obtained by bonding bottom portions of two cones.

The separating apparatus according to the first aspect of the present invention preferably further comprises, e.g., a spacing mechanism for, after the plate-like sample is separated into two samples, spacing the separated plate-like samples apart from each other.

In the separating apparatus according to the first aspect of the present invention, for example, the spacing mechanism preferably spaces the separated plate-like samples apart substantially in the axial direction.

In the separating apparatus according to the first aspect of the present invention, for example, the spacing mechanism preferably spaces the separated plate-like samples apart substantially in a planar direction.

The separating apparatus according to the first aspect of the present invention preferably further comprises, e.g., a cleaning portion for cleaning the plate-like sample which is being separated or the separated plate-like samples.

According to the second aspect of the present invention, there is provided a separating apparatus for separating a plate-like sample having a separation layer at the separation layer, characterized by comprising a holding mechanism for holding the plate-like sample in a substantially horizontal state while rotating the sample, and an ejection portion for ejecting a fluid to the separation layer of the plate-like sample held by the holding mechanism to separate the plate-like sample at the separation layer by the fluid.

The separating apparatus according to the second aspect of the present invention preferably further comprises, e.g., a scanning portion for scanning the ejection portion or the plate-like sample in separating the plate-like sample.

The separating apparatus according to the second aspect of the present invention preferably further comprises, e.g., a pivot portion for pivoting the ejection portion about an axis parallel to an axis of the plate-like sample.

In the separating apparatus according to the first or second aspect of the present invention, the plate-like sample to be processed preferably has, e.g., a fragile layer as the separation layer.

In the separating apparatus according to the first or second aspect of the present invention, the fragile layer is preferably, e.g., a porous layer.

In the separating apparatus according to the first or second aspect of the present invention, the fragile layer is preferably, e.g., a microcavity layer.

In the separating apparatus according to the first or second aspect of the present invention, the plate-like sample to be processed is preferably, e.g., a semiconductor substrate.

In the separating apparatus according to the first or second aspect of the present invention, the plate-like sample to be processed is preferably formed by, e.g., bonding a first substrate and a second substrate and has a fragile layer as the separation layer.

In the separating apparatus according to the first or second aspect of the present invention, the plate-like sample to be processed is preferably formed by, e.g., forming a porous layer on a surface of a first semiconductor substrate, forming an unporous layer on the porous layer, and bonding a second substrate to the unporous layer.

According to the third aspect of the present invention, there is provided a separating system characterized by comprising a separating apparatus of the first or second aspect, and a conveyor robot for transferring a plate-like sample to the separating apparatus in a substantially horizontal state and receiving in the substantially horizontal state plate-like samples separated by the separating apparatus.

In the separating system according to the third aspect of the present invention, for example, the conveyor robot preferably transfers the plate-like sample while supporting the sample from a lower side to the separating apparatus.

In the separating system according to the third aspect of the present invention, for example, the conveyor robot preferably receives a lower plate-like sample of two separated plate-like samples from the separating apparatus while supporting the sample from the lower side.

In the separating system according to the third aspect of the present invention, for example, the conveyor robot preferably receives an upper plate-like sample of the two separated plate-like samples from the separating apparatus while supporting the sample from an upper side.

The separating system according to the third aspect of the present invention, preferably, for example, further comprises a centering apparatus for aligning the center of the plate-like sample at a predetermined position, and the conveyor robot receives the plate-like sample from the centering apparatus and transfers the sample to the separating apparatus.

The separating system according to the third aspect of the present invention, preferably, for example, further comprises a turning apparatus for rotating the plate-like sample through 180° to turn the sample, and the conveyor robot transfers the upper plate-like sample, separated by the separating apparatus, to the turning apparatus in the horizontal state.

The separating system according to the third aspect of the present invention preferably further comprises, e.g., a cleaning/drying apparatus for cleaning and drying the plate-like samples separated by the separating apparatus.

According to the fourth aspect of the present invention, there is provided a separating method of separating a plate-like sample having a separation layer at the separation layer, characterized by comprising the steps of holding the plate-like sample by a holding mechanism in a substantially horizontal state, ejecting a fluid from an election portion to the separation layer of the plate-like sample while rotating the plate-like sample held by the holding mechanism to separate the plate-like sample at the separation layer using the fluid, and removing separated plate-like samples from the holding mechanism.

According to the fifth aspect of the present invention, there is provided a separating method of separating a plate-like sample having a separation layer at the separation layer, characterized by comprising the steps of pressing and holding the plate-like sample by a holding mechanism in a substantially horizontal state, ejecting a fluid from an election portion to the separation layer of the plate-like sample held by the holding mechanism to separate the plate-like sample at the separation layer using the fluid, and removing separated plate-like samples from the holding mechanism.

According to the sixth aspect of the present invention, there is provided a separating method of separating a plate-like sample having a separation layer at the separation layer, characterized by comprising the steps of transferring the plate-like sample to the above separating apparatus in a horizontal state, separating the plate-like sample by the separating apparatus, and receiving separated plate-like samples from the separating apparatus.

According to the seventh aspect of the present invention, there is provided a separating method of separating a plate-like sample having a separation layer at the separation layer, characterized by comprising the steps of transferring the plate-like sample to a centering apparatus in a horizontal state and aligning the center of the plate-like sample at a predetermined position by the centering apparatus, receiving the plate-like sample from the centering apparatus and transferring the plate-like sample to the above separating apparatus in the horizontal state to separate the plate-like sample by the separating apparatus, and receiving separated plate-like samples from the separating apparatus.

According to the eighth aspect of the present invention, there is provided a separating method of separating a plate-like sample having a separation layer at the separation layer, characterized by comprising the steps of transferring the plate-like sample to a centering apparatus in a horizontal state and aligning the center of the plate-like sample at a predetermined position by the centering apparatus, receiving the plate-like sample from the centering apparatus and transferring the plate-like sample to the above separating apparatus in the horizontal state to separate the plate-like sample by the separating apparatus, receiving an upper substrate of two separated plate-like samples from the separating apparatus, transferring the substrate to a turning apparatus, and rotating the plate-like sample through 180° to turn the substrate by the turning apparatus, receiving the plate-like sample from the turning apparatus, and receiving a lower substrate of the two separated plate-like samples from the separating apparatus.

According to the ninth aspect of the present invention, there is provided a separating method of separating a plate-like sample having a separation layer at the separation layer, characterized by comprising the steps of transferring the plate-like sample to a centering apparatus in a horizontal state and aligning the center of the plate-like sample at a predetermined position by the centering apparatus, receiving the plate-like sample from the centering apparatus and transferring the plate-like sample to the above separating apparatus in the horizontal state to separate the plate-like sample by the separating apparatus, receiving an upper substrate of two separated plate-like samples from the separating apparatus, transferring the substrate to a turning apparatus, and rotating the plate-like sample through 180° to turn the substrate by the turning apparatus, receiving the plate-like sample from the turning apparatus, transferring the sample to a cleaning/drying apparatus, and cleaning and drying the sample by the cleaning/drying apparatus, and receiving a lower substrate of the two separated plate-like samples from the separating apparatus, transferring the substrate to the cleaning/drying apparatus, and cleaning and drying the substrate by the cleaning/drying apparatus.

According to the 10th aspect of the present invention, there is provided a separating method of separating a plate-like sample having a separation layer at the separation layer, characterized by comprising the steps of transferring the plate-like sample to the above separating apparatus in the horizontal state to separate the plate-like sample by the separating apparatus, receiving an upper substrate of two separated plate-like samples from the separating apparatus, transferring the substrate to a turning apparatus, and rotating the plate-like sample through 180° to turn the substrate by the turning apparatus, receiving the plate-like sample from the turning apparatus, and receiving a lower substrate of the two separated plate-like samples from the separating apparatus.

According to the 11th aspect of the present invention, there is provided a separating method of separating a plate-like sample having a separation layer at the separation layer, characterized by comprising the steps of transferring the plate-like sample to the above separating apparatus in the horizontal state to separate the plate-like sample by the separating apparatus, receiving an upper substrate of two separated plate-like samples from the separating apparatus, transferring the substrate to a turning apparatus, and rotating the plate-like sample through 180° to turn the substrate by the turning apparatus, receiving the plate-like sample from the turning apparatus, transferring the sample to a cleaning/drying apparatus, and cleaning and drying the sample by the cleaning/drying apparatus, and receiving a lower substrate of the two separated plate-like samples from the separating apparatus, transferring the substrate to the cleaning/drying apparatus, and cleaning and drying the substrate by the cleaning/drying apparatus.

According to the 12th aspect of the present invention, there is provided a separating method of separating a plate-like sample having a separation layer at the separation layer, characterized by comprising the steps of transferring the plate-like sample to the above separating apparatus in the horizontal state to separate the plate-like sample by the separating apparatus, and transferring each of separated plate-like samples to a cleaning/drying apparatus and cleaning and drying the sample by the cleaning/drying apparatus.

According to the 13th aspect of the present invention, there is provided a separating method of separating a plate-like sample having a separation layer at the separation layer, characterized by comprising the step of ejecting a fluid to the separation layer of the plate-like sample while holding and rotating the plate-like sample in a substantially horizontal state to separate the plate-like sample at the separation layer using the fluid.

According to the 14th aspect of the present invention, there is provided a separating method of separating a plate-like sample having a separation layer at the separation layer, characterized by comprising the step of ejecting a fluid to the separation layer of the plate-like sample while pressing and holding the plate-like sample in a substantially horizontal state to separate the plate-like sample at the separation layer using the fluid.

According to the 15th aspect of the present invention, there is provided a method of manufacturing a substrate, characterized by comprising the preparation step of bonding a first substrate having a fragile layer to a second substrate to prepare a bonded substrate stack, the separation step of separating the bonded substrate stack at the fragile layer using a fluid, and the removal step of removing the fragile layer remaining on the second substrate after the separation step, wherein the separation step comprises ejecting the fluid to the fragile layer of the bonded substrate stack while holding and rotating the bonded substrate stack in a substantially horizontal state to separate the bonded substrate stack at the fragile layer using the fluid.

According to the 16th aspect of the present invention, there is provided a method of manufacturing a substrate, characterized by comprising the preparation step of bonding a first substrate having a fragile layer to a second substrate to prepare a bonded substrate stack, the separation step of separating the bonded substrate stack at the fragile layer using a fluid, and the removal step of removing the fragile layer remaining on the second substrate after the separation step, wherein the separation step comprises ejecting the fluid to the fragile layer of the bonded substrate stack while pressing and holding the bonded substrate stack in a substantially horizontal state to separate the bonded substrate stack at the fragile layer using the fluid.

According to the 17th aspect of the present invention, there is provided a separating apparatus for separating a plate-like sample having a separation layer at the separation layer, characterized by comprising a holding mechanism for holding the plate-like sample, an ejection portion for ejecting a fluid to the plate-like sample held by the holding mechanism to separate the plate-like sample at the separation layer using the fluid, and an abrupt operation prevention mechanism for preventing the holding mechanism from abruptly moving due to a force of the fluid acting in the plate-like sample while allowing the holding mechanism to moderately move when separating the plate-like sample.

In the separating apparatus according to the 17th aspect of the present invention, the abrupt operation prevention mechanism preferably comprises, e.g., a damper mechanism.

The separating apparatus according to the 17th aspect of the present invention preferably further comprises, e.g., a rotating mechanism for rotating the holding mechanism about an axis substantially perpendicular to a fluid ejection direction of the ejection portion when separating the plate-like sample.

In the separating apparatus according to the 17th aspect of the present invention, the abrupt operation prevention mechanism is preferably, e.g., coaxial with the holding mechanism.

In the separating apparatus according to the 17th aspect of the present invention, preferably, for example, the holding mechanism comprises a pair of sample holding portions for sandwiching and holding the plate-like sample, at least one of the pair of sample holding portions can move in a direction substantially perpendicular to the fluid ejection direction of the ejection portion, and the abrupt operation prevention mechanism prevents the movable sample holding portion from abrupt movement while allowing the movable sample holding portion to moderately move when separating the plate-like sample.

In the separating apparatus according to the 17th aspect of the present invention, for example, the abrupt operation prevention mechanism preferably comprises a movable portion which moves in contact with the movable sample holding portion, and a reaction generation portion for generating a reaction against a force applied from the movable sample holding portion to the movable portion.

In the separating apparatus according to the 17th aspect of the present invention, for example, the movable portion preferably smoothly moves.

In the separating apparatus according to the 17th aspect of the present invention, preferably, for example, the movable portion comprises a piston, the reaction generation portion comprises a frame member constructing a pressure chamber for causing pressure to act on the piston, and the frame member has a channel for discharging a fluid from the pressure chamber.

In the separating apparatus according to the 17th aspect of the present invention, the abrupt operation prevention mechanism preferably has, e.g., a valve for controlling the fluid flowing through the channel.

In the separating apparatus according to the 17th aspect of the present invention, the abrupt operation prevention mechanism preferably further comprises, e.g., a restoring mechanism for extending the piston retracted into the frame member and simultaneously filling the pressure chamber with the fluid when separating the plate-like sample.

In the separating apparatus according to the 17th aspect of the present invention, preferably, for example, the restoring mechanism has a spring, and the piston is extended by a force of the spring to fill the pressure chamber with the fluid.

In the separating apparatus according to the 17th aspect of the present invention, preferably, for example, the restoring mechanism comprises a filling mechanism for filing the pressure chamber with the fluid, and the piston is extended by filling the pressure chamber with the fluid by the filling mechanism.

In the separating apparatus according to the 17th aspect of the present invention, the holding mechanism preferably further comprises, e.g., a press mechanism for applying a press force to the plate-like sample in a direction substantially perpendicular to the fluid ejection direction of the ejection portion when holding the plate-like sample.

The separating apparatus according to the 17th aspect of the present invention, preferably, for example, further comprises a driving portion for changing a position where the fluid ejected from the ejection portion is injected into the plate-like sample, and the plate-like sample is separated while changing the position.

In the separating apparatus according to the 17th aspect of the present invention, the driving portion preferably comprises, e.g., a motor for rotating the plate-like sample about an axis substantially perpendicular to the fluid ejection direction of the ejection portion.

In the separating apparatus according to the 17th aspect of the present invention, the separation layer is preferably, e.g., a fragile layer.

In the separating apparatus according to the 17th aspect of the present invention, the fragile layer is preferably, e.g., a porous layer.

In the separating apparatus according to the 17th aspect of the present invention, the fragile layer is preferably, e.g., a microcavity layer.

In the separating apparatus according to the 17th aspect of the present invention, the plate-like sample to be separated is preferably, e.g., a semiconductor substrate.

In the separating apparatus according to the 17th aspect of the present invention, the plate-like sample to be separated is preferably formed by, e.g., bonding a first substrate and a second substrate.

According to the 18th aspect of the present invention, there is provided a separating method of ejecting a fluid to a separation layer of a plate-like sample having the separation layer to separate the plate-like sample at the separation layer, characterized by comprising the step of separating the plate-like sample while preventing the plate-like sample from abruptly warping due to a force of the fluid acting in the plate-like sample and allowing the plate-like sample to moderately warp.

In the separating method according to the 18th aspect of the present invention, the separation layer is preferably, e.g., a fragile layer.

In the separating method according to the 18th aspect of the present invention, the fragile layer is preferably, e.g., a porous layer.

In the separating method according to the 18th aspect of the present invention, the fragile layer is preferably, e.g., a microcavity layer.

In the separating method according to the 18th aspect of the present invention, the plate-like sample to be separated is preferably, e.g., a semiconductor substrate.

In the separating method according to the 18th aspect of the present invention, the plate-like sample to be separated is preferably formed by, e.g., bonding a first substrate and a second substrate.

According to the 19th aspect of the present invention, there is provided a method of manufacturing a substrate, characterized by comprising the preparation step of bonding a first substrate having a fragile layer to a second substrate to prepare a bonded substrate stack, the separation step of separating the bonded substrate stack at the fragile layer using a fluid, and the removal step of removing the fragile layer remaining on the second substrate after the separation step, wherein the separation step comprises separating the bonded substrate stack at the fragile layer while preventing the bonded substrate stack from abruptly warping due to a force of the fluid acting in the bonded substrate stack and allowing the bonded substrate stack to moderately warp.

Further objects, features and advantages of the present invention will become apparent from the following detailed description of the embodiments of the present invention with reference to the accompanying drawings.

BRIEF DESCRIPTION OF THE DRAWINGS

FIG. 36 is a view showing an example of various separating methods with an emphasis on the relationship between a bonded substrate stack and a nozzle for ejecting a jet;

FIGS. 37A and 37B are views showing another example of various separating methods with an emphasis on the relationship between a bonded substrate stack and a nozzle for ejecting a jet;

DETAILED DESCRIPTION OF THE PREFERRED EMBODIMENT

Preferred embodiments of the present invention will be described below with reference to the accompanying drawings.

FIGS. 1A to 1E are sectional views for explaining steps in manufacturing an SOI substrate according a preferred embodiment of the present invention.

Figure 1A:
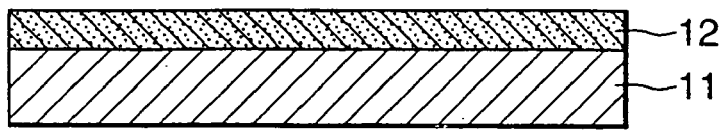
FIGS. 1A to 1E are sectional views for explaining the steps in manufacturing an SOI substrate according to a preferred embodiment of the present invention.
Figure 1B:
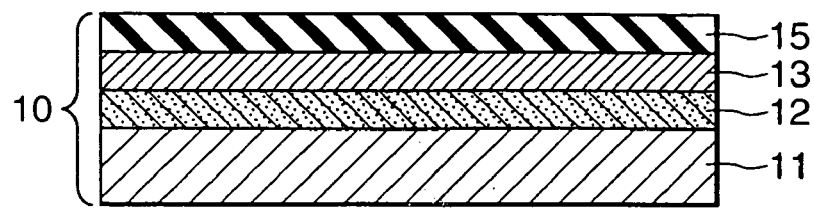

In the step shown in FIG. 1A, a single-crystal Si substrate 11 is prepared, and a porous Si layer 12 is formed on the surface of the single-crystal Si substrate 11 by, e.g., anodizing. In the step shown in FIG. 1B, an unporous single-crystal Si layer 13 is formed on the porous Si layer 12 by epitaxial growth. An insulating layer (e.g., an $SiO_2$ layer) 15 is formed on the unporous single-crystal Si layer 13. With this process, a first substrate 10 is formed.

Figure 1C:
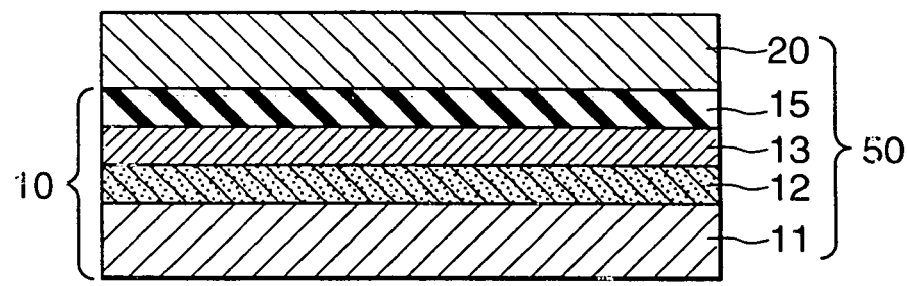

In the step shown in FIG. 1C, a second substrate 20 is prepared and brought into tight contact with the first substrate 10 at room temperature while making the insulating layer 15 oppose the second substrate 20. After this, the first substrate 10 and second substrate 20 are bonded by anodic bonding, pressing, heating, or a combination thereof. The insulating layer 15 and second substrate 20 are firmly bonded to form the bonded substrate stack 50. The insulating layer 15 may be formed on the unporous single-crystal Si layer 13, as described above. Alternatively, the insulating layer 15 may be formed either on the second substrate 20 or on both the unporous single-crystal Si layer 13 and second substrate 20 as far as the state shown in FIG. 1C is obtained upon bringing the first and second substrates into tight contact with each other.

Figure 1D:
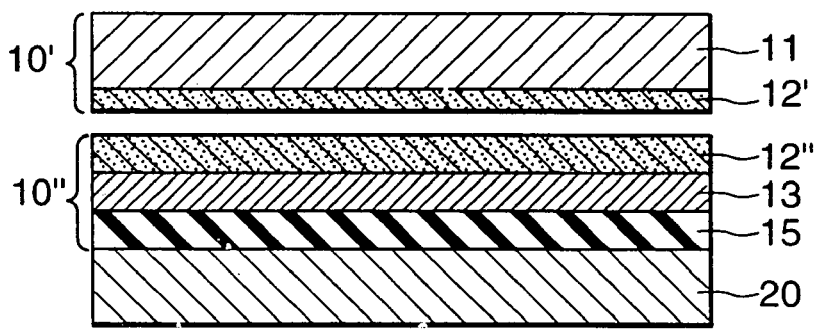

In the step shown in FIG. 1D, the two bonded substrates are separated at the porous Si layer 12. The second substrate side (10″+20) has a multilayered structure of porous Si layer 12″/single-crystal Si layer 13/insulating layer 15/single-crystal Si substrate 20. The first substrate side (10′) has a structure wherein a porous Si layer 12′ is formed on the single-crystal Si substrate 11.

After the remaining porous Si layer 12′ is removed, and the surface of the porous Si layer 12′ is planarized as needed, the separated substrate (10′) is used as a single-crystal Si substrate 11 for forming a first substrate (10) again.

Figure 1E:
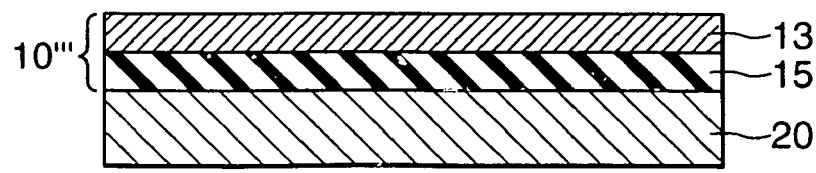

After the bonded substrate stack is separated, in the step shown in FIG. 1E, the porous layer 12″ on the surface on the second substrate side (10″+20) is selectively removed. With this process, a substrate having a multilayered structure of a single-crystal Si layer 13/insulating layer 15/single-crystal Si substrate 20, i.e., an SOI structure is obtained.

As the second substrate, for example, not only a single-crystal Si substrate but also an insulating substrate (e.g., quartz substrate) or a transparent substrate (e.g., quartz substrate) can be used.

In this embodiment, to facilitate the process of bonding two substrates and separating them, a porous Si layer 12 having a fragile structure is formed in the separation region. In place of the porous layer, for example, a microcavity layer may be formed. The microcavity layer can be formed by, e.g., implanting ions into a semiconductor substrate.

In this embodiment, for part of the step shown in FIG. 1D, i.e., the step of separating the bonded substrate stack, a separating apparatus which ejects a liquid or gas (fluid) to the porous Si layer as the separation layer to separate the bonded substrate stack into two substrates at the separation layer is used.

[Basic Arrangement of Separating Apparatus]

This separating apparatus uses the water jet method. Generally, the water jet method ejects a high-speed, high-pressure stream of water to an object to, e.g., cut or process a ceramic, metal, concrete, resin, rubber, or wood, remove a coating film from the surface, or clean the surface ("Water Jet", Vol. 1, No. 1, page 4 (1984)).

This separating apparatus ejects a stream of fluid to the porous layer (separation region) as a fragile structure of a bonded substrate stack to selectively break the porous layer, thereby separating the substrate stack at the porous layer. The stream will be referred to as a "jet" hereinafter. The fluid forming a jet will be referred to as a "jet medium". As the jet medium, it is possible to use water, an organic solvent such as alcohol, an acid such as hydrofluoric acid or nitric acid, an alkali such as potassium hydroxide, a gas such as air, nitrogen gas, carbonic acid gas, a rare gas, or an etching gas, or a plasma.

When this separating apparatus is applied to manufacture a semiconductor device or separate, e.g., a bonded substrate stack, pure water with minimum impurity metals or particles is preferably used as the jet medium.

The jet ejecting conditions can be determined in accordance with, e.g., the type of separation region (e.g., a porous layer) or the shape of the side surfaces of the bonded substrate stack. As the jet ejecting conditions, for example, pressure to be applied to the jet medium, jet scanning speed, nozzle width or diameter (the diameter is substantially the same as the jet diameter), nozzle shape, distance between the nozzle and the separation region, and flow rate of the jet are used as important parameters.

According to the separating method using the water jet method, a bonded substrate stack can be separated into two substrates without damaging the bonded substrate stack.

Each of separating apparatuses according to the preferred embodiments of the present invention holds a sample such as a bonded substrate stack while setting the sample surface substantially horizontally, and in this state, separates the sample at the fragile structure (e.g., a porous layer). When the sample is held with its surface set horizontally, for example, (1) the sample can be prevented from dropping, (2) the sample can be easily held, (3) the sample can be easily conveyed, (4) the sample can be efficiently transferred between the separating apparatus and another apparatus, and (5) the projection area (occupation area) of the separating apparatus can be reduced because the constituent elements can be disposed in the vertical direction.

Preferred embodiments of the present invention will be described below. The separating apparatuses according to the embodiments are suitable for separating a bonded substrate stack having a porous layer or microcavity layer as a fragile structure. The separating apparatuses are also suitable for separating another sample having a fragile structure. The following embodiments are particularly suitable for separating a sample having, as a separation region, a region more fragile than the remaining regions. For example, the separating apparatuses can be used to separate a sample having a uniform structure using an arbitrary portion as a separation region. In the following description, however, the bonded substrate stack 50 as shown in FIG. 1C is used as the sample to be separated, for the descriptive convenience.

First Embodiment

Figure 2:
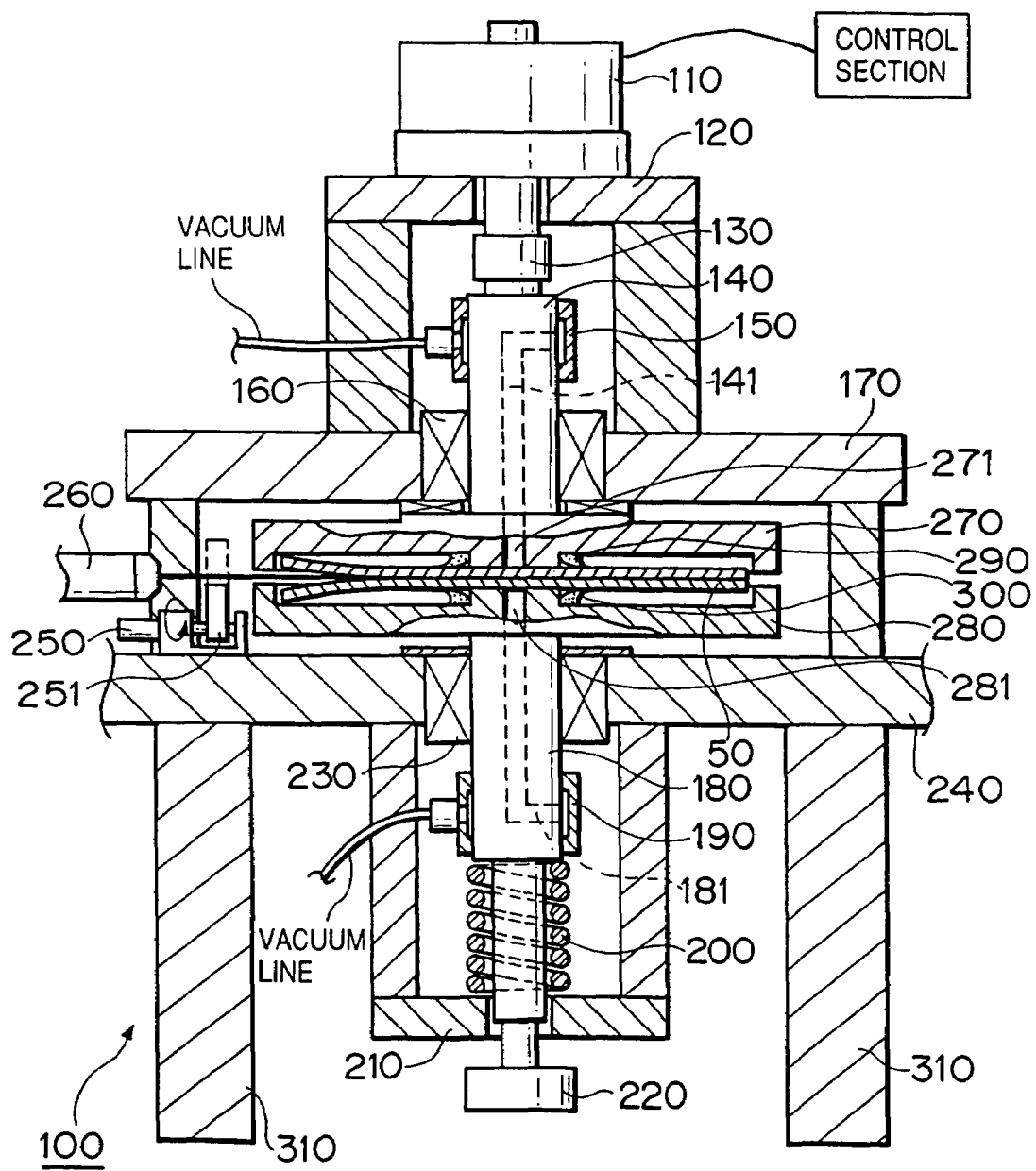
FIG. 2 is a view showing the schematic arrangement of a separating apparatus according to the first embodiment of the present invention.

FIG. 2 is a view showing the schematic arrangement of a separating apparatus according to the first embodiment of the present invention. A separating apparatus 100 has a pair of substrate holding portions 270 and 280. The substrate holding portions 270 and 280 horizontally hold and rotate a bonded substrate stack 50 by sandwiching it from the upper and lower sides. A jet is ejected from a nozzle 260 and injected toward the porous layer of the bonded substrate stack 50, thereby separating the bonded substrate stack 50 into two substrates at the porous layer.

The upper substrate holding portion 270 is coupled to one end of a rotating shaft 140. The other end of the rotating shaft 140 is coupled to the rotating shaft of a motor 110 via a coupling 130. The motor 110 and rotating shaft 140 may be coupled not via the coupling 130 but via, e.g., a belt or another mechanism. The motor 110 is fixed to a support member 120 fixed on an upper table 170. The motor is controlled by a control section.

A vacuum line 141 for vacuum-chucking the bonded substrate stack 50 on the substrate holding portion 270 extends through the rotating shaft 140. The vacuum line 141 is connected to an external vacuum line via a ring 150. The external vacuum line has a solenoid valve (not shown) The solenoid valve is ON/OFF-controlled by the control section as needed. The substrate holding portion 270 has a suction hole 271 for vacuum-chucking the bonded substrate stack 50. The suction hole 271 is connected to the vacuum line 141. The suction hole 271, vacuum line 141, and solenoid valve construct the vacuum chuck mechanism of the substrate holding portion 270. The rotating shaft 140 is supported by the upper table 170 via a bearing 160.

The lower substrate holding portion 280 is coupled to one end of a rotating shaft 180. A handle 220 is coupled to the other end of the rotating shaft 180. This handle 220 is operated either manually or by a driving mechanism (not shown). A compression spring 200 for extending the substrate holding portion 280 upward is inserted between the rotating shaft 180 and a support member 210 and attached to the rear end side of the rotating shaft 180. In separation processing, the bonded substrate stack 50 is held by a press force applied by the compression spring 200.

A vacuum line 181 for vacuum-chucking the bonded substrate stack 50 on the substrate holding portion 280 extends through the rotating shaft 180. The vacuum line 181 is connected to an external vacuum line via a ring 190. The external vacuum line has a solenoid valve (not shown) The solenoid valve is ON/OFF-controlled by the control section as needed. The substrate holding portion 280 has a suction hole 281 for vacuum-chucking the bonded substrate stack 50. The suction hole 281 is connected to the vacuum line 181. The suction hole 281, vacuum line 181, and solenoid valve construct the vacuum chuck mechanism of the substrate holding portion 280. The rotating shaft 180 is supported by a lower table 240 via a reciprocal/rotational guide 230.

The lower table 240 is supported by a plurality of leg members 310. The upper table 170 is supported on the lower table 240.

The nozzle 260 is attached to, e.g., the lower table 240 via a support member (not shown). In the separating apparatus 100 of the first embodiment, the position of the nozzle 260 is controlled with reference to the position of the upper substrate holding portion 270. A shutter 251 driven by a motor 250 is inserted between the nozzle 260 and the substrate holding portions 270 and 280. When the shutter 251 is open, and a jet is ejected from the nozzle 260, the jet can be injected into the bonded substrate stack 50. When the shutter 251 is closed, jet injection into the bonded substrate stack 50 can be stopped.

Figure 3:
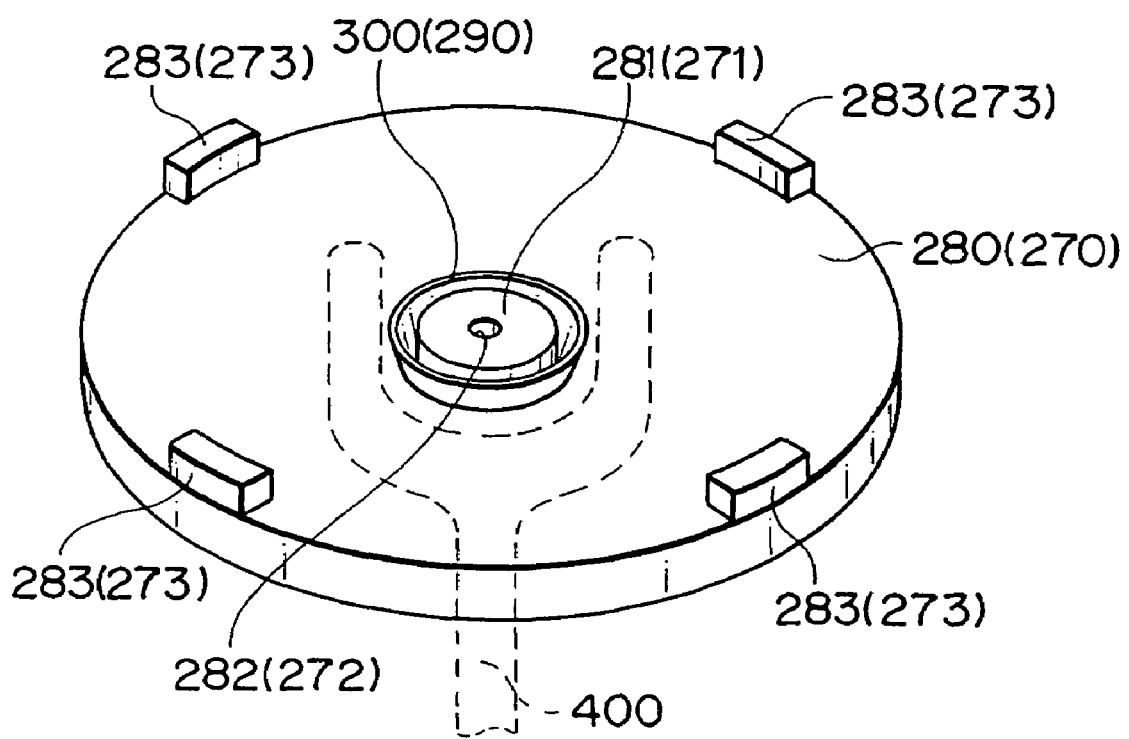
FIG. 3 is a perspective view showing the schematic arrangement of a substrate holding portion shown in FIG. 2.

FIG. 3 is a perspective view showing the schematic arrangement of the substrate holding portion shown in FIG. 2.

The substrate holding portions 270 and 280 have, e.g., a symmetrical structure. The substrate holding portions 270 and 280 have, at their outer peripheral portions, a plurality of guide members 273 and 283 for preventing a bonded substrate stack from causing a positional shift or projecting from the substrate holding portions during separation, respectively.

To make it possible for a robot hand 400 of a conveyor robot to transfer the bonded substrate stack 50 to the substrate holding portion 270 or 280 while supporting the bonded substrate stack 50 from the lower side or to chuck the back side surface, i.e., the opposite surface of the separated surface, of each separated substrate and allow the robot hand 400 to receive the substrates from the substrate holding portions 270 and 280, for example, the plurality of guide members 273 and 283 are preferably arranged at an appropriate interval such that the robot hand 400 can enter/leave.

When the bonded substrate stack 50 supported from the lower side is transferred to the substrate holding portion 270 or 280, the bonded substrate stack 50 can be effectively prevented from dropping.

When the robot hand 400 receives the separated substrates from the substrate holding portions 270 and 280 while chucking the back side surfaces of the substrates, any contamination of the robot hand 400 or drop of the substrate can be effectively prevented. The reason for this is as follows. When the separated surface of a substrate is chucked, chips may stick to the robot hand 400, and the chucking force may weaken because of unevenness or chips on the separated surface. In addition, when the robot hand 400 receives the separated substrates from the substrate holding portions 270 and 280 while chucking the back side surfaces, the risk of damaging the substrates due to chips can be reduced.

The substrate holding portions 270 and 280 have convex support portions 272 and 282 near their central portions, respectively. The support portions 272 and 282 have shift prevention members 290 and 300 around them, respectively. The shift prevention members 290 and 300 formed from, e.g., rubber or a resin prevent the bonded substrate stack 50 from moving in the planar direction. With the shift prevention members 290 and 300, the bonded substrate stack 50 can be held with a small press force.

Procedures of separation processing by the separating apparatus 100 will be described below. First, the handle 220 is moved downward against the force of the compression spring 200 to form an appropriate gap between the substrate holding portions 270 and 280. In this state, the bonded substrate stack 50 is horizontally supported by the robot hand 400 from the lower side and inserted to a predetermined position between the substrate holding portions 270 and 280.

The handle 220 is released to cause the compression spring 200 to act and move the lower substrate holding portion 280 upward, thereby causing the substrate holding portion 280 to press the bonded substrate stack 50.

The motor 110 is actuated to transmit the rotational force to the rotating shaft 140. The rotating shaft 140, substrate holding portion 270, bonded substrate stack 50, substrate holding portion 280, and rotating shaft 180 rotate integrally.

While keeping the shutter 251 closed, a pump (not shown) connected to the nozzle 260 is actuated to feed a high-pressure jet medium (e.g., water) to the nozzle 260. A high-pressure jet is ejected from the nozzle 260. When the jet stabilizes, the shutter 251 is opened. The jet ejected from the nozzle 260 is continuously injected into the porous layer of the bonded substrate stack 50 to start separating the bonded substrate stack 50.

When separation of the bonded substrate stack 50 is ended, the shutter 251 is closed, and the pump connected to the nozzle 260 is stopped to stop jet injection into the bonded substrate stack 50. The operation of the motor 110 is also stopped.

The vacuum chuck mechanisms of the substrate holding portions 270 and 280 are actuated (solenoid valves are opened) to cause the substrate holding portion 270 to vacuum-chuck the upper separated substrate and the substrate holding portion 280 to vacuum-chuck the lower separated substrate.

The handle 220 is moved downward against the force of the compression spring 200 and the surface tension between the two separated substrates to form a predetermined gap between the substrate holding portions 270 and 280. The two separated substrates are spaced apart from each other.

The robot hand 400 is inserted between the substrate and the substrate holding portion 270. The robot hand 400 chucks the substrate. After that, chuck by the vacuum chuck mechanism of the substrate holding portion 270 is canceled. The substrate is transferred from the substrate holding portion 270 to the robot hand 400. The robot hand 400 conveys the substrate to a predetermined position (e.g., a cassette).

The robot hand 400 is inserted between the substrate and the substrate holding portion 280. The robot hand 400 chucks the substrate. After that, chuck by the vacuum chuck mechanism of the substrate holding portion 280 is canceled. The substrate is transferred from the substrate holding portion 280 to the robot hand 400. The robot hand 400 conveys the substrate to a predetermined position (e.g., a cassette). The two separated substrates may be received by the robot hand in the reverse order or simultaneously received by two robot hands (not shown).

After the bonded substrate stack 50 is separated into two substrates, the jet medium is present between the two substrates. When the jet medium is a liquid (e.g., water), the surface tension is considerably large. Hence, to space the two substrates apart from each other with a small force, a jet is preferably supplied from the nozzle 260 to the gap between the two substrates. In this case, the jet from the nozzle 260 is stopped after the two substrates are spaced apart from each other. Instead, a mechanism for ejecting a jet used to space the two substrates apart from each other may be independently prepared.

Second Embodiment

Figure 4:
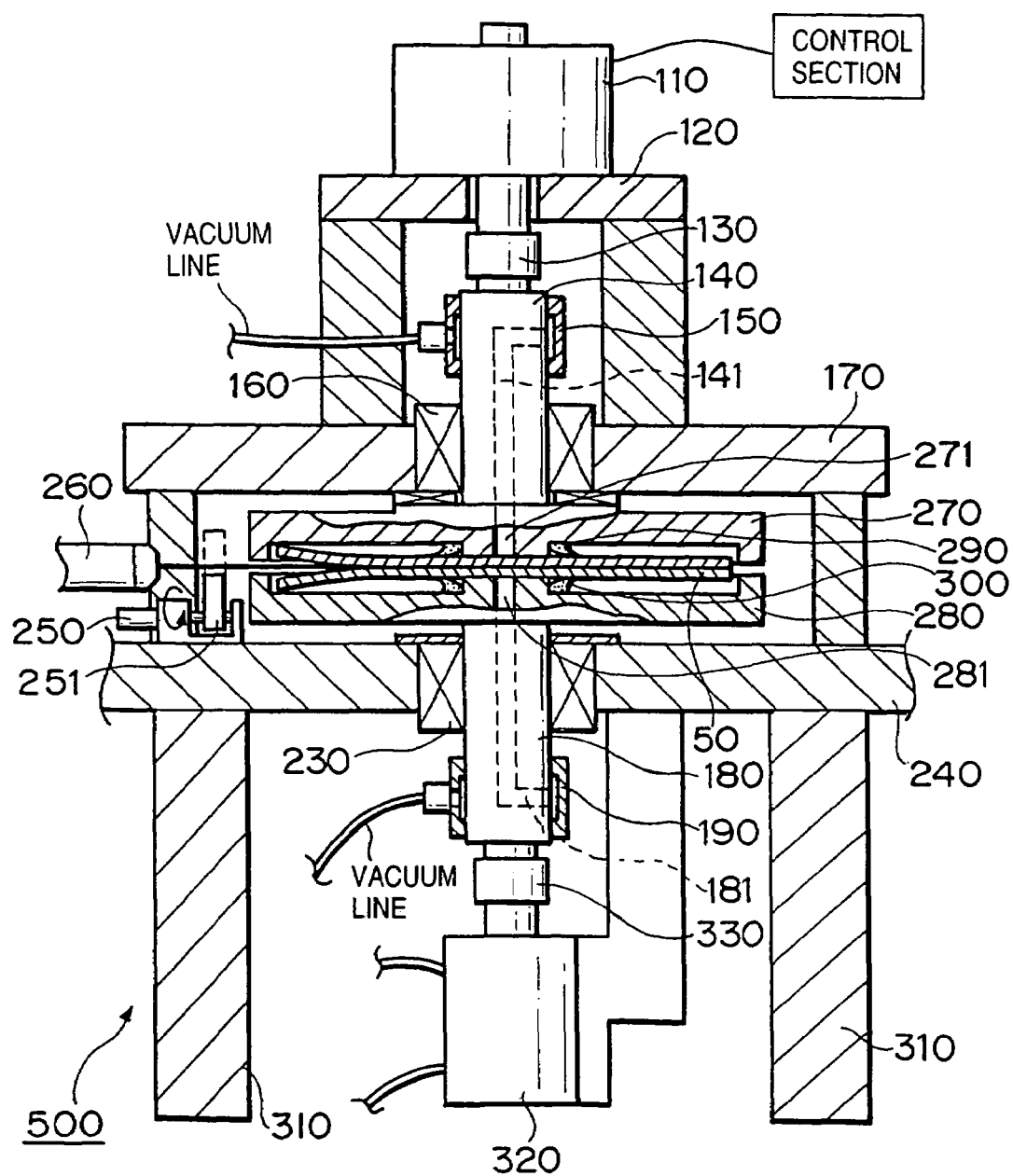
FIG. 4 is a view showing the schematic arrangement of a separating apparatus according to the second embodiment of the present invention.

FIG. 4 is a view showing the schematic arrangement of a separating apparatus according to the second embodiment of the present invention. The same reference numerals as in other drawings substantially denote the same constituent elements in FIG. 4.

A separating apparatus 500 of the second embodiment has an air cylinder 320 as a driving mechanism for driving a lower substrate holding portion 280 in place of the compression spring 200 of the first embodiment (FIG. 2). A rotating shaft 180 is coupled to the piston rod of the air cylinder 320 via a coupling 330. The air cylinder 320 is controlled by a control section (not shown).

Procedures of separation processing by the separating apparatus 500 will be described below. First, the air cylinder 320 retracts the piston rod to form an appropriate gap between substrate holding portions 270 and 280. In this state, a bonded substrate stack 50 is horizontally supported by a robot hand 400 from the lower side and inserted to a predetermined position between the substrate holding portions 270 and 280.

The air cylinder 320 extends the piston rod to move the lower substrate holding portion 280 upward. The substrate holding portion 280 presses and holds the bonded substrate stack 50.

A motor 110 is actuated to transmit the rotational force to a rotating shaft 140. The rotating shaft 140, substrate holding portion 270, bonded substrate stack 50, substrate holding portion 280, and rotating shaft 180 rotate integrally.

While keeping a shutter 251 closed, a pump (not shown) connected to a nozzle 260 is actuated to feed a high-pressure jet medium (e.g., water) to the nozzle 260. A high-pressure jet is ejected from the nozzle 260. When the jet stabilizes, the shutter 251 is opened. The jet ejected from the nozzle 260 is continuously injected into the porous layer of the bonded substrate stack 50 to start separating the bonded substrate stack 50.

When separation of the bonded substrate stack 50 is ended, the shutter 251 is closed, and the pump connected to the nozzle 260 is stopped to stop jet injection into the bonded substrate stack 50. The operation of the motor 110 is also stopped.

The vacuum chuck mechanisms of the substrate holding portions 270 and 280 are actuated (solenoid valves are opened) to cause the substrate holding portion 270 to vacuum-chuck the upper separated substrate and the substrate holding portion 280 to vacuum-chuck the lower separated substrate.

The air cylinder 320 retracts the piston rod to form a predetermined gap between the substrate holding portions 270 and 280. The two separated substrates are spaced apart from each other.

The robot hand 400 is inserted between the substrate and the substrate holding portion 270. The robot hand 400 chucks the substrate. After that, chuck by the vacuum chuck mechanism of the substrate holding portion 270 is canceled. The substrate is transferred from the substrate holding portion 270 to the robot hand 400. The robot hand 400 conveys the substrate to a predetermined position (e.g., a cassette).

The robot hand 400 is inserted between the substrate and the substrate holding portion 280. The robot hand 400 chucks the substrate. After that, chuck by the vacuum chuck mechanism of the substrate holding portion 280 is canceled. The substrate is transferred from the substrate holding portion 280 to the robot hand 400. The robot hand 400 conveys the substrate to a predetermined position (e.g., a cassette). The two separated substrates may be received by the robot hand in the reverse order or simultaneously received by two robot hands (not shown).

After the bonded substrate stack 50 is separated into two substrates, the jet medium is present between the two substrates. When the jet medium is a liquid (e.g., water), the surface tension is considerably large. Hence, to space the two substrates apart from each other with a small force, a jet is preferably supplied from the nozzle 260 to the gap between the two substrates. In this case, the jet from the nozzle 260 is stopped after the two substrates are spaced apart from each other. Instead, a mechanism for ejecting a jet used to space the two substrates apart from each other may be independently prepared.

Third Embodiment

Figure 5:
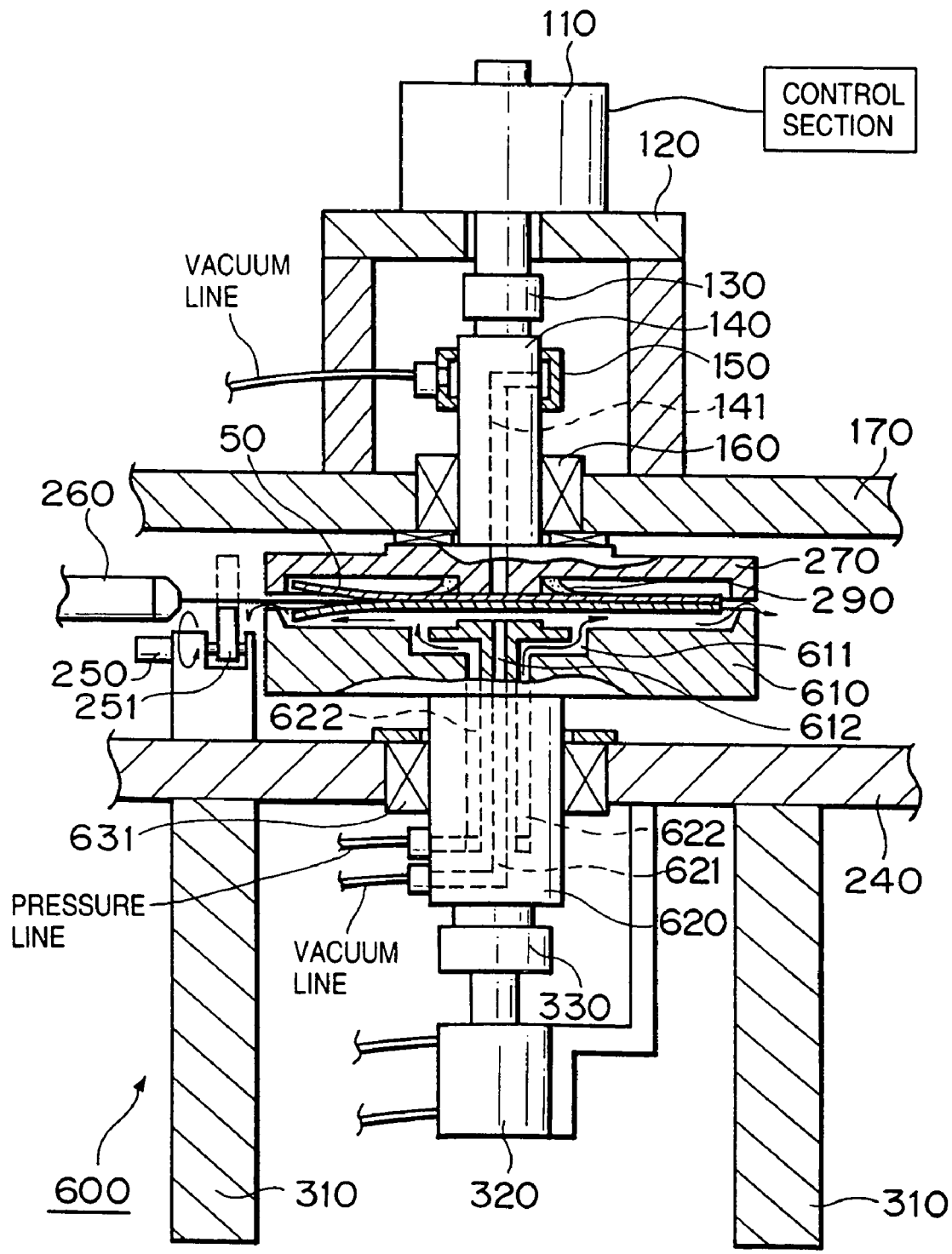
FIG. 5 is a view showing the schematic arrangement of a separating apparatus according to the third embodiment of the present invention.

FIG. 5 is a view showing the schematic arrangement of a separating apparatus according to the third embodiment of the present invention. The same reference numerals as in other drawings substantially denote the same constituent elements in FIG. 5.

A separating apparatus 600 holds a bonded substrate stack 50 by pressure of a fluid during separation. This separating apparatus 600 has a pair of substrate holding portions 270 and 610 for holding the bonded substrate stack 50. The upper substrate holding portion 270 and constituent elements thereof are the same as those described above.

The lower substrate holding portion 610 is coupled to one end of an elevating shaft 620. The substrate holding portion 610 has a fluid blow portion 611 for causing pressure of a fluid to act on the bonded substrate stack 50 to press and hold the bonded substrate stack 50. This blow portion 611 is connected to an external pressure line via a pressure line 622 in the elevating shaft 620. The external pressure line has a solenoid valve (not shown). The solenoid valve is ON/OFF-controlled by a control section as needed. The elevating shaft 620 is supported by a lower table 240 via a reciprocal guide 631.

The lower substrate holding portion 610 has a suction hole 612 for vacuum-chucking the bonded substrate stack 50. The suction hole 612 is connected to an external vacuum line via a vacuum line 621 in the elevating shaft 620. The external vacuum line has a solenoid valve (not shown). The solenoid valve is ON/OFF-controlled by the control section as needed.

The lower substrate holding portion 610 has, at its outer peripheral portion, a plurality of guide members for preventing a bonded substrate stack from causing a positional shift or projecting from the substrate holding portions during separation, like the substrate holding portion shown in FIG. 3. The guide members are preferably arranged such that the robot hand can be inserted between a substrate and the substrate holding portion 610, like the above-described guide members 283 (273).

With this above arrangement, when the bonded substrate stack 50 is pressed and held by pressure of a fluid during separation processing, an already separated portion of the bonded substrate stack 50 is allowed to warp due to the pressure of the jet medium injected into the bonded substrate stack 50. In addition, the warp amount can be appropriately limited. The fluid used to hold the bonded substrate stack 50 may be a gas such as air or a liquid such as water.

The elevating shaft 620 is coupled to the piston rod of an air cylinder 320 via a coupling 330. Vertical movement of the elevating shaft 620 is controlled by the air cylinder 320. In place of the air cylinder 320, another driving mechanism (e.g., a spring) may be employed.

Procedures of separation processing by the separating apparatus 600 will be described below. First, the air cylinder 320 retracts the piston rod to form an appropriate gap between substrate holding portions 270 and 610. In this state, the bonded substrate stack 50 is horizontally supported by a robot hand 400 from the lower side, inserted to a predetermined position between the substrate holding portions 270 and 610, and placed on the substrate holding portion 610.

The air cylinder 320 extends the piston rod to move the lower substrate holding portion 610 upward until a predetermined gap is formed between the upper surface of the bonded substrate stack 50 and the support portion of the upper substrate holding portion 270.

The solenoid valve of the external pressure line is opened to blow a fluid from the blow portion 611 of the substrate holding portion 610. The bonded substrate stack 50 is floated, pressed against the upper substrate holding portion 270, and held.

A motor 110 is actuated to transmit the rotational force to a rotating shaft 140. The rotating shaft 140, substrate holding portion 270, and bonded substrate stack 50 rotate integrally.

While keeping a shutter 251 closed, a pump (not shown) connected to a nozzle 260 is actuated to feed a high-pressure jet medium (e.g., water) to the nozzle 260. A high-pressure jet is ejected from the nozzle 260. When the jet stabilizes, the shutter 251 is opened. The jet ejected from the nozzle 260 is continuously injected into the porous layer of the bonded substrate stack 50 to start separating the bonded substrate stack 50.

When separation of the bonded substrate stack 50 is ended, the shutter 251 is closed, and the pump connected to the nozzle 260 is stopped to stop jet injection into the bonded substrate stack 50. The operation of the motor 110 is also stopped.

The vacuum chuck mechanisms of the substrate holding portions 270 and 610 are actuated (solenoid valves are opened) to cause the substrate holding portion 270 to vacuum-chuck the upper separated substrate and the substrate holding portion 610 to vacuum-chuck the lower separated substrate.

The air cylinder 320 retracts the piston rod to form a predetermined gap between the substrate holding portions 270 and 610. The two separated substrates are spaced apart from each other.

The robot hand 400 is inserted between the substrate and the substrate holding portion 270. The robot hand 400 chucks the substrate. After that, chuck by the vacuum chuck mechanism of the substrate holding portion 270 is canceled. The substrate is transferred from the substrate holding portion 270 to the robot hand 400. The robot hand 400 conveys the substrate to a predetermined position (e.g., a cassette).

The robot hand 400 is inserted between the substrate and the substrate holding portion 610. The robot hand 400 chucks the substrate. After that, chuck by the vacuum chuck mechanism of the substrate holding portion 610 is canceled. The substrate is transferred from the substrate holding portion 610 to the robot hand 400. The robot hand 400 conveys the substrate to a predetermined position (e.g., a cassette). The two separated substrates may be received by the robot hand in the reverse order or simultaneously received by two robot hands (not shown).

After the bonded substrate stack 50 is separated into two substrates, the jet medium is present between the two substrates. When the jet medium is a liquid (e.g., water), the surface tension is considerably large. Hence, to space the two substrates apart from each other with a small force, a jet is preferably supplied from the nozzle 260 to the gap between the two substrates. In this case, the jet from the nozzle 260 is stopped after the two substrates are spaced apart from each other. Instead, a mechanism for ejecting a jet used to space the two substrates apart from each other may be independently prepared.

Fourth Embodiment

Figure 6:
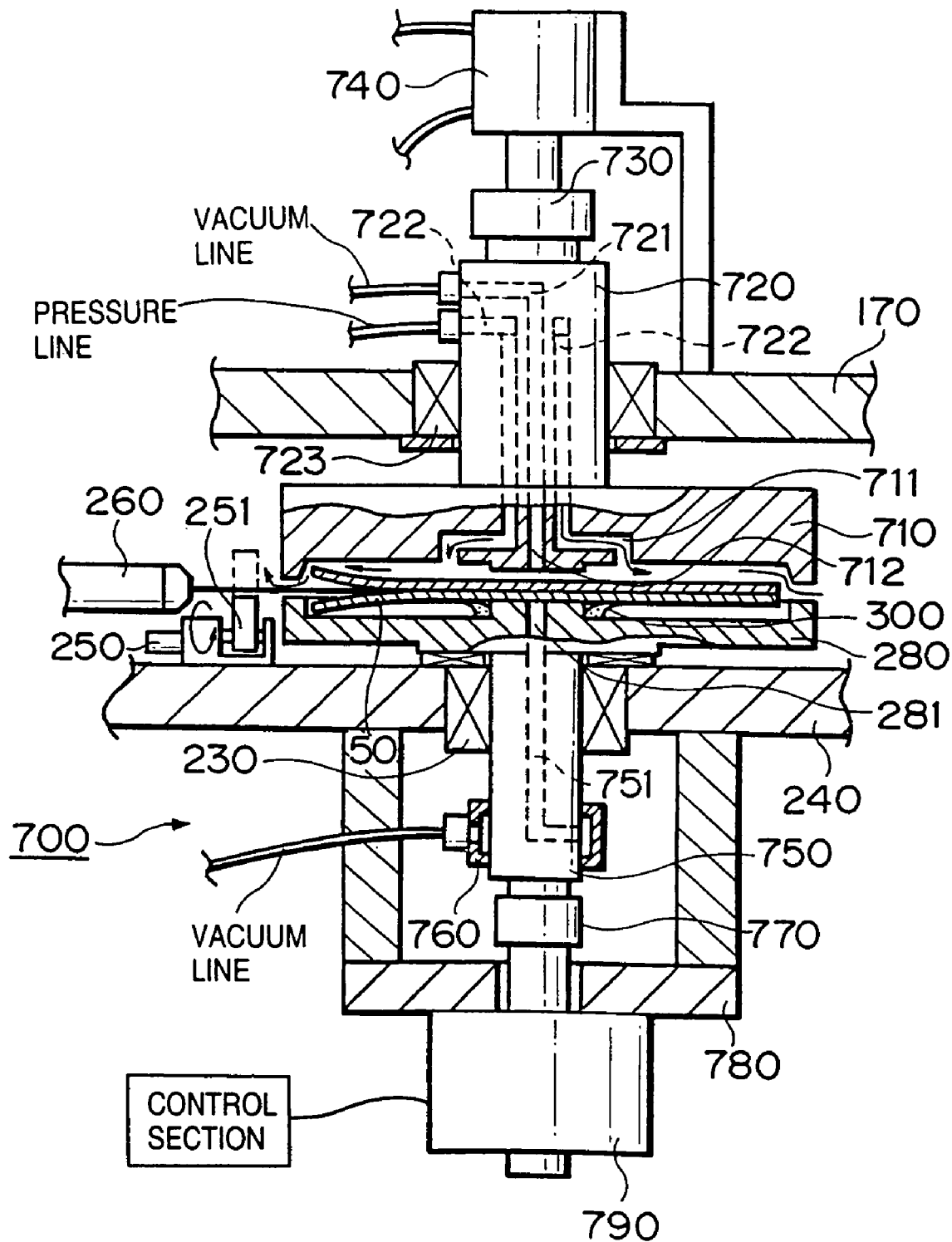
FIG. 6 is a view showing the schematic arrangement of a separating apparatus according to the fourth embodiment of the present invention.

FIG. 6 is a view showing the schematic arrangement of a separating apparatus according to the fourth embodiment of the present invention. The same reference numerals as in other drawings substantially denote the same constituent elements in FIG. 6.

A separating apparatus 700 of the fourth embodiment roughly has an upside-down arrangement of the separating apparatus 600 of the third embodiment. More specifically, the separating apparatus 700 has a pair of substrate holding portions 710 and 280. The substrate holding portions 710 and 280 horizontally hold a bonded substrate stack 50 by sandwiching it from the upper and lower sides. A jet is ejected from a nozzle 260 and injected to a portion near the porous layer of the bonded substrate stack 50 to separate it into two substrates at the porous layer.

The upper substrate holding portion 710 is coupled to one end of an elevating shaft 720. The substrate holding portion 710 causes pressure of a fluid to act on the bonded substrate stack 50 and holds the bonded substrate stack 50 by the pressure of the fluid.

The upper substrate holding portion 710 is coupled to one end of the elevating shaft 720. The substrate holding portion 710 has a fluid blow portion 711 for causing pressure of a fluid to act on the bonded substrate stack 50 to press and hold the bonded substrate stack 50. This blow portion 711 is connected to an external pressure line via a pressure line 722 in the elevating shaft 720. The external pressure line has a solenoid valve (not shown). The solenoid valve is ON/OFF-controlled by a control section as needed. The elevating shaft 720 is supported by an upper table 170 via a reciprocal guide 723.

The substrate holding portion 710 has a suction hole 712 for vacuum-chucking the bonded substrate stack 50. This suction hole is connected to an external vacuum line via a vacuum line 721 in the elevating shaft 720. The external vacuum line has a solenoid valve (not shown). The solenoid valve is ON/OFF-controlled by the control section (not shown) as needed.

The upper substrate holding portion 710 has, at its outer peripheral portion, a plurality of guide members for preventing a bonded substrate stack from causing a positional shift or projecting from the substrate holding portions during separation, like the substrate holding portion shown in FIG. 3. The guide members are preferably arranged such that the robot hand can be inserted between a substrate and the substrate holding portion 710, like the above-described guide members 283 (273).

With this above arrangement, when the bonded substrate stack 50 is pressed and held by pressure of a fluid during separation processing, an already separated portion of the bonded substrate stack 50 is allowed to warp due to the pressure of the jet medium injected into the bonded substrate stack 50. In addition, the warp amount can be appropriately limited. The fluid used to hold the bonded substrate stack 50 may be a gas such as air or a liquid such as water.

The other end of the elevating shaft 720 is coupled to the piston rod of an air cylinder 740 via a coupling 730. The air cylinder 740 is fixed to the upper table 170.

The lower substrate holding portion 280 is coupled to one end of a rotating shaft 750. The other end of the rotating shaft 750 is coupled to a motor 790 via a coupling 770. The rotating shaft 750 is supported by a lower table 240 via a bearing 230. The motor 790 is fixed to a support member 780 fixed to the lower table 240.

A vacuum line 751 connected to a suction hole 281 of the substrate holding portion 280 extends through the rotating shaft 750. The vacuum line 751 is connected to an external vacuum line via a ring 760. The external vacuum line has a solenoid valve (not shown). The solenoid valve is ON/OFF-controlled by the control section (not shown) as needed.

Procedures of separation processing by the separating apparatus 700 will be described below. First, the air cylinder 740 retracts the piston rod to form an appropriate gap between substrate holding portions 710 and 280. In this state, the bonded substrate stack 50 is horizontally supported by a robot hand 400 from the lower side, inserted to a predetermined position between the substrate holding portions 710 and 280, and placed on the substrate holding portion 280.

The air cylinder 740 extends the piston rod to move the upper substrate holding portion 710 downward until a predetermined gap is formed between the upper surface of the bonded substrate stack 50 and the support portion of the upper substrate holding portion 710.

The solenoid valve of the external pressure line is opened to blow a fluid from the blow portion 711 of the substrate holding portion 710. The bonded substrate stack 50 is pressed against the lower substrate holding portion 280 and held.

The motor 790 is actuated to transmit the rotational force to the rotating shaft 750. The rotating shaft 750, substrate holding portion 280, and bonded substrate stack 50 rotate integrally.

While keeping a shutter 251 closed, a pump (not shown) connected to the nozzle 260 is actuated to feed a high-pressure jet medium (e.g., water) to the nozzle 260. A high-pressure jet is ejected from the nozzle 260. When the jet stabilizes, the shutter 251 is opened. The jet ejected from the nozzle 260 is continuously injected into the porous layer of the bonded substrate stack 50 to start separating the bonded substrate stack 50.

When separation of the bonded substrate stack 50 is ended, the shutter 251 is closed, and the pump connected to the nozzle 260 is stopped to stop jet injection into the bonded substrate stack 50. The operation of the motor 790 is also stopped.

The vacuum chuck mechanisms of the substrate holding portions 710 and 280 are actuated (solenoid valves are opened) to cause the substrate holding portion 710 to vacuum-chuck the upper separated substrate and the substrate holding portion 280 to vacuum-chuck the lower separated substrate.

The air cylinder 740 retracts the piston rod to form a predetermined gap between the substrate holding portions 710 and 280. The two separated substrates are spaced apart from each other.

The robot hand 400 is inserted between the substrate and the substrate holding portion 710. The robot hand 400 chucks the substrate. After that, chuck by the vacuum chuck mechanism of the substrate holding portion 710 is canceled. The substrate is transferred from the substrate holding portion 710 to the robot hand 400. The robot hand 400 conveys the substrate to a predetermined position (e.g., a cassette).

The robot hand 400 is inserted between the substrate and the substrate holding portion 280. The robot hand 400 chucks the substrate. After that, chuck by the vacuum chuck mechanism of the substrate holding portion 280 is canceled. The substrate is transferred from the substrate holding portion 280 to the robot hand 400. The robot hand 400 conveys the substrate to a predetermined position (e.g., a cassette). The two separated substrates may be received by the robot hand in the reverse order or simultaneously received by two robot hands (not shown).

After the bonded substrate stack 50 is separated into two substrates, the jet medium is present between the two substrates. When the jet medium is a liquid (e.g., water), the surface tension is considerably large. Hence, to space the two substrates apart from each other with a small force, a jet is preferably supplied from the nozzle 260 to the gap between the two substrates. In this case, the jet from the nozzle 260 is stopped after the two substrates are spaced apart from each other. Instead, a mechanism for ejecting a jet used to space the two substrates apart from each other may be independently prepared.

Fifth Embodiment

Figure 7:
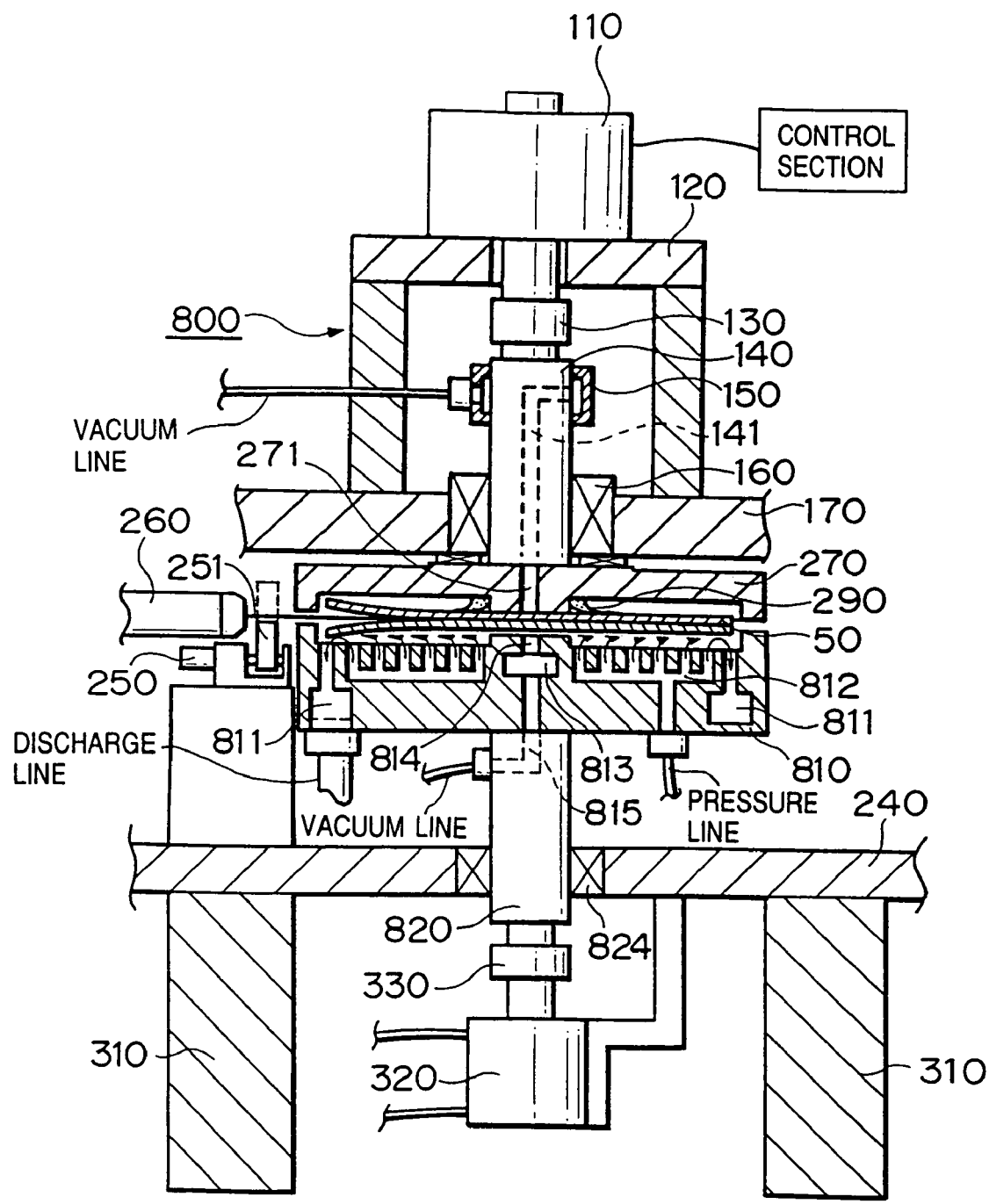
FIG. 7 is a view showing the schematic arrangement of a separating apparatus according to the fifth embodiment of the present invention.

FIG. 7 is a view showing the schematic arrangement of a separating apparatus according to the fifth embodiment of the present invention. The same reference numerals as in other drawings substantially denote the same constituent elements in FIG. 7.

A separating apparatus 800 holds a bonded substrate stack 50 by pressure of a fluid during separation. The separating apparatus 800 has a pair of substrate holding portions 270 and 810 for holding the bonded substrate stack 50. The upper substrate holding portion 270 and constituent elements thereof are the same as those described above.

The lower substrate holding portion 810 is coupled to one end of an elevating shaft 820. The other end of the elevating shaft 820 is coupled to the piston rod of an air cylinder 320 via a coupling 330. The elevating shaft 820 is supported by a lower table 240 via a reciprocal guide 824.

The lower substrate holding portion 810 has a fluid blow portion 812 for causing pressure of a fluid to act on the bonded substrate stack 50 to press and hold the bonded substrate stack 50. This blow portion 812 is connected to an external pressure line. The external pressure line has a solenoid valve (not shown). The solenoid valve is ON/OFF-controlled by a control section as needed.

The lower substrate holding portion 810 has a discharge line 811 for externally discharging the fluid blown from the blow portion 812. The lower substrate holding portion 810 also has a suction hole 814 for vacuum-chucking the bonded substrate stack 50. The suction hole 814 has a solenoid valve 813 near its inlet to prevent the fluid blown from the blow portion 812 from being drawn from the suction hole 814. The suction hole 814 is connected to a vacuum line 815 in the elevating shaft 820 via the solenoid valve 813. The suction hole 814, solenoid valve 813, and vacuum line 815 construct the vacuum chuck mechanism of the substrate holding portion 810.

The lower substrate holding portion 810 has, at its outer peripheral portion, a plurality of guide members for preventing a bonded substrate stack from causing a positional shift or projecting from the substrate holding portions during separation, like the substrate holding portion shown in FIG. 3. The guide members are preferably arranged such that the robot hand can be inserted between a substrate and the substrate holding portion 810, like the above-described guide members 283 (273).

With this above arrangement, when the bonded substrate stack 50 is pressed and held by pressure of a fluid during separation processing, an already separated portion of the bonded substrate stack 50 is allowed to warp due to the pressure of the jet medium injected into the bonded substrate stack 50. In addition, the warp amount can be appropriately limited. The fluid used to hold the bonded substrate stack 50 may be a gas such as air or a liquid such as water.

Procedures of separation processing by the separating apparatus 800 will be described below. First, the air cylinder 320 retracts the piston rod to form an appropriate gap between substrate holding portions 270 and 810. In this state, the bonded substrate stack 50 is horizontally supported by a robot hand 400 from the lower side, inserted to a predetermined position between the substrate holding portions 270 and 810, and placed on the substrate holding portion 810.

The air cylinder 320 extends the piston rod to move the lower substrate holding portion 810 upward until a predetermined gap is formed between the upper surface of the bonded substrate stack 50 and the support portion of the upper substrate holding portion 270.

The solenoid valve of the external pressure line is opened to blow a fluid from the blow portion 812 of the substrate holding portion 810. The bonded substrate stack 50 is floated, pressed against the upper substrate holding portion 270, and held.

A motor 110 is actuated to transmit the rotational force to a rotating shaft 140. The rotating shaft 140, substrate holding portion 270, and bonded substrate stack 50 rotate integrally.

While keeping a shutter 251 closed, a pump (not shown) connected to a nozzle 260 is actuated to feed a high-pressure jet medium (e.g., water) to the nozzle 260. A high-pressure jet is ejected from the nozzle 260. When the jet stabilizes, the shutter 251 is opened. The jet ejected from the nozzle 260 is continuously injected into the porous layer of the bonded substrate stack 50 to start separating the bonded substrate stack 50.

When separation of the bonded substrate stack 50 is ended, the shutter 251 is closed, and the pump connected to the nozzle 260 is stopped to stop jet injection into the bonded substrate stack 50. The operation of the motor 110 is also stopped.

The vacuum chuck mechanisms of the substrate holding portions 270 and 810 are actuated (solenoid valves are opened) to cause the substrate holding portion 270 to vacuum-chuck the upper separated substrate and the substrate holding portion 810 to vacuum-chuck the lower separated substrate.

The air cylinder 320 retracts the piston rod to form a predetermined gap between the substrate holding portions 270 and 810. The two separated substrates are spaced apart from each other.

The robot hand 400 is inserted between the substrate and the substrate holding portion 270. The robot hand 400 chucks the substrate. After that, chuck by the vacuum chuck mechanism of the substrate holding portion 270 is canceled. The substrate is transferred from the substrate holding portion 270 to the robot hand 400. The robot hand 400 conveys the substrate to a predetermined position (e.g., a cassette).

The robot hand 400 is inserted between the substrate and the substrate holding portion 810. The robot hand 400 chucks the substrate. After that, chuck by the vacuum chuck mechanism of the substrate holding portion 810 is canceled. The substrate is transferred from the substrate holding portion 810 to the robot hand 400. The robot hand 400 conveys the substrate to a predetermined position (e.g., a cassette). The two separated substrates may be received by the robot hand in the reverse order or simultaneously received by two robot hands (not shown).

After the bonded substrate stack 50 is separated into two substrates, the jet medium is present between the two substrates. When the jet medium is a liquid (e.g., water), the surface tension is considerably large. Hence, to space the two substrates apart from each other with a small force, a jet is preferably supplied from the nozzle 260 to the gap between the two substrates. In this case, the jet from the nozzle 260 is stopped after the two substrates are spaced apart from each other. Instead, a mechanism for ejecting a jet used to space the two substrates apart from each other may be independently prepared.

Sixth Embodiment

Figure 8:
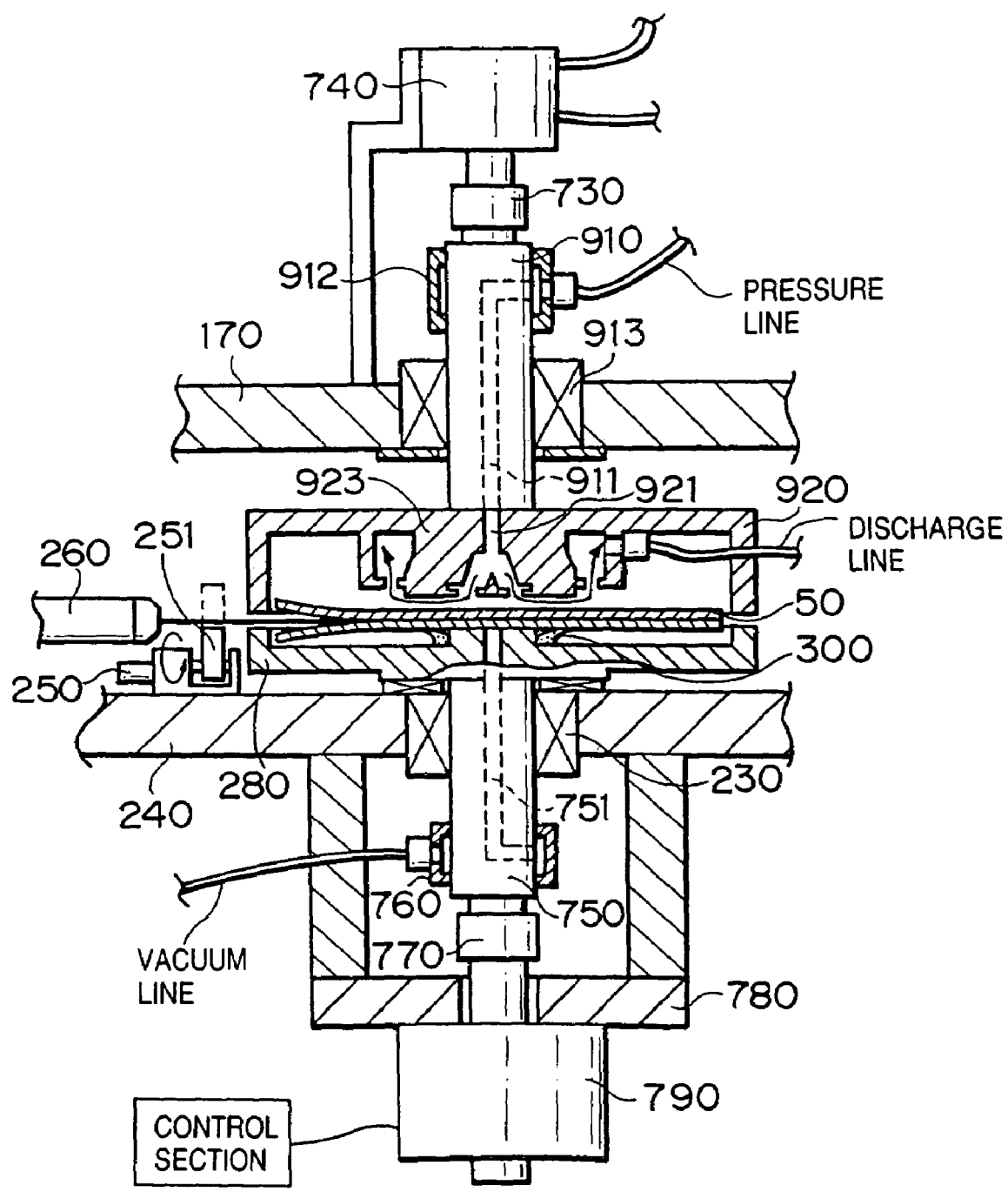
FIG. 8 is a view showing the schematic arrangement of a separating apparatus according to the sixth embodiment of the present invention.

FIG. 8 is a view showing the schematic arrangement of a separating apparatus according to the sixth embodiment of the present invention. The same reference numerals as in other drawings substantially denote the same constituent elements in FIG. 8.

A separating apparatus 900 has a pair of substrate holding portions 920 and 280. The upper substrate holding portion 920 has a Bernoulli chuck 923. The lower substrate holding portion 280 and constituent elements thereof are the same as those described above.

The Bernoulli chuck 923 ejects a gas from the center of the shade-shaped chuck radially along the shade and chucks a sample such as a bonded substrate stack using the fact that the central portion of the chuck has negative pressure.

The substrate holding portion 920 having the Bernoulli chuck 923 is coupled to one end of an elevating shaft 910. A gas introduction portion 921 of the Bernoulli chuck 923 is coupled to a pressure line 911 in the elevating shaft 910. The pressure line 911 is connected to an external pressure line via a ring 912. The external pressure line has a solenoid valve (not shown). The solenoid valve is ON/OFF-controlled by a control section as needed.

The upper substrate holding portion 920 has, at its outer peripheral portion, a plurality of guide members for preventing a bonded substrate stack from causing a positional shift or projecting from the substrate holding portions during separation, like the substrate holding portion shown in FIG. 3. The guide members are preferably arranged such that the robot hand can be inserted between a substrate and the substrate holding portion 920, like the above-described guide members 283 (273).

The other end of the elevating shaft 910 is coupled to the piston rod of an air cylinder 740 via a coupling 730. The elevating shaft 910 is supported by an upper table 170 via a reciprocal/rotational guide 913.

Procedures of separation processing by the separating apparatus 900 will be described below. First, the air cylinder 740 retracts the piston rod to form an appropriate gap between substrate holding portions 920 and 280. In this state, the bonded substrate stack 50 is horizontally supported by a robot hand 400 from the lower side, inserted to a predetermined position between the substrate holding portions 920 and 280, and placed on the substrate holding portion 280.

The air cylinder 740 extends the piston rod to move the upper substrate holding portion 920 downward until a predetermined gap is formed between the upper surface of the bonded substrate stack 50 and the Bernoulli chuck 923 of the upper substrate holding portion 920.

The solenoid valve of the external pressure line is opened to blow a fluid radially from the center of the Bernoulli chuck 923 of the substrate holding portion 920. The bonded substrate stack 50 is chucked.

A motor 790 is actuated to transmit the rotational force to a rotating shaft 750. The rotating shaft 750, substrate holding portion 280, bonded substrate stack 50, substrate holding portion 920, and rotating shaft 910 rotate integrally.

While keeping a shutter 251 closed, a pump (not shown) connected to a nozzle 260 is actuated to feed a high-pressure jet medium (e.g., water) to the nozzle 260. A high-pressure jet is ejected from the nozzle 260. When the jet stabilizes, the shutter 251 is opened. The jet ejected from the nozzle 260 is continuously injected into the porous layer of the bonded substrate stack 50 to start separating the bonded substrate stack 50.

When separation of the bonded substrate stack 50 is ended, the shutter 251 is closed, and the pump connected to the nozzle 260 is stopped to stop jet injection into the bonded substrate stack 50. The operation of the motor 790 is also stopped.

While keeping the Bernoulli chuck 923 of the substrate holding portion 920 actuating, the vacuum chuck mechanism of the substrate holding portion 280 is actuated to cause the substrate holding portion 920 to vacuum-chuck the upper separated substrate and the substrate holding portion 280 to vacuum-chuck the lower separated substrate.

The air cylinder 740 retracts the piston rod to form a predetermined gap between the substrate holding portions 920 and 280. The two separated substrates are spaced apart from each other.

The robot hand 400 is inserted between the substrate and the substrate holding portion 920. The robot hand 400 chucks the substrate. After that, chuck by the Bernoulli chuck 923 of the substrate holding portion 920 is canceled. The substrate is transferred from the substrate holding portion 920 to the robot hand 400. The robot hand 400 conveys the substrate to a predetermined position (e.g., a cassette).

The robot hand 400 is inserted between the substrate and the substrate holding portion 280. The robot hand 400 chucks the substrate. After that, chuck by the vacuum chuck mechanism of the substrate holding portion 280 is canceled. The substrate is transferred from the substrate holding portion 280 to the robot hand 400. The robot hand 400 conveys the substrate to a predetermined position (e.g., a cassette). The two separated substrates may be received by the robot hand in the reverse order or simultaneously received by two robot hands (not shown).

After the bonded substrate stack 50 is separated into two substrates, the jet medium is present between the two substrates. When the jet medium is a liquid (e.g., water), the surface tension is considerably large. Hence, to space the two substrates apart from each other with a small force, a jet is preferably supplied from the nozzle 260 to the gap between the two substrates. In this case, the jet from the nozzle 260 is stopped after the two substrates are spaced apart from each other. Instead, a mechanism for ejecting a jet used to space the two substrates apart from each other may be independently prepared.

As described above, when the substrate holding portion 920 uses the Bernoulli chuck 923, and the distance between the substrate holding portion 920 and the bonded substrate stack 50 is adjusted, the force (press force or suction force) applied to the bonded substrate stack 50 by the substrate holding portion 920 can be adjusted.

Seventh Embodiment

Figure 9:
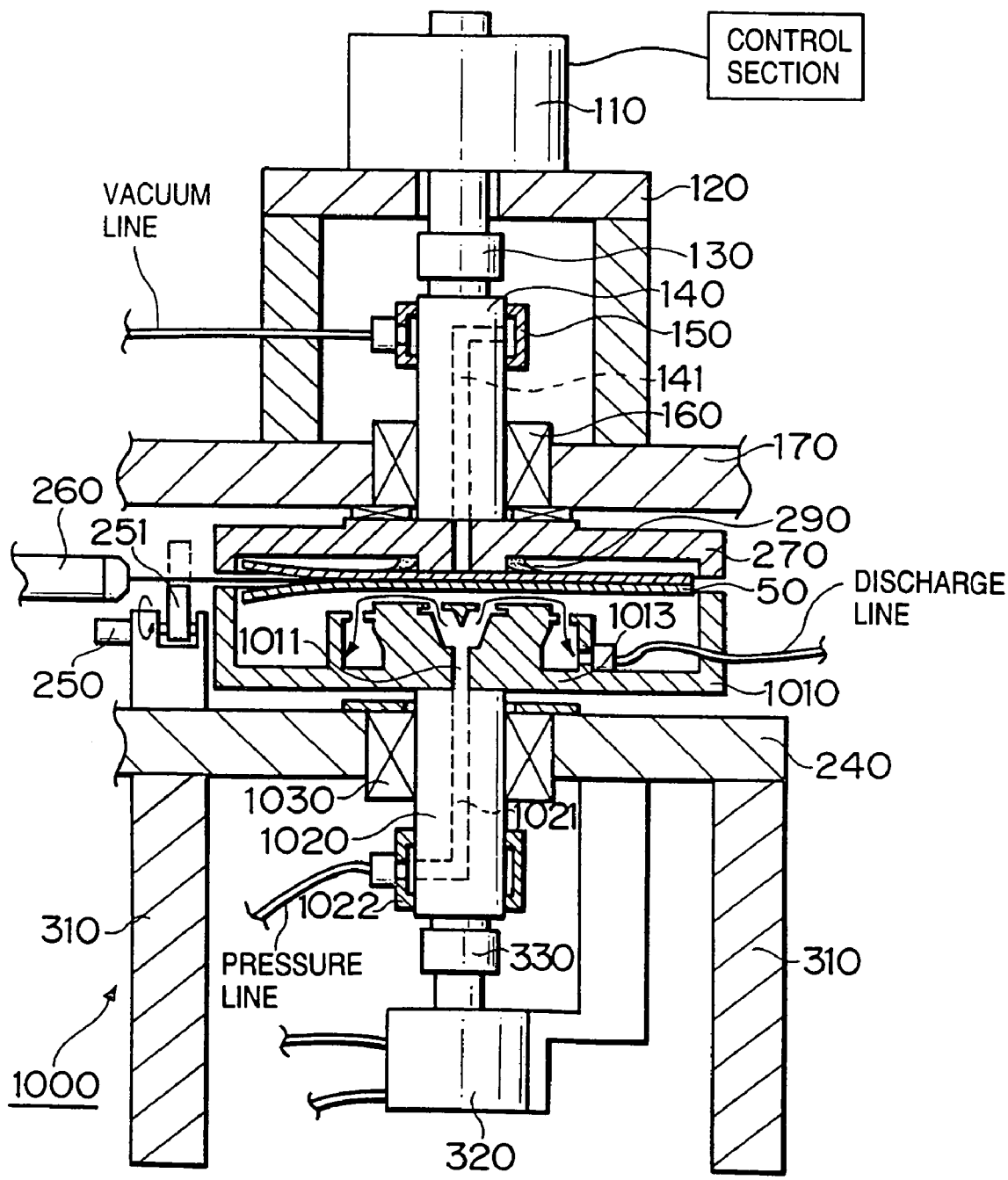
FIG. 9 is a view showing the schematic arrangement of a separating apparatus according to the seventh embodiment of the present invention.

FIG. 9 is a view showing the schematic arrangement of a separating apparatus according to the seventh embodiment of the present invention. The same reference numerals as in other drawings substantially denote the same constituent elements in FIG. 9.

A separating apparatus 1000 has a pair of substrate holding portions 270 and 1010. The lower substrate holding portion 1010 has a Bernoulli chuck 1013. The upper substrate holding portion 270 and constituent elements thereof are the same as those described above.

The Bernoulli chuck 1013 ejects a gas from the center of the shade-shaped chuck radially along the shade and chucks a sample such as a bonded substrate stack using the fact that the central portion of the chuck has negative pressure.

The substrate holding portion 1010 having the Bernoulli chuck 1013 is coupled to one end of an elevating shaft 1020. A gas introduction portion 1011 of the Bernoulli chuck 1013 is coupled to a pressure line 1021 in the elevating shaft 1020. The pressure line 1021 is connected to an external pressure line via a ring 1022. The external pressure line has a solenoid valve (not shown). The solenoid valve is ON/OFF-controlled by a control section as needed.

The lower substrate holding portion 1010 has, at its outer peripheral portion, a plurality of guide members for preventing a bonded substrate stack from causing a positional shift or projecting from the substrate holding portions during separation, like the substrate holding portion shown in FIG. 3. The guide members are preferably arranged such that the robot hand can be inserted between a substrate and the substrate holding portion 1010, like the above-described guide members 283 (273).

The other end of the elevating shaft 1020 is coupled to the piston rod of an air cylinder 320 via a coupling 330. The elevating shaft 1020 is supported by a lower table 240 via a reciprocal/rotational guide 1030.

Procedures of separation processing by the separating apparatus 1000 will be described below. First, the air cylinder 320 retracts the piston rod to form an appropriate gap between substrate holding portions 270 and 1010. In this state, the bonded substrate stack 50 is horizontally supported by a robot hand 400 from the lower side, inserted to a predetermined position between the substrate holding portions 270 and 1010, and placed on the substrate holding portion 1010.

The air cylinder 320 extends the piston rod to move the lower substrate holding portion 1010 upward until a predetermined gap is formed between the upper surface of the bonded substrate stack 50 and the support portion of the upper substrate holding portion 270.

The solenoid valve of the external pressure line is opened to blow a fluid radially from the center of the Bernoulli chuck 1013 of the substrate holding portion 1010. The bonded substrate stack 50 is chucked.

A motor 110 is actuated to transmit the rotational force to a rotating shaft 140. The rotating shaft 140, substrate holding portion 270, bonded substrate stack 50, substrate holding portion 1010, and rotating shaft 1020 rotate integrally.

While keeping a shutter 251 closed, a pump (not shown) connected to a nozzle 260 is actuated to feed a high-pressure jet medium (e.g., water) to the nozzle 260. A high-pressure jet is ejected from the nozzle 260. When the jet stabilizes, the shutter 251 is opened. The jet ejected from the nozzle 260 is continuously injected into the porous layer of the bonded substrate stack 50 to start separating the bonded substrate stack 50.

When separation of the bonded substrate stack 50 is ended, the shutter 251 is closed, and the pump connected to the nozzle 260 is stopped to stop jet injection into the bonded substrate stack 50. The operation of the motor 110 is also stopped.

While keeping the Bernoulli chuck 1013 of the substrate holding portion 1010 actuating, the vacuum chuck mechanism of the substrate holding portion 270 is actuated to cause the substrate holding portion 270 to vacuum-chuck the upper separated substrate and the Bernoulli chuck of the substrate holding portion 1010 to vacuum-chuck the lower separated substrate.

The air cylinder 320 retracts the piston rod to form a predetermined gap between the substrate holding portions 270 and 1010. The two separated substrates are spaced apart from each other.

The robot hand 400 is inserted between the substrate and the substrate holding portion 270. The robot hand 400 chucks the substrate. After that, vacuum chuck by the substrate holding portion 270 is canceled. The substrate is transferred from the substrate holding portion 270 to the robot hand 400. The robot hand 400 conveys the substrate to a predetermined position (e.g., a cassette).

The robot hand 400 is inserted between the substrate and the Bernoulli chuck 1013 of the substrate holding portion 1010. The robot hand 400 chucks the substrate. After that, chuck by the Bernoulli chuck 1013 of the substrate holding portion 1010 is canceled. The substrate is transferred from the substrate holding portion 1010 to the robot hand 400. The robot hand 400 conveys the substrate to a predetermined position (e.g., a cassette). The two separated substrates may be received by the robot hand in the reverse order or simultaneously received by two robot hands (not shown).

After the bonded substrate stack 50 is separated into two substrates, the jet medium is present between the two substrates. When the jet medium is a liquid (e.g., water), the surface tension is considerably large. Hence, to space the two substrates apart from each other with a small force, a jet is preferably supplied from the nozzle 260 to the gap between the two substrates. In this case, the jet from the nozzle 260 is stopped after the two substrates are spaced apart from each other. Instead, a mechanism for ejecting a jet used to space the two substrates apart from each other may be independently prepared.

As described above, when the substrate holding portion 1010 uses the Bernoulli chuck 1013, and the distance between the substrate holding portion 1010 and the bonded substrate stack 50 is adjusted, the force (press force or suction force) applied to the bonded substrate stack 50 by the substrate holding portion 1010 can be adjusted.

Eighth Embodiment

Figure 10:
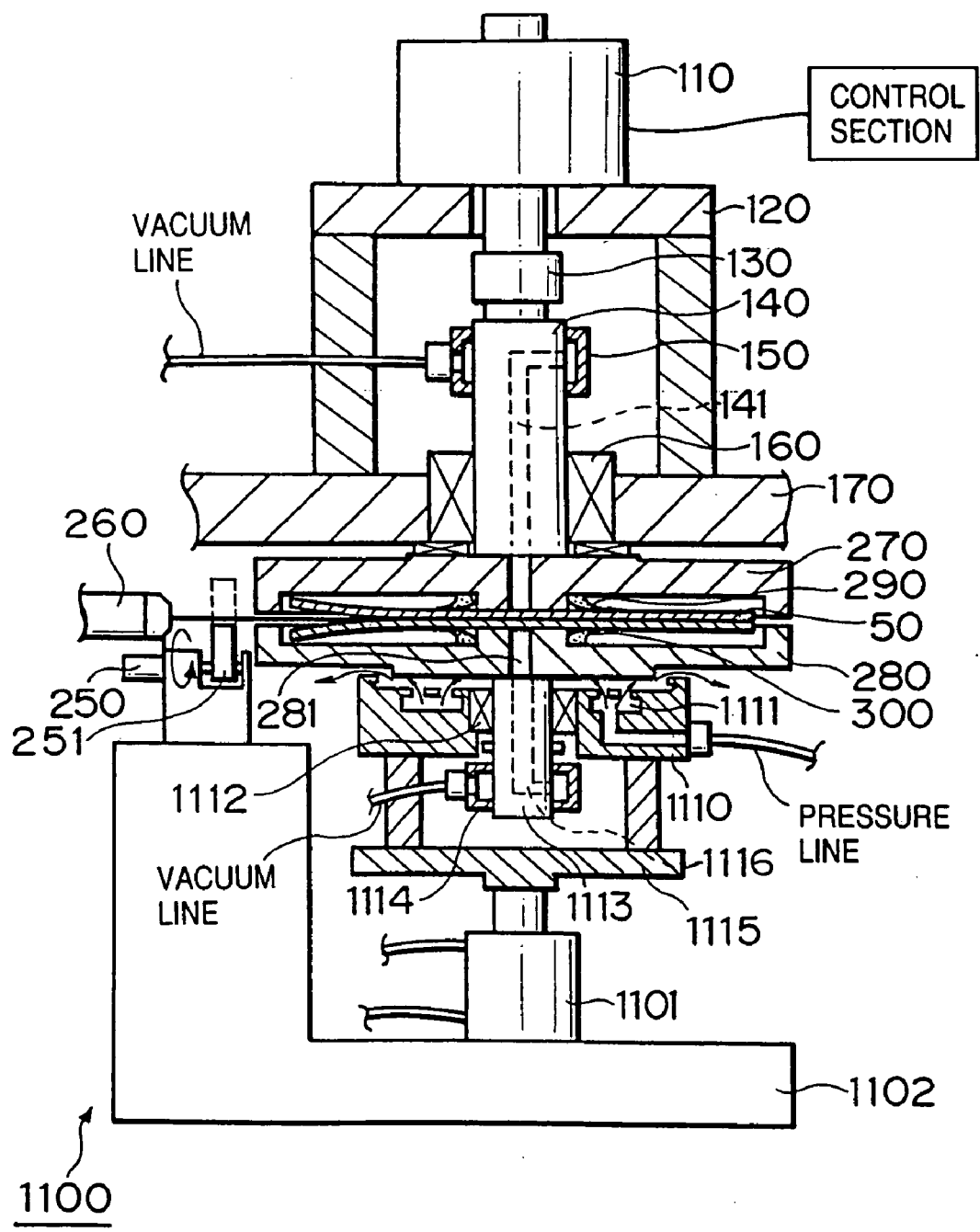
FIG. 10 is a view showing the schematic arrangement of a separating apparatus according to the eighth embodiment of the present invention.

FIG. 10 is a view showing the schematic arrangement of a separating apparatus according to the eighth embodiment of the present invention. The same reference numerals as in other drawings substantially denote the same constituent elements in FIG. 10.

A separating apparatus 1100 has a pair of substrate holding portions 270 and 280. Both the pair of substrate holding portions 270 and 280 are brought into contact with a bonded substrate stack 50 to press and hold the bonded substrate stack 50. As the force for pressing the bonded substrate stack 50, pressure of a fluid (a gas or a liquid) is used.

The lower substrate holding portion 280 is coupled to a rotating shaft 1113. The rotating shaft 1113 is supported by a lower support 1110 via a reciprocal/rotational guide 1112. The substrate holding portion 280 has a suction hole 281 for vacuum-chucking the bonded substrate stack 50. The suction hole 281 is connected to a vacuum line 1116 in the rotating shaft 1113. The vacuum line 1116 is connected to an external vacuum line via a ring 1114. The external vacuum line has a solenoid valve (not shown). The solenoid valve is ON/OFF-controlled by a control section as needed.

The lower support 1110 has a fluid blow portion 1111. The blow portion 1111 is connected to an external pressure line. The external pressure line has a solenoid valve (not shown). The solenoid valve is ON/OFF-controlled by the control section as needed.

The lower support 1110 is coupled to an elevating table 1115 fixed to the piston rod of an air cylinder 1101 and vertically moves in accordance with the vertical movement of the elevating table 1115. The air cylinder 1101 is fixed to a support table 1102.

The upper substrate holding portion 270 and constituent elements thereof are the same as those described above.

When the bonded substrate stack 50 is held by the above arrangement, warp of the bonded substrate stack 50 during separation is more limited than in the separating apparatus shown in FIG. 5 or 6. The stability of the bonded substrate stack 50 in separation can be increased, and for example, swing of the bonded substrate stack 50 can be prevented.

Procedures of separation processing by the separating apparatus 1100 will be described below. First, the air cylinder 1101 retracts the piston rod to form an appropriate gap between substrate holding portions 270 and 280. In this state, the bonded substrate stack 50 is horizontally supported by a robot hand 400 from the lower side, inserted to a predetermined position between the substrate holding portions 270 and 280, and placed on the substrate holding portion 280.

The air cylinder 1101 extends the piston rod to move the lower substrate holding portion 280 upward until a predetermined gap is formed between the upper surface of the bonded substrate stack 50 and the support portion of the upper substrate holding portion 270.

The solenoid valve of the external pressure line is opened to blow a fluid from the blow portion 1111 of the lower support 1110. The lower substrate holding portion 280 is moved upward to press and hold the bonded substrate stack 50.

A motor 110 is actuated to transmit the rotational force to a rotating shaft 140. The rotating shaft 140, substrate holding portion 270, bonded substrate stack 50, substrate holding portion 280, and rotating shaft 1113 rotate integrally.

While keeping a shutter 251 closed, a pump (not shown) connected to a nozzle 260 is actuated to feed a high-pressure jet medium (e.g., water) to the nozzle 260. A high-pressure jet is ejected from the nozzle 260. When the jet stabilizes, the shutter 251 is opened. The jet ejected from the nozzle 260 is continuously injected into the porous layer of the bonded substrate stack 50 to start separating the bonded substrate stack 50.

When separation of the bonded substrate stack 50 is ended, the shutter 251 is closed, and the pump connected to the nozzle 260 is stopped to stop jet injection into the bonded substrate stack 50. The operation of the motor 110 is also stopped.

The vacuum chuck mechanisms of the substrate holding portions 270 and 280 are actuated (solenoid valves are opened) to cause the substrate holding portion 270 to vacuum-chuck the upper separated substrate and the substrate holding portion 280 to vacuum-chuck the lower separated substrate.

The air cylinder 1101 retracts the piston rod to form a predetermined gap between the substrate holding portions 270 and 280. The two separated substrates are spaced apart from each other.

The robot hand 400 is inserted between the substrate and the substrate holding portion 270. The robot hand 400 chucks the substrate. After that, chuck by the vacuum chuck mechanism of the substrate holding portion 270 is canceled. The substrate is transferred from the substrate holding portion 270 to the robot hand 400. The robot hand 400 conveys the substrate to a predetermined position (e.g., a cassette).

The robot hand 400 is inserted between the substrate and the substrate holding portion 280. The robot hand 400 chucks the substrate. After that, chuck by the vacuum chuck mechanism of the substrate holding portion 280 is canceled. The substrate is transferred from the substrate holding portion 280 to the robot hand 400. The robot hand 400 conveys the substrate to a predetermined position (e.g., a cassette). The two separated substrates may be received by the robot hand in the reverse order or simultaneously received by two robot hands (not shown).

After the bonded substrate stack 50 is separated into two substrates, the jet medium is present between the two substrates. When the jet medium is a liquid (e.g., water), the surface tension is considerably large. Hence, to space the two substrates apart from each other with a small force, a jet is preferably supplied from the nozzle 260 to the gap between the two substrates. In this case, the jet from the nozzle 260 is stopped after the two substrates are spaced apart from each other. Instead, a mechanism for ejecting a jet used to space the two substrates apart from each other may be independently prepared.

Ninth Embodiment

Figure 11:
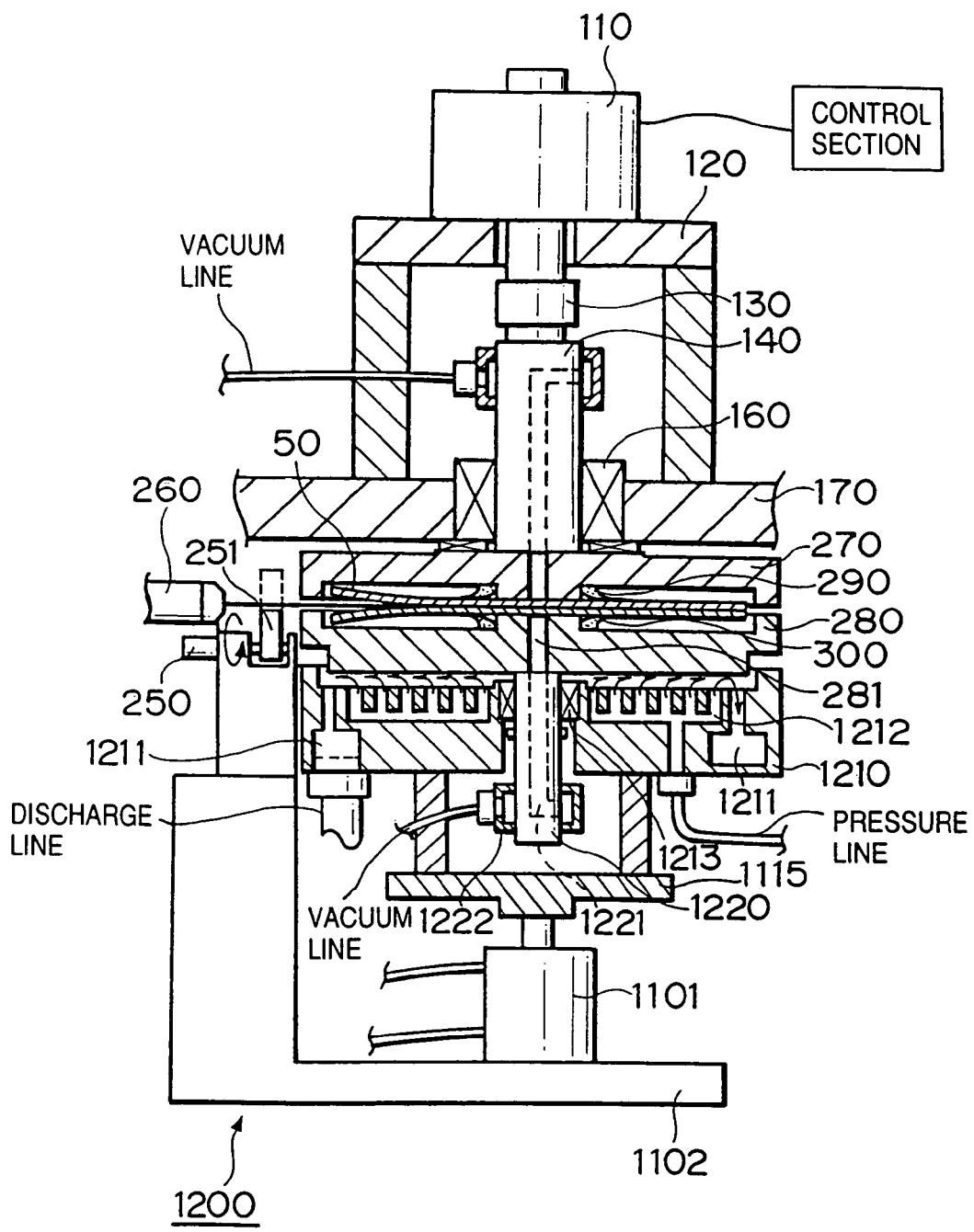
FIG. 11 is a view showing the schematic arrangement of a separating apparatus according to the ninth embodiment of the present invention.

FIG. 11 is a view showing the schematic arrangement of a separating apparatus according to the ninth embodiment of the present invention. The same reference numerals as in other drawings substantially denote the same constituent elements in FIG. 11.

A separating apparatus 1200 has a pair of substrate holding portions 270 and 280. Both the pair of substrate holding portions 270 and 280 are brought into contact with a bonded substrate stack 50 to press and hold the bonded substrate stack 50. As the force for pressing the bonded substrate stack 50, pressure of a fluid (a gas or a liquid) is used.

The lower substrate holding portion 280 is coupled to a rotating shaft 1220. The rotating shaft 1220 is supported by a lower support 1210 via a reciprocal/rotational guide 1213. The substrate holding portion 280 has a suction hole 281 for vacuum-chucking the bonded substrate stack 50. The suction hole 281 is connected to a vacuum line 1221 in the rotating shaft 1220. The vacuum line 1221 is connected to an external vacuum line via a ring 1222. The external vacuum line has a solenoid valve (not shown). The solenoid valve is ON/OFF-controlled by a control section as needed.

The lower support 1210 has a fluid blow portion 1212. The blow portion 1212 is connected to an external pressure line. The external pressure line has a solenoid valve (not shown). The solenoid valve is ON/OFF-controlled by the control section (not shown) as needed. The lower support 1210 has a discharge line 1211 for externally discharging the fluid blown from the blow portion 1212.

The lower support 1210 is coupled to an elevating table 1115 fixed to the piston rod of an air cylinder 1101 and vertically moves in accordance with the vertical movement of the elevating table 1115.

The arrangement of the upper substrate holding portion 270 and constituent elements thereof is the same as described above.

When the bonded substrate stack 50 is held by the above arrangement, warp of the bonded substrate stack 50 during separation is more limited than in the separating apparatus shown in FIG. 7. The stability of the bonded substrate stack 50 in separation can be increased, and for example, swing of the bonded substrate stack 50 can be prevented.

Procedures of separation processing by the separating apparatus 1200 will be described below. First, the air cylinder 1101 retracts the piston rod to form an appropriate gap between substrate holding portions 270 and 280. In this state, the bonded substrate stack 50 is horizontally supported by a robot hand 400 from the lower side, inserted to a predetermined position between the substrate holding portions 270 and 280, and placed on the substrate holding portion 280.

The air cylinder 1101 extends the piston rod to move the lower substrate holding portion 280 upward until a predetermined gap is formed between the upper surface of the bonded substrate stack 50 and the support portion of the upper substrate holding portion 270.

The solenoid valve of the external pressure line is opened to blow a fluid from the blow portion 1212 of the lower support 1210. The lower substrate holding portion 280 is moved upward to press and hold the bonded substrate stack 50.

A motor 110 is actuated to transmit the rotational force to a rotating shaft 140. The rotating shaft 140, substrate holding portion 270, bonded substrate stack 50, substrate holding portion 280, and rotating shaft 1220 rotate integrally.

While keeping a shutter 251 closed, a pump (not shown) connected to a nozzle 260 is actuated to feed a high-pressure jet medium (e.g., water) to the nozzle 260. A high-pressure jet is ejected from the nozzle 260. When the jet stabilizes, the shutter 251 is opened. The jet ejected from the nozzle 260 is continuously injected into the porous layer of the bonded substrate stack 50 to start separating the bonded substrate stack 50.

When separation of the bonded substrate stack 50 is ended, the shutter 251 is closed, and the pump connected to the nozzle 260 is stopped to stop jet injection into the bonded substrate stack 50. The operation of the motor 110 is also stopped.

The vacuum chuck mechanisms of the substrate holding portions 270 and 280 are actuated (solenoid valves are opened) to cause the substrate holding portion 270 to vacuum-chuck the upper separated substrate and the substrate holding portion 280 to vacuum-chuck the lower separated substrate.

The air cylinder 1101 retracts the piston rod to form a predetermined gap between the substrate holding portions 270 and 280. The two separated substrates are spaced apart from each other.

The robot hand 400 is inserted between the substrate and the substrate holding portion 270. The robot hand 400 chucks the substrate. After that, chuck by the vacuum chuck mechanism of the substrate holding portion 270 is canceled. The substrate is transferred from the substrate holding portion 270 to the robot hand 400. The robot hand 400 conveys the substrate to a predetermined position (e.g., a cassette).

The robot hand 400 is inserted between the substrate and the substrate holding portion 280. The robot hand 400 chucks the substrate. After that, chuck by the vacuum chuck mechanism of the substrate holding portion 280 is canceled. The substrate is transferred from the substrate holding portion 280 to the robot hand 400. The robot hand 400 conveys the substrate to a predetermined position (e.g., a cassette). The two separated substrates may be received by the robot hand in the reverse order or simultaneously received by two robot hands (not shown).

After the bonded substrate stack 50 is separated into two substrates, the jet medium is present between the two substrates. When the jet medium is a liquid (e.g., water), the surface tension is considerably large. Hence, to space the two substrates apart from each other with a small force, a jet is preferably supplied from the nozzle 260 to the gap between the two substrates. In this case, the jet from the nozzle 260 is stopped after the two substrates are spaced apart from each other. Instead, a mechanism for ejecting a jet used to space the two substrates apart from each other may be independently prepared.

10th Embodiment

Figure 12:
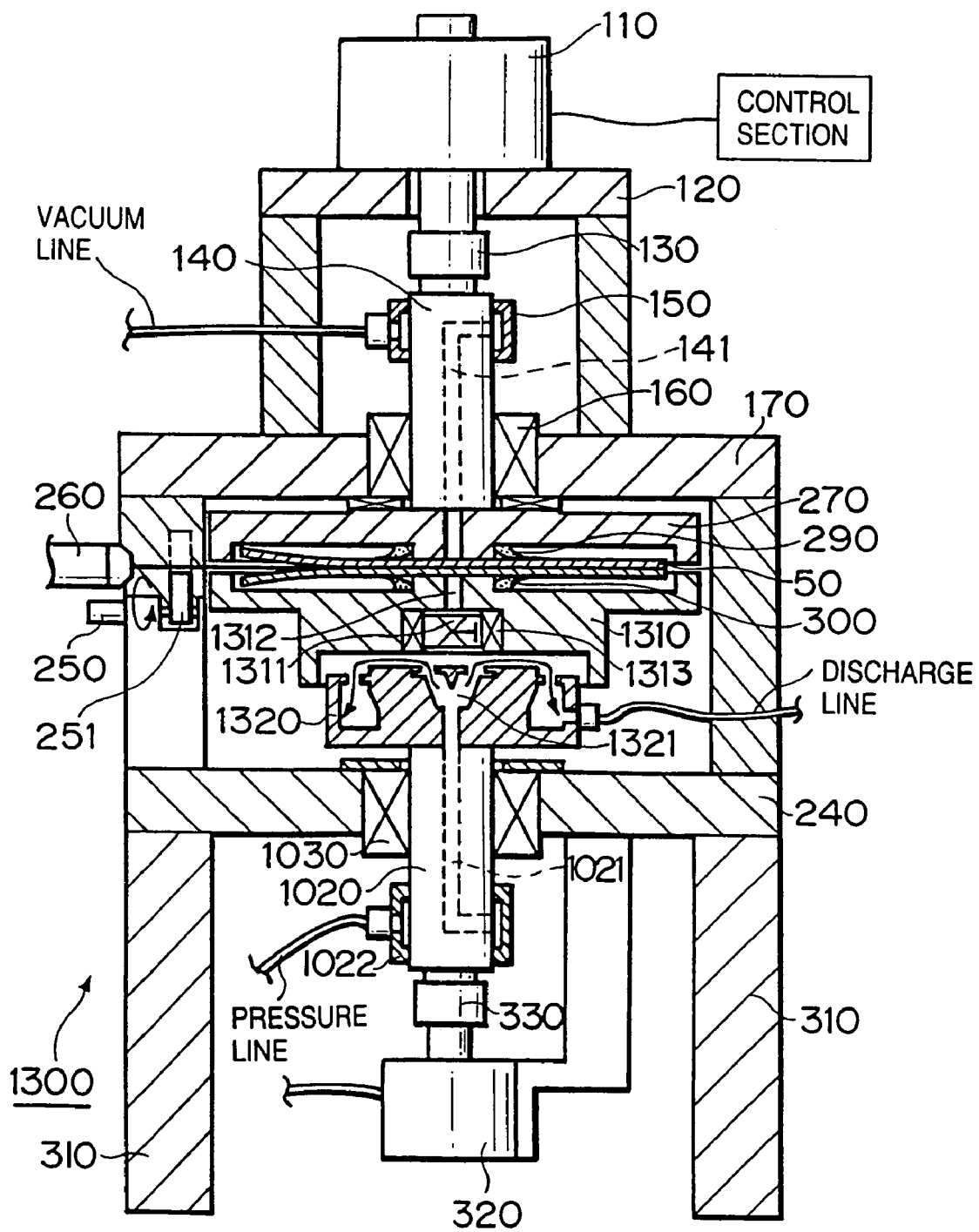
FIG. 12 is a view showing the schematic arrangement of a separating apparatus according to the 10th embodiment of the present invention.

FIG. 12 is a view showing the schematic arrangement of a separating apparatus according to the 10th embodiment of the present invention. The same reference numerals as in other drawings substantially denote the same constituent elements in FIG. 12.

A separating apparatus 1300 has a pair of substrate holding portions 270 and 1310. Both the pair of substrate holding portions 270 and 1310 are brought into contact with a bonded substrate stack 50 to press and hold the bonded substrate stack 50. The force applied to the bonded substrate stack 50 is controlled by a Bernoulli chuck 1320.

The lower substrate holding portion 1310 has a suction hole 1312 for vacuum-chucking the bonded substrate stack 50. The suction hole 1312 is coupled to one end of a solenoid valve 1311 controlled by a control section (not shown). The solenoid valve 1311 is attached to the substrate holding portion 1310 via a bearing 1313. This allows the substrate holding portion 1310 to rotate while fixing the solenoid valve 1311. When the substrate holding portion 1310 is rotated while fixing the solenoid valve 1311, the control line for controlling the solenoid valve 1311 can be prevented from winding as the substrate holding portion 1310 rotates. The other end of the solenoid valve 1311 communicates with the downside.

The lower substrate holding portion 1310 has, at its outer peripheral portion, a plurality of guide members for preventing a bonded substrate stack from causing a positional shift or projecting from the substrate holding portions during separation, like the substrate holding portion shown in FIG. 3. The guide members are preferably arranged such that the robot hand can be inserted between a substrate and the substrate holding portion 1310, like the above-described guide members 283 (273).

The lower substrate holding portion 1310 is supported by a support formed from the Bernoulli chuck 1320. The Bernoulli chuck 1320 ejects a gas from the center of the shade-shaped chuck radially along the shade and applies a force to the substrate holding portion 1310 using the fact that the central portion of the chuck has negative pressure.

The Bernoulli chuck 1320 is coupled to one end of an elevating shaft 1020. A gas introduction portion 1321 of the Bernoulli chuck 1320 is connected to a pressure line 1021 in the elevating shaft 1020. The pressure line 1021 is connected to an external pressure line via a ring 1022. The external pressure line has a solenoid valve (not shown). The solenoid valve is ON/OFF-controlled by a control section as needed.

The other end of the elevating shaft 1020 is coupled to the piston rod of an air cylinder 320 via a coupling 330. The elevating shaft 1020 is supported by a lower table 240 via a reciprocal/rotational guide 1030.

Procedures of separation processing by the separating apparatus 1300 will be described below. First, the air cylinder 320 retracts the piston rod to form an appropriate gap between substrate holding portions 270 and 1310. In this state, the bonded substrate stack 50 is horizontally supported by a robot hand 400 from the lower side, inserted to a predetermined position between the substrate holding portions 270 and 1310, and placed on the substrate holding portion 1310.

The air cylinder 320 extends the piston rod to move the lower substrate holding portion 1310 upward until a predetermined gap is formed between the upper surface of the bonded substrate stack 50 and the support portion of the upper substrate holding portion 270.

The solenoid valve of the external pressure line is opened to blow a fluid from the gas introduction portion 1321 of the Bernoulli chuck 1320. A predetermined force is applied to the lower substrate holding portion 1310 such that the substrate holding portions 270 and 1310 sandwiches and holds the bonded substrate stack 50 from both sides. At this time, to make the bonded substrate stack 50 freely warp, the solenoid valve 1311 is preferably closed. However, the solenoid valve 1311 may be opened.

A motor 110 is actuated to transmit the rotational force to a rotating shaft 140. The rotating shaft 140, substrate holding portion 270, bonded substrate stack 50, substrate holding portion 1310, Bernoulli chuck 1320, and rotating shaft 1020 rotate integrally.

While keeping a shutter 251 closed, a pump (not shown) connected to the nozzle 260 is actuated to feed a high-pressure jet medium (e.g., water) to the nozzle 260. A high-pressure jet is ejected from the nozzle 260. When the jet stabilizes, the shutter 251 is opened. The jet ejected from the nozzle 260 is continuously injected into the porous layer of the bonded substrate stack 50 to start separating the bonded substrate stack 50.

When separation of the bonded substrate stack 50 is ended, the shutter 251 is closed, and the pump connected to the nozzle 260 is stopped to stop jet injection into the bonded substrate stack 50. The operation of the motor 110 is also stopped.

The vacuum chuck mechanism of the substrate holding portion 270 is actuated, and the solenoid valve 1311 of the Bernoulli chuck 1320 is opened to cause the substrate holding portion 270 to chuck the upper separated substrate and the substrate holding portion 1310 to chuck the lower separated substrate. When the solenoid valve 1311 is open, the substrate holding portion 1310 can chuck the substrate because the space under the solenoid valve 1311 has negative pressure due to the Bernoulli chuck 1320.

The air cylinder 320 retracts the piston rod to form a predetermined gap between the substrate holding portions 270 and 1310. The two separated substrates are spaced apart from each other.

The robot hand 400 is inserted between the substrate and the substrate holding portion 270. The robot hand 400 chucks the substrate. After that, vacuum chuck by the substrate holding portion 270 is canceled. The substrate is transferred from the substrate holding portion 270 to the robot hand 400. The robot hand 400 conveys the substrate to a predetermined position (e.g., a cassette).

The robot hand 400 is inserted between the substrate and the substrate holding portion 1310. The robot hand 400 chucks the substrate. After that, the solenoid valve 1311 of the Bernoulli chuck 1320 is closed to cancel chuck of the substrate by the substrate holding portion 1310. The substrate is transferred from the substrate holding portion 1310 to the robot hand 400. The robot hand 400 conveys the substrate to a predetermined position (e.g., a cassette). The two separated substrates may be received by the robot hand in the reverse order or simultaneously received by two robot hands (not shown).

After the bonded substrate stack 50 is separated into two substrates, the jet medium is present between the two substrates. When the jet medium is a liquid (e.g., water), the surface tension is considerably large. Hence, to space the two substrates apart from each other with a small force, a jet is preferably supplied from the nozzle 260 to the gap between the two substrates. In this case, the jet from the nozzle 260 is stopped after the two substrates are spaced apart from each other. Instead, a mechanism for ejecting a jet used to space the two substrates apart from each other may be independently prepared.

11th Embodiment

Figure 13:
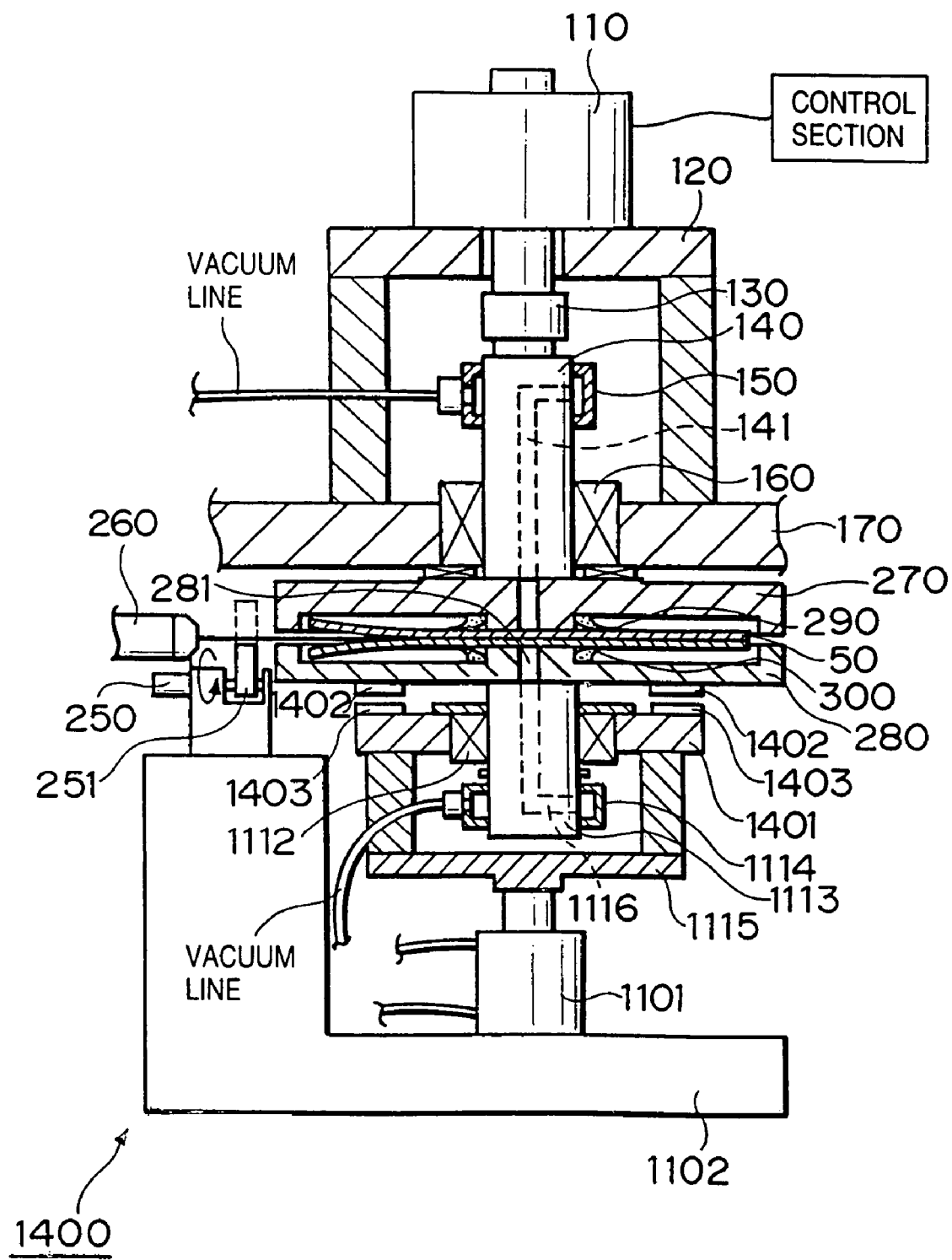
FIG. 13 is a view showing the schematic arrangement of a separating apparatus according to the 11th embodiment of the present invention.

FIG. 13 is a view showing the schematic arrangement of a separating apparatus according to the 11th embodiment of the present invention. The same reference numerals as in other drawings substantially denote the same constituent elements in FIG. 13.

A separating apparatus 1400 has a pair of substrate holding portions 270 and 280. Both the pair of substrate holding portions 270 and 280 are brought into contact with a bonded substrate stack 50 to press and hold the bonded substrate stack 50. As the force for pressing the bonded substrate stack 50, a magnetic force is used.

The lower substrate holding portion 280 is coupled to a rotating shaft 1113. The rotating shaft 1113 is supported by a lower support 1401 via a reciprocal/rotational guide 1112. The substrate holding portion 280 has a suction hole 281 for vacuum-chucking the bonded substrate stack 50. The suction hole 281 is connected to a vacuum line 1116 in the rotating shaft 1113. The vacuum line 1116 is connected to an external vacuum line via a ring 1114. The external vacuum line has a solenoid valve (not shown). The solenoid valve is ON/OFF-controlled by a control section as needed.

A magnet 1402 is attached to the lower substrate holding portion 280. A magnet 1403 is attached to the upper surface of the lower support 1401 at a position opposing the magnet 1402. An upward force acts on the lower substrate holding portion 280 due to the magnetic force acting between the magnets 1402 and 1403. As a consequence, the bonded substrate stack 50 is pressed.

At least one of the magnets 1402 and 1403 may be an electromagnet. In this case, the force for pressing the bonded substrate stack 50 can be easily adjusted. In addition, the press force can be appropriately changed as separation progresses.

Procedures of separation processing by the separating apparatus 1400 will be described below. First, an air cylinder 1101 retracts the piston rod to form an appropriate gap between substrate holding portions 270 and 280. In this state, the bonded substrate stack 50 is horizontally supported by a robot hand 400 from the lower side, inserted to a predetermined position between the substrate holding portions 270 and 280, and placed on the substrate holding portion 280.

The air cylinder 1101 extends the piston rod to move the lower support 1401 upward. Accordingly, the lower substrate holding portion 280 is moved upward by the magnetic force. The substrate holding portion 280 presses and holds the bonded substrate stack 50.

A motor 110 is actuated to transmit the rotational force to a rotating shaft 140. The rotating shaft 140, substrate holding portion 270, bonded substrate stack 50, substrate holding portion 280, and rotating shaft 1113 rotate integrally.

While keeping a shutter 251 closed, a pump (not shown) connected to a nozzle 260 is actuated to feed a high-pressure jet medium (e.g., water) to the nozzle 260. A high-pressure jet is ejected from the nozzle 260. When the jet stabilizes, the shutter 251 is opened. The jet ejected from the nozzle 260 is continuously injected into the porous layer of the bonded substrate stack 50 to start separating the bonded substrate stack 50.

When separation of the bonded substrate stack 50 is ended, the shutter 251 is closed, and the pump connected to the nozzle 260 is stopped to stop jet injection into the bonded substrate stack 50. The operation of the motor 110 is also stopped.

The vacuum chuck mechanisms of the substrate holding portions 270 and 280 are actuated (solenoid valves are opened) to cause the substrate holding portion 270 to vacuum-chuck the upper separated substrate and the substrate holding portion 280 to vacuum-chuck the lower separated substrate.

The air cylinder 1101 retracts the piston rod to form a predetermined gap between the substrate holding portions 270 and 280. The two separated substrates are spaced apart from each other.

The robot hand 400 is inserted between the substrate and the substrate holding portion 270. The robot hand 400 chucks the substrate. After that, chuck by the vacuum chuck mechanism of the substrate holding portion 270 is canceled. The substrate is transferred from the substrate holding portion 270 to the robot hand 400. The robot hand 400 conveys the substrate to a predetermined position (e.g., a cassette).

The robot hand 400 is inserted between the substrate and the substrate holding portion 280. The robot hand 400 chucks the substrate. After that, chuck by the vacuum chuck mechanism of the substrate holding portion 280 is canceled. The substrate is transferred from the substrate holding portion 280 to the robot hand 400. The robot hand 400 conveys the substrate to a predetermined position (e.g., a cassette). The two separated substrates may be received by the robot hand in the reverse order or simultaneously received by two robot hands (not shown).

After the bonded substrate stack 50 is separated into two substrates, the jet medium is present between the two substrates. When the jet medium is a liquid (e.g., water), the surface tension is considerably large. Hence, to space the two substrates apart from each other with a small force, a jet is preferably supplied from the nozzle 260 to the gap between the two substrates. In this case, the jet from the nozzle 260 is stopped after the two substrates are separated. Instead, a mechanism for ejecting a jet used to space the two substrates apart from each other may be independently prepared.

12th Embodiment

Figure 14:
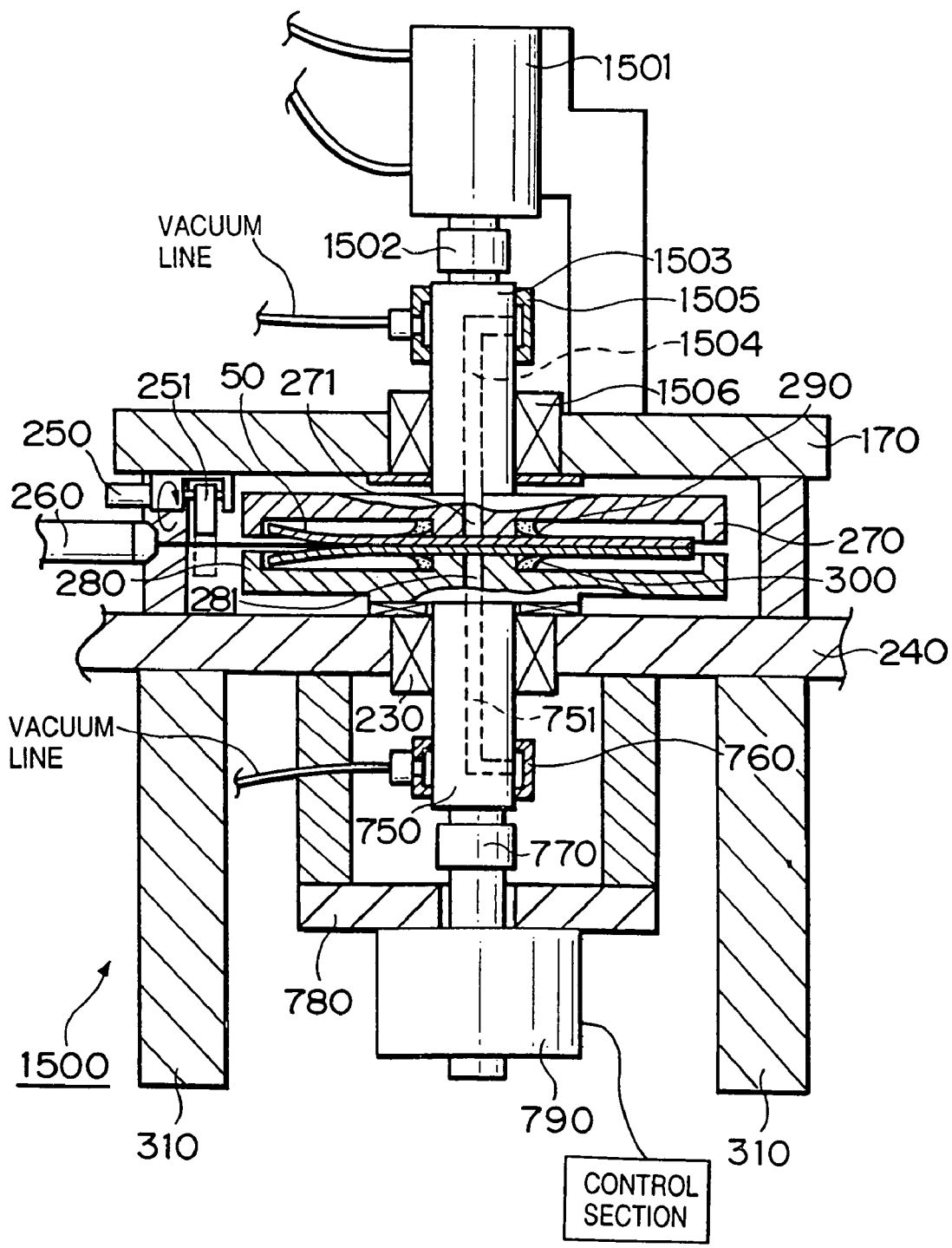
FIG. 14 is a view showing the schematic arrangement of a separating apparatus according to the 12th embodiment of the present invention.

FIG. 14 is a view showing the schematic arrangement of a separating apparatus according to the 12th embodiment of the present invention. The same reference numerals as in other drawings substantially denote the same constituent elements in FIG. 14.

A separating apparatus 1500 has a pair of substrate holding portions 270 and 280. The substrate holding portions 270 and 280 horizontally hold a bonded substrate stack 50 by sandwiching it from the upper and lower sides. A jet is ejected from a nozzle 260 and injected to a portion near the porous layer of the bonded substrate stack 50, thereby separating the bonded substrate stack 50 into two substrates at the porous layer. The separating apparatus 1500 controls the position of the nozzle 260 with reference to the lower substrate holding portion 280.

The upper substrate holding portion 270 is coupled to one end of a rotating shaft 1503. The other end of the rotating shaft 1503 is coupled to the piston rod of an air cylinder 1501 via a coupling 1502. A vacuum line 1504 for vacuum-chucking the bonded substrate stack 50 on the substrate holding portion 270 extends through the rotating shaft 1503. The vacuum line 1504 is connected to an external vacuum line via a ring 1505. The external vacuum line has a solenoid valve (not shown). The solenoid valve is ON/OFF-controlled by the control section as needed. The substrate holding portion 270 has a suction hole 271 for vacuum-chucking the bonded substrate stack 50. The suction hole 271 is connected to the vacuum line 1504. The suction hole 271, vacuum line 1504, and solenoid valve construct the vacuum chuck mechanism of the substrate holding portion 270. The rotating shaft 1503 is supported by an upper table 170 via a reciprocal/rotational guide 1506.

The lower substrate holding portion 280 is coupled to one end of a rotating shaft 750. The other end of the rotating shaft 750 is coupled to the rotating shaft of a motor 790 via a coupling 770. The motor 790 is fixed to a support member 780 fixed to a lower table 240. The motor 790 is controlled by the control section.

A vacuum line 751 for vacuum-chucking the bonded substrate stack 50 on the substrate holding portion 280 extends through the rotating shaft 750. The vacuum line 751 is connected to an external vacuum line via a ring 760. The external vacuum line has a solenoid valve (not shown). The solenoid valve is ON/OFF-controlled by the control section as needed. The substrate holding portion 280 has a suction hole 281 for vacuum-chucking the bonded substrate stack 50. The suction hole 281 is connected to the vacuum line 751. The suction hole 281, vacuum line 751, and solenoid valve construct the vacuum chuck mechanism of the substrate holding portion 280. The rotating shaft 750 is supported by the lower table 240 via a bearing 230.

The nozzle 260 is attached to, e.g., the lower table 240 via a support member (not shown). In the separating apparatus 1500 of the 12th embodiment, the position of the nozzle 260 is controlled with reference to the position of the lower substrate holding portion 280. A shutter 251 driven by a motor 250 is inserted between the nozzle 260 and the substrate holding portions 270 and 280. When the shutter 251 is open, and a jet is ejected from the nozzle 260, the jet can be injected into the bonded substrate stack 50. When the shutter 251 is closed, jet injection into the bonded substrate stack 50 can be stopped.

Procedures of separation processing by the separating apparatus 1500 will be described below. First, the air cylinder 1501 retracts the piston rod to form an appropriate gap between substrate holding portions 270 and 280. In this state, the bonded substrate stack 50 is horizontally supported by a robot hand 400 from the lower side, inserted to a predetermined position between the substrate holding portions 270 and 280, and placed on the substrate holding portion 280.

The air cylinder 1501 extends the piston rod to move the upper substrate holding portion 270 downward. The substrate holding portions 270 and 280 press and hold the bonded substrate stack 50.

The motor 790 is actuated to transmit the rotational force to the rotating shaft 750. The rotating shaft 750, substrate holding portion 280, bonded substrate stack 50, substrate holding portion 270, and rotating shaft 1503 rotate integrally.

While keeping a shutter 251 closed, a pump (not shown) connected to a nozzle 260 is actuated to feed a high-pressure jet medium (e.g., water) to the nozzle 260. A high-pressure jet is ejected from the nozzle 260. When the jet stabilizes, the shutter 251 is opened. The jet ejected from the nozzle 260 is continuously injected into the porous layer of the bonded substrate stack 50 to start separating the bonded substrate stack 50.

When separation of the bonded substrate stack 50 is ended, the shutter 251 is closed, and the pump connected to the nozzle 260 is stopped to stop jet injection into the bonded substrate stack 50. The operation of the motor 790 is also stopped.

The vacuum chuck mechanisms of the substrate holding portions 270 and 280 are actuated (solenoid valves are opened) to cause the substrate holding portion 270 to vacuum-chuck the upper separated substrate and the substrate holding portion 280 to vacuum-chuck the lower separated substrate.

The air cylinder 1501 retracts the piston rod to form a predetermined gap between the substrate holding portions 270 and 280. The two separated substrates are spaced apart from each other.

The robot hand 400 is inserted between the substrate and the substrate holding portion 270. The robot hand 400 chucks the substrate. After that, chuck by the vacuum chuck mechanism of the substrate holding portion 270 is canceled. The substrate is transferred from the substrate holding portion 270 to the robot hand 400. The robot hand 400 conveys the substrate to a predetermined position (e.g., a cassette).

The robot hand 400 is inserted between the substrate and the substrate holding portion 280. The robot hand 400 chucks the substrate. After that, chuck by the vacuum chuck mechanism of the substrate holding portion 280 is canceled. The substrate is transferred from the substrate holding portion 280 to the robot hand 400. The robot hand 400 conveys the substrate to a predetermined position (e.g., a cassette). The two separated substrates may be received by the robot hand in the reverse order or simultaneously received by two robot hands (not shown).

After the bonded substrate stack 50 is separated into two substrates, the jet medium is present between the two substrates. When the jet medium is a liquid (e.g., water), the surface tension is considerably large. Hence, to space the two substrates apart from each other with a small force, a jet is preferably supplied from the nozzle 260 to the gap between the two substrates. In this case, the jet from the nozzle 260 is stopped after the two substrates are spaced apart from each other. Instead, a mechanism for ejecting a jet used to space the two substrates apart from each other may be independently prepared.

13th Embodiment

Figure 15:
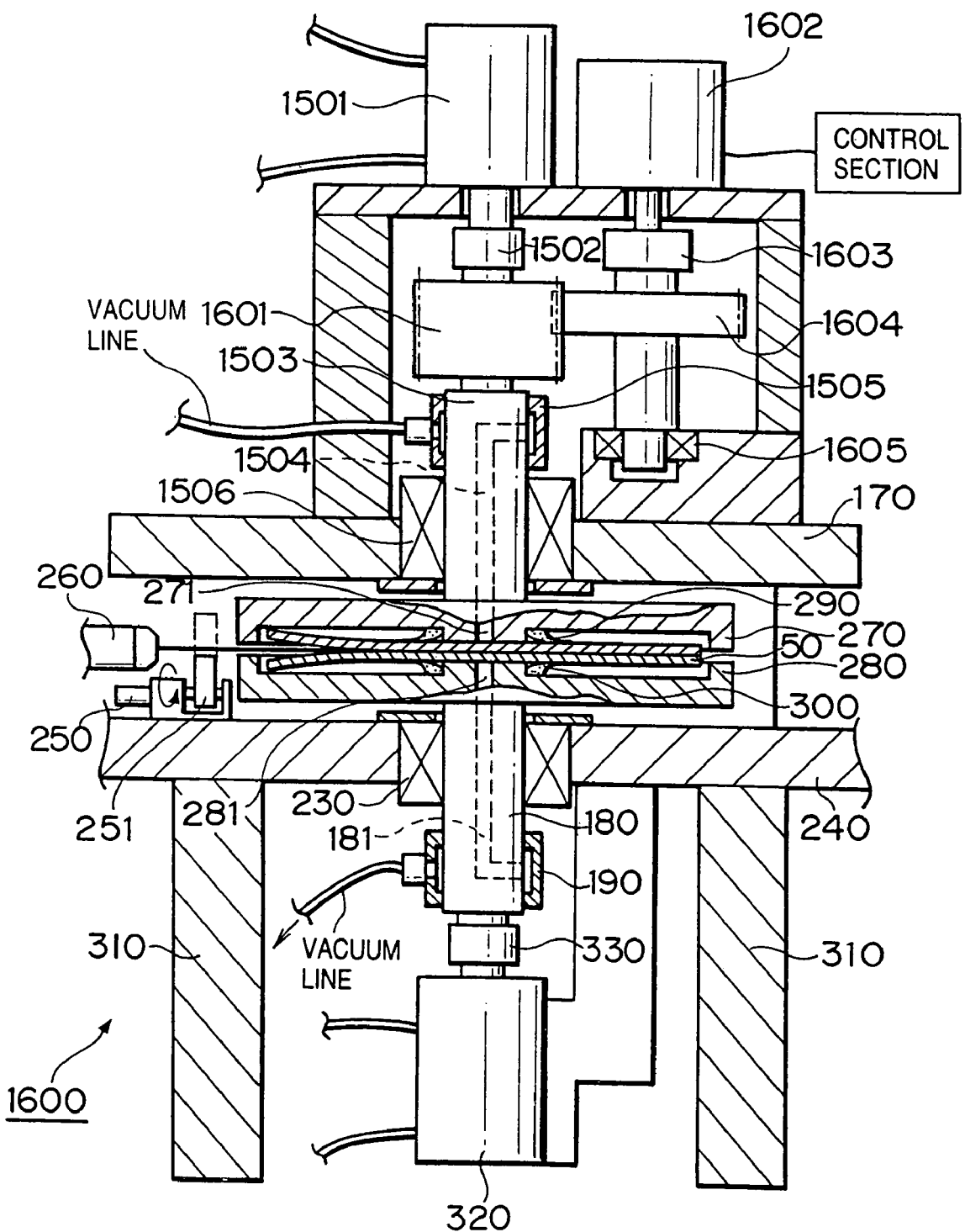
FIG. 15 is a view showing the schematic arrangement of a separating apparatus according to the 13th embodiment of the present invention.
Figure 16:
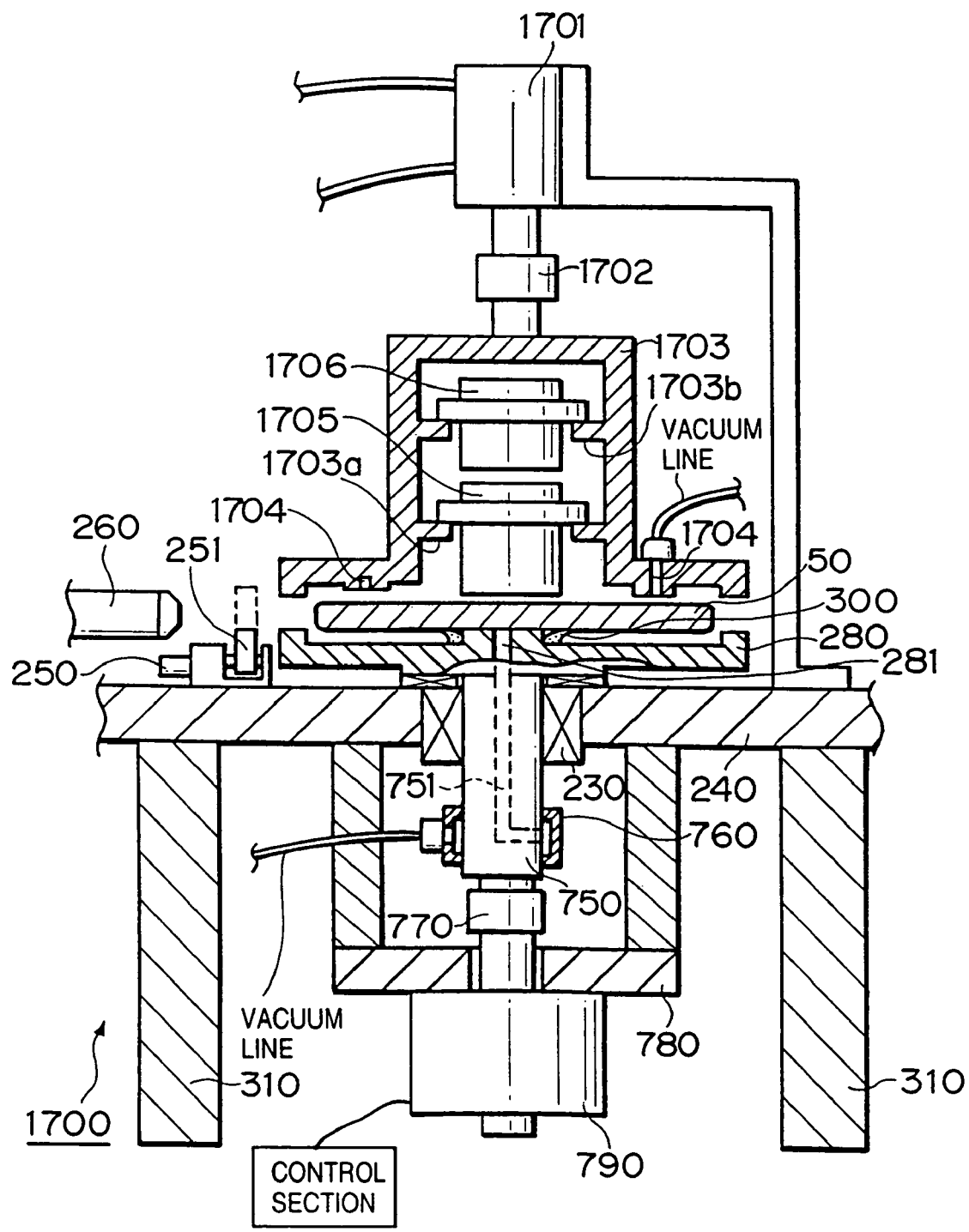
FIG. 16 is a view showing the schematic arrangement of a separating apparatus according to the 14th embodiment of the present invention.

FIG. 15 is a view showing the schematic arrangement of a separating apparatus according to the 13th embodiment of the present invention. The same reference numerals as in other drawings substantially denote the same constituent elements in FIG. 15.

A separating apparatus 1600 has a pair of substrate holding portions 270 and 280. A press force is applied to both of the pair of substrate holding portions 270 and 280 such that a bonded substrate stack is pressed and held from both sides.

The upper substrate holding portion 270 is coupled to one end of a rotating shaft 1503. The other end of the rotating shaft 1503 is coupled to a gear 1601. The gear 1601 is coupled to the piston rod of an air cylinder 1501 via a coupling 1502. A vacuum line 1504 for vacuum-chucking a bonded substrate stack 50 on the substrate holding portion 270 extends through the rotating shaft 1503. The vacuum line 1504 is connected to an external vacuum line via a ring 1505. The external vacuum line has a solenoid valve (not shown). The solenoid valve is ON/OFF-controlled by the control section as needed. The substrate holding portion 270 has a suction hole 271 for vacuum-chucking the bonded substrate stack 50. The suction hole 271 is connected to the vacuum line 1504. The suction hole 271, vacuum line 1504, and solenoid valve construct the vacuum chuck mechanism of the substrate holding portion 270. The rotating shaft 1503 is supported by an upper table 170 via a reciprocal/rotational guide 1506.

The gear 1601 engages with a gear 1604 axially supported by a bearing 1605. The gear 1604 is coupled to a motor 1602 via a coupling 1603. The motor 1602 is controlled by the control section. The rotational force generated by the motor 1602 is transmitted to the rotating shaft 1503 via the gears 1604 and 1601 to rotate the substrate holding portion 270.

The lower substrate holding portion 280 is coupled to one end of a rotating shaft 180. The other end of the rotating shaft 180 is coupled to the piston rod of an air cylinder 320 via a coupling 330. A vacuum line 181 for vacuum-chucking the bonded substrate stack 50 on the substrate holding portion 280 extends through the rotating shaft 180. The vacuum line 181 is connected to an external vacuum line via a ring 190. The external vacuum line has a solenoid valve (not shown). The solenoid valve is ON/OFF-controlled by the control section as needed. The substrate holding portion 280 has a suction hole 281 for vacuum-chucking the bonded substrate stack 50. The suction hole 281 is connected to the vacuum line 181. The suction hole 281, vacuum line 181, and solenoid valve construct the vacuum chuck mechanism of the substrate holding portion 280. The rotating shaft 140 is supported by a lower table 240 via a reciprocal/rotational guide 230.

Procedures of separation processing by the separating apparatus 1600 will be described below. First, the air cylinder 1501 and/or air cylinder 320 retracts the piston rod to form an appropriate gap between substrate holding portions 270 and 280. In this state, the bonded substrate stack 50 is horizontally supported by a robot hand 400 from the lower side and inserted to a predetermined position between the substrate holding portions 270 and 280.

The air cylinder 1501 and/or air cylinder 320 extends the piston rod. The substrate holding portions 270 and 280 press and hold the bonded substrate stack 50 from both sides.

The motor 1602 is actuated to transmit the rotational force to the rotating shaft 1503. The rotating shaft 1503, substrate holding portion 270, bonded substrate stack 50, substrate holding portion 280, and rotating shaft 180 rotate integrally.

While keeping a shutter 251 closed, a pump (not shown) connected to a nozzle 260 is actuated to feed a high-pressure jet medium (e.g., water) to the nozzle 260. A high-pressure jet is ejected from the nozzle 260. When the jet stabilizes, the shutter 251 is opened. The jet ejected from the nozzle 260 is continuously injected into the porous layer of the bonded substrate stack 50 to start separating the bonded substrate stack 50.

When separation of the bonded substrate stack 50 is ended, the shutter 251 is closed, and the pump connected to the nozzle 260 is stopped to stop jet injection into the bonded substrate stack 50. The operation of the motor 110 is also stopped.

The vacuum chuck mechanisms of the substrate holding portions 270 and 280 are actuated (solenoid valves are opened) to cause the substrate holding portion 270 to vacuum-chuck the upper separated substrate and the substrate holding portion 280 to vacuum-chuck the lower separated substrate.

The air cylinder 1501 and/or air cylinder 320 retracts the piston rod to form a predetermined gap between the substrate holding portions 270 and 280. The two separated substrates are spaced apart from each other.

The robot hand 400 is inserted between the substrate and the substrate holding portion 270. The robot hand 400 chucks the substrate. After that, chuck by the vacuum chuck mechanism of the substrate holding portion 270 is canceled. The substrate is transferred from the substrate holding portion 270 to the robot hand 400. The robot hand 400 conveys the substrate to a predetermined position (e.g., a cassette).

The robot hand 400 is inserted between the substrate and the substrate holding portion 280. The robot hand 400 chucks the substrate. After that, chuck by the vacuum chuck mechanism of the substrate holding portion 280 is canceled. The substrate is transferred from the substrate holding portion 280 to the robot hand 400. The robot hand 400 conveys the substrate to a predetermined position (e.g., a cassette). The two separated substrates may be received by the robot hand in the reverse order or simultaneously received by two robot hands (not shown).

After the bonded substrate stack 50 is separated into two substrates, the jet medium is present between the two substrates. When the jet medium is a liquid (e.g., water), the surface tension is considerably large. Hence, to space the two substrates apart from each other with a small force, a jet is preferably supplied from the nozzle 260 to the gap between the two substrates. In this case, the jet from the nozzle 260 is stopped after the two substrates are spaced apart from each other. Instead, a mechanism for ejecting a jet used to space the two substrates apart from each other may be independently prepared.

14th Embodiment

FIGS. 16 to 19 are views showing the schematic arrangement of a separating apparatus according to the 14th embodiment of the present invention. The same reference numerals as in other drawings substantially denote the same constituent elements in FIGS. 16 to 19.

A separating apparatus 1700 places a weight on a bonded substrate stack 50 to press the bonded substrate stack 50 from the upper side, and in this state, separates the bonded substrate stack 50. In this embodiment, two weights 1705 and 1706 are used, and the press force to be applied to the bonded substrate stack 50 is switched as separation progresses. It is also effective to use three or more weights and switch stepwise the press force to be applied to the bonded substrate stack 50 as separation progresses. Alternatively, only one weight may be used such that a predetermined press force is applied to the bonded substrate stack 50 during separation processing.

The separating apparatus 1700 has an operation section 1703. Application of a press force to the bonded substrate stack 50 is controlled by vertically moving the operation section 1703. The operation section 1703 has a first hanger portion 1703a for supporting the first weight 1705 in a suspended state, and a second hanger portion 1703b for supporting the second weight 1706 in the suspended state.

The operation section 1703 is coupled to the piston rod of an air cylinder 1701 via a coupling 1702 and vertically moved by the air cylinder 1701. When the operation section 1703 is moved downward to the first step, the total gravity acting on the first weight 1705 is applied to the bonded substrate stack 50. When the operation section 1703 is moved downward to the second step, the total gravity acting on the second weight 1706 is applied to the first weight 1705. At this time, the total gravity acting on the first weight 1705 and second weight 1706 is applied to the bonded substrate stack 50. With this arrangement, the press force to be applied to the bonded substrate stack 50 can be controlled in two steps. When the numbers of weights and hanger portions are increased, the press force to be applied to the bonded substrate stack 50 can be controlled in more steps.

The operation section 1703 has, at its lower end, a suction hole 1704 for vacuum-chucking the bonded substrate stack 50. The suction hole 1704 is connected to an external vacuum line. The external vacuum line has a solenoid valve (not shown). The solenoid valve is ON/OFF-controlled by the control section as needed.

A lower substrate holding portion 280 is coupled to one end of a rotating shaft 750. The other end of the rotating shaft 750 is coupled to a motor 790 via a coupling 770. The rotating shaft 750 is supported by a lower table 240 via a bearing 230. The motor 790 is fixed to a support member 780 fixed to the lower table 240.

A vacuum line 751 connected to a suction hole 281 of the substrate holding portion 280 extends through the rotating shaft 750. The vacuum line 751 is connected to an external vacuum line via a ring 760. The external vacuum line has a solenoid valve (not shown). The solenoid valve is ON/OFF-controlled by the control section as needed.

Figure 18:
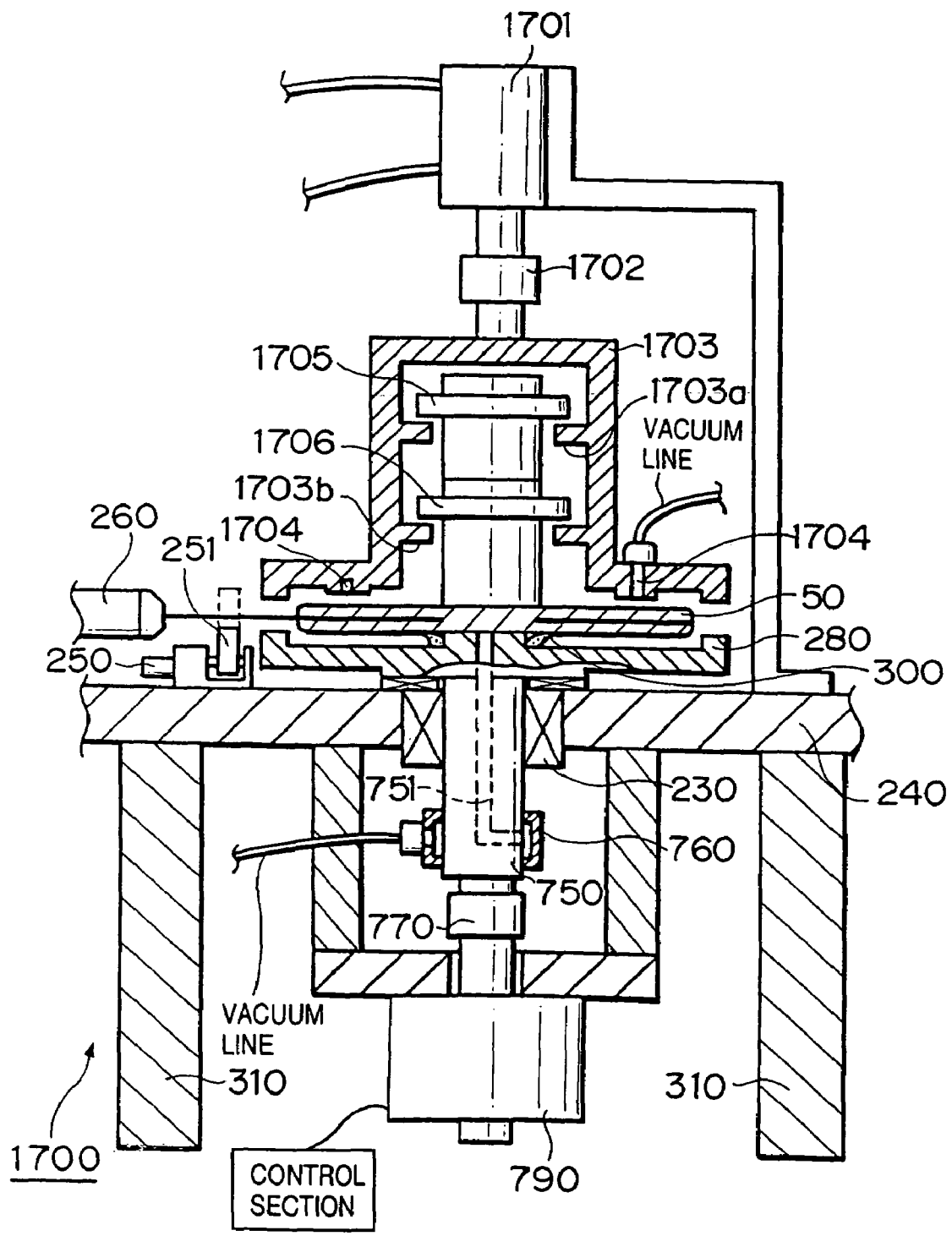
FIG. 18 is a view showing the schematic arrangement of the separating apparatus according to the 14th embodiment of the present invention.
Figure 19:
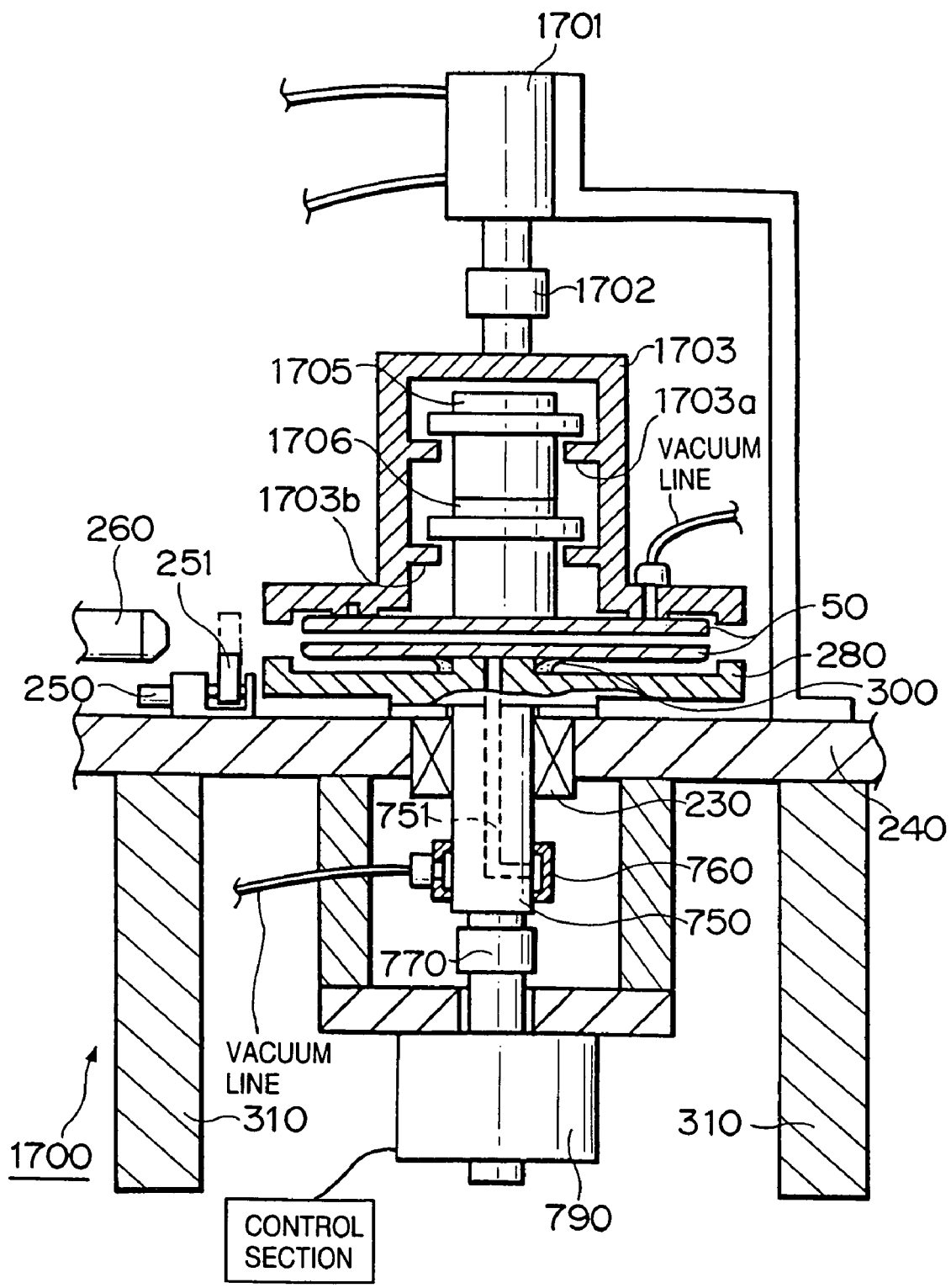
FIG. 19 is a view showing the schematic arrangement of the separating apparatus according to the 14th embodiment of the present invention.
Figure 20:
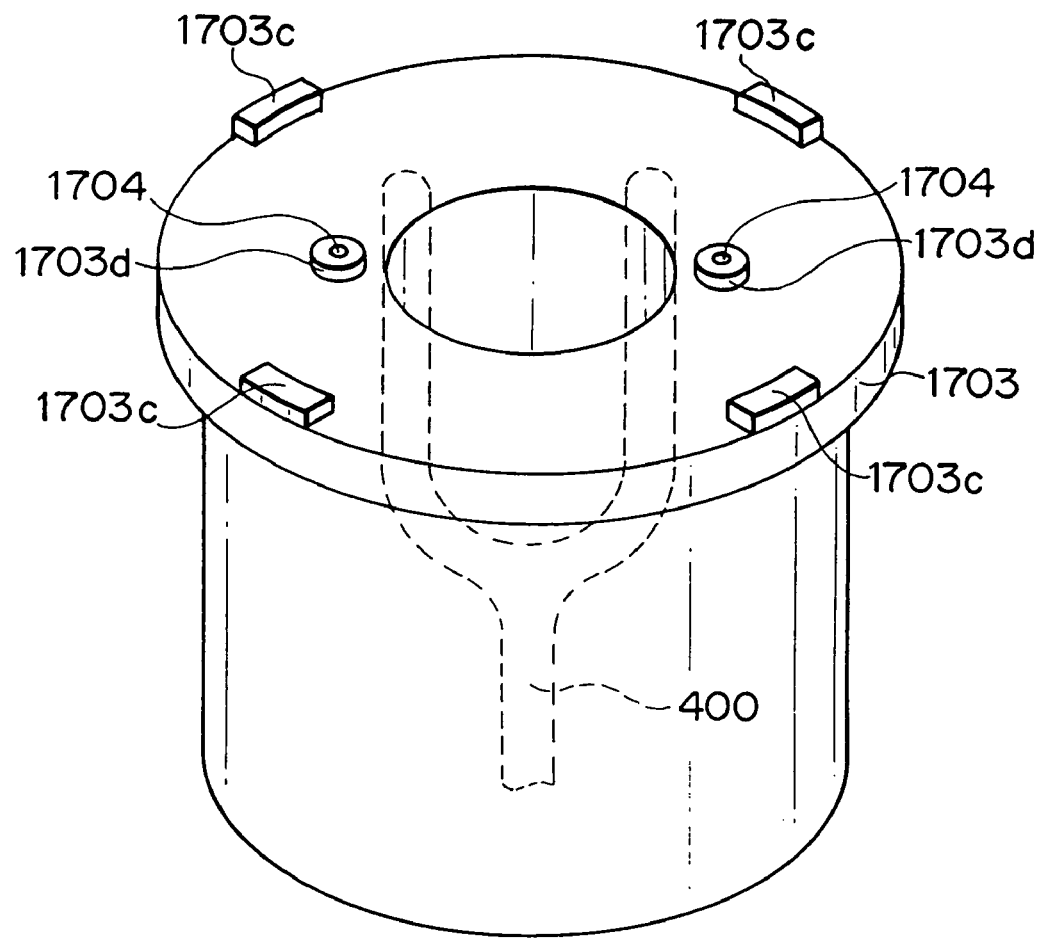
FIG. 20 is a perspective view showing the schematic arrangement of an operation section shown in FIGS. 16 to 19.

FIG. 20 is a perspective view showing the schematic arrangement of the operation section 1703 shown in FIGS. 16 to 19. The operation section 1703 has, at its outer peripheral portion, a plurality of guide members 1703c for preventing a bonded substrate stack from causing a positional shift or projecting from the operation section 1703 and substrate holding portion 280 during separation.

To make it possible for a robot hand 400 of a conveyor robot to chuck the back side surface of the upper separated substrate and receive the substrate from the operation section 1703, the plurality of guide members 1703c are preferably arranged at an appropriate interval such that the robot hand 400 can enter/leave.

The operation section 1703 also has convex support portions 1703d such that the robot hand 400 can be inserted between the substrate and the lower end of the operation section 1703 while chucking the substrate.

Procedures of separation processing by the separating apparatus 1700 will be described below sequentially with reference to FIGS. 16 to 19. First, the air cylinder 1701 retracts the piston rod to form an appropriate gap between the substrate holding portion 280 and the lower end of the operation section 1703. The bonded substrate stack 50 is horizontally supported by the robot hand 400 from the lower side, inserted to a predetermined position between the substrate holding portion 280 and the lower end of the operation section 1703, and placed on the substrate holding portion 280.

Figure 17:
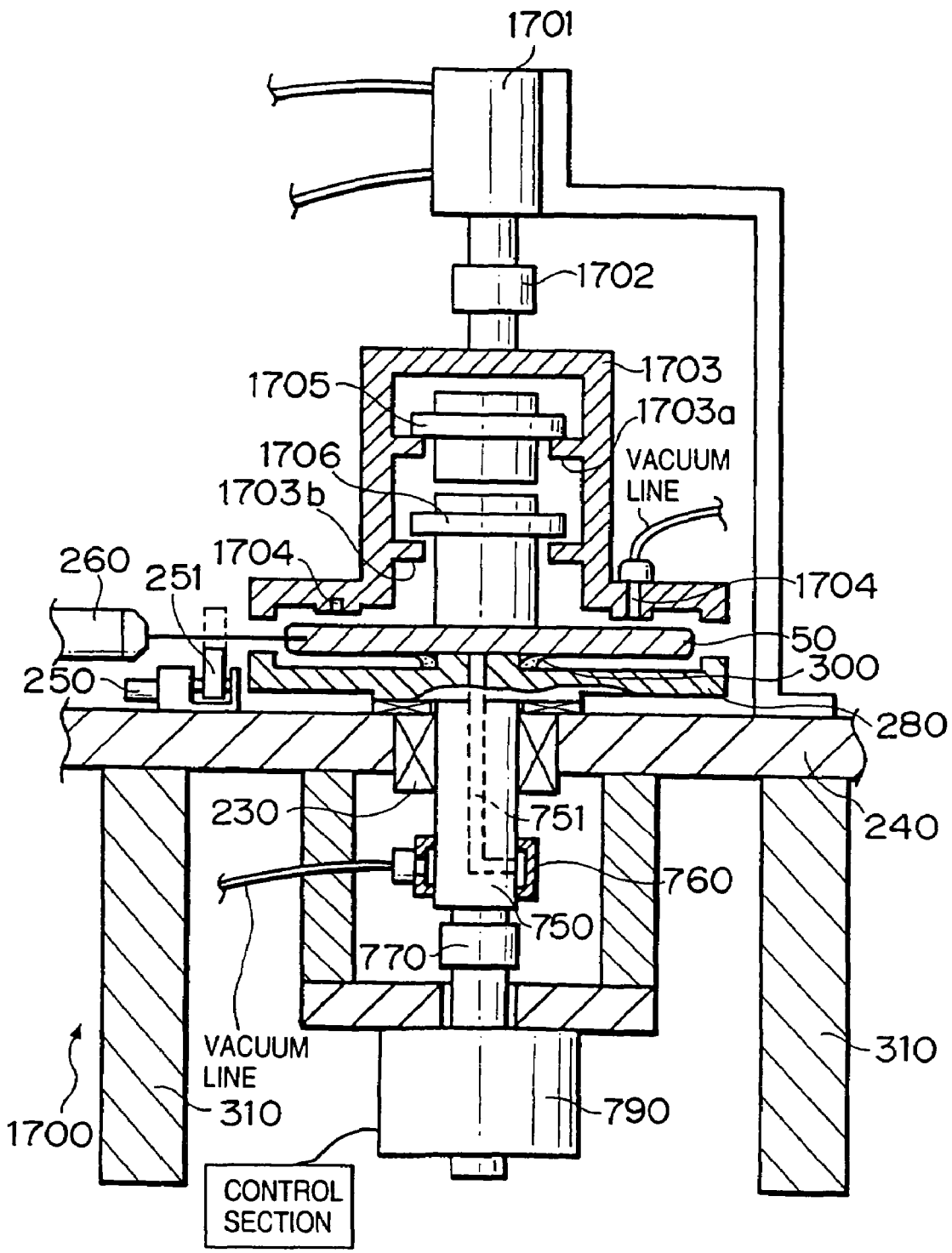
FIG. 17 is a view showing the schematic arrangement of the separating apparatus according to the 14th embodiment of the present invention.

As shown in FIG. 17, the air cylinder 1701 extends the piston rod to move the operation section 1703 downward to the first step, thereby applying the total gravity acting on the first weight 1705 to the bonded substrate stack 50.

While keeping a shutter 251 closed, a pump (not shown) connected to a nozzle 260 is actuated to feed a high-pressure jet medium (e.g., water) to the nozzle 260. A high-pressure jet is ejected from the nozzle 260. When the jet stabilizes, the shutter 251 is opened. The jet ejected from the nozzle 260 is continuously injected into the porous layer of the bonded substrate stack 50 to start separating the bonded substrate stack 50 (first step of separation).

When separation of the outer peripheral portion (portion around the central portion) of the bonded substrate stack 50 is ended, the air cylinder 1701 further extends the piston rod to move the operation section 1703 to the second step, as shown in FIG. 18, while continuing separation. The total gravity acting on the first weight 1705 and second weight 1706 is applied to the bonded substrate stack 50 (second step of separation). The bonded substrate stack 50 is pressed by a force larger than that in the first step of separation. The first weight 1705 preferably weighs, e.g., about 100 g, and the second weight 1706 preferably weighs, e.g., about 150 g.

In this embodiment in which the bonded substrate stack 50 is separated while rotating it, at the step (first step of separation) of separating the outer peripheral portion of the bonded substrate stack 50, the bonded substrate stack 50 is pressed by a relatively small force. At the step (second step of separation) of separating the central portion of the bonded substrate stack 50, the bonded substrate stack 50 is pressed by a relatively large force. The reason for this is as follows.

When the outer peripheral portion of the bonded substrate stack 50 is to be separated (first step), the area of the separated portion is small, and the jet medium injected into the bonded substrate stack 50 is efficiently discharged. For this reason, the force (separation force) acting to space the already separated portions apart from each other is relatively small. On the other hand, when the central portion of the bonded substrate stack 50 is to be separated (second step), the area of the separated portion is large, and the jet medium injected into the bonded substrate stack 50 is hardly discharged. Hence, the press force required to stably hold the bonded substrate stack 50 is larger in the second step than in the first step. At the final stage of the second step, i.e., final stage of separation, defects may be generated because the unseparated portion is separated at once. Hence, separation preferably progresses moderately at the final stage of separation.

In separating the bonded substrate stack 50 without rotating it, when the outer peripheral portion of the bonded substrate stack 50 is to be separated (first step of separation), the bonded substrate stack is preferably pressed by a relatively large force. When the central portion of the bonded substrate stack 50 is to be separated (second step of separation), the bonded substrate stack is preferably pressed by a relatively small force.

When separation of the bonded substrate stack 50 is ended, the shutter 251 is closed, and the pump connected to the nozzle 260 is stopped to stop jet injection into the bonded substrate stack 50. When the motor 110 is being actuated, the operation of the motor 110 is also stopped.

The vacuum chuck mechanisms of the operation section 1703 and substrate holding portion 280 are actuated to cause the operation section 1703 to chuck the upper separated substrate and the substrate holding portion 280 to chuck the lower separated substrate.

As shown in FIG. 19, the air cylinder 1701 retracts the piston rod to form an appropriate gap between the substrate holding portion 280 and the lower end of the operation section 1703. The two separated substrates are spaced apart from each other.

The robot hand 400 is inserted between the substrate and the lower end of the operation section 1703. The robot hand 400 chucks the substrate. After that, chuck by the vacuum chuck mechanism of the operation section 1703 is canceled. The substrate is transferred from the operation section 1703 to the robot hand 400. The robot hand 400 conveys the substrate to a predetermined position (e.g., a cassette).

The robot hand 400 is inserted between the substrate and the substrate holding portion 280. The robot hand 400 chucks the substrate. After that, chuck by the vacuum chuck mechanism of the substrate holding portion 280 is canceled. The substrate is transferred from the substrate holding portion 280 to the robot hand 400. The robot hand 400 conveys the substrate to a predetermined position (e.g., a cassette). The two separated substrates may be received by the robot hand in the reverse order or simultaneously received by two robot hands (not shown).

After the bonded substrate stack 50 is separated into two substrates, the jet medium is present between the two substrates. When the jet medium is a liquid (e.g., water), the surface tension is considerably large. Hence, to space the two substrates apart from each other with a small force, a jet is preferably supplied from the nozzle 260 to the gap between the two substrates. In this case, the jet from the nozzle 260 is stopped after the two substrates are spaced apart from each other. Instead, a mechanism for ejecting a jet used to space the two substrates may be independently prepared.

15th Embodiment

Figure 21:
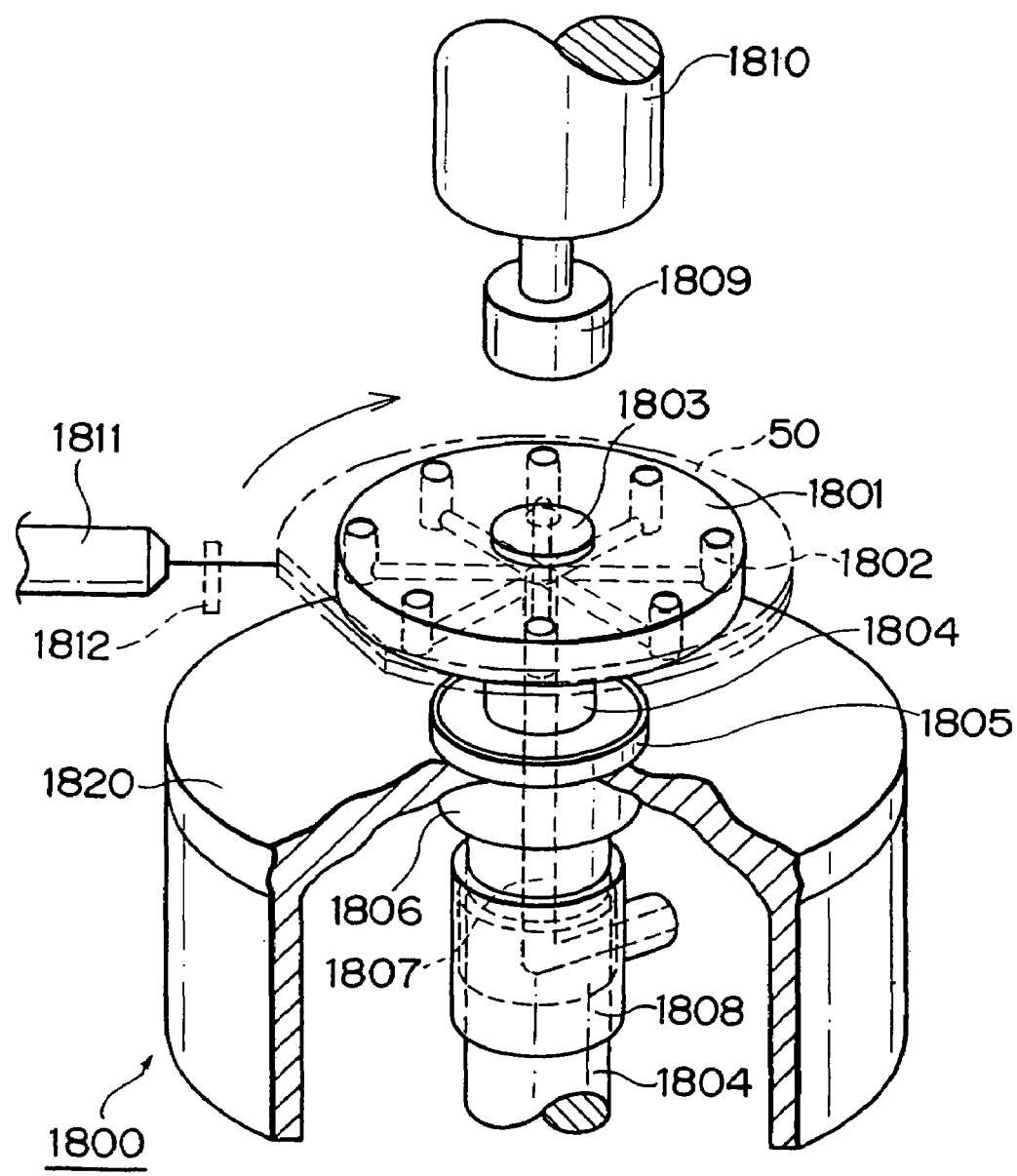
FIG. 21 is a view showing the schematic arrangement of a separating apparatus according to the 15th embodiment of the present invention.

FIG. 21 is a view showing the schematic arrangement of a separating apparatus according to the 15th embodiment of the present invention. A separating apparatus 1800 has a first substrate holding portion 1801 having, at its outer peripheral portion, a plurality of suction holes 1802 for chucking a bonded substrate stack, and a second substrate holding portion 1809 opposing the first substrate holding portion 1801.

The lower substrate holding portion 1801 has a convex support portion 1803 for forming a gap between a bonded substrate stack 50 and the surface of the substrate holding portion 1801 to receive a robot hand 400. To effectively chuck the bonded substrate stack 50 on the substrate holding portion 1801 even at the initial stage of separation, the convex support portion 1803 preferably has a suction hole.

The support portion 1803 is preferably located, e.g., near the central portion of the surface of the substrate holding portion 1801. When the support portion 1803 is formed, the robot hand 400 can horizontally support the bonded substrate stack 50 from the lower side and transfer it to the substrate holding portion 1801. In addition, when the support portion 1803 is formed, after separation is ended, the robot hand 400 can be inserted between the lower substrate and the substrate holding portion 1801. The robot hand 400 can support the substrate from the lower side and receive it. Hence, the risk of dropping the substrate can be minimized.

The substrate holding portion 1801 is coupled to one end of a rotating shaft 1804. The rotating shaft 1804 is supported by a support table 1820 via a bearing 1806. The bearing 1806 has, at its upper portion, a sealing member 1805 for sealing the opening portion formed in the support table 1820 to pass the rotating shaft 1804. A vacuum line 1807 extends through the rotating shaft 1804. The vacuum line 1807 is connected to the plurality of suction holes 1802 of the substrate holding portion 1801. The vacuum line 1807 is also connected to an external vacuum line via a ring 1808. The rotating shaft 1804 is coupled to a rotation source (not shown) to be rotated by a rotational force applied from the rotation source.

The substrate holding portion 1809 is located above the substrate holding portion 1801. The substrate holding portion 1809 is driven by a driving mechanism 1810 to vertically move and also rotatably axially supported by the driving mechanism 1810. The substrate holding portion 1809 preferably has a chuck mechanism for chucking the bonded substrate stack 50 or separated substrate.

A nozzle 1811 is attached to, e.g., the support table 1820 via a support member (not shown). In the separating apparatus 1800, the position of the nozzle 1811 is controlled with reference to the position of the substrate holding portion 1801. A shutter 1812 is inserted between the nozzle 1811 and the substrate holding portion 1801. When the shutter 1812 is open, and a jet is ejected from the nozzle 1811, the jet can be injected into the bonded substrate stack 50. When the shutter 1812 is closed, jet injection into the bonded substrate stack 50 can be stopped.

Procedures of separation processing by the separating apparatus 1800 will be described below. First, the driving mechanism 1810 moves the substrate holding portion 1809 upward to form an appropriate gap between the substrate holding portions 1809 and 1801. In this state, the bonded substrate stack 50 is horizontally supported by the robot hand 400 from the lower side and placed on the support portion 1803 of the substrate holding portion 1801. The driving mechanism 1810 moves the substrate holding portion 1809 downward to cause it to press the bonded substrate stack 50. The bonded substrate stack 50 is pressed and held by the substrate holding portions 1809 and 1801 from both sides.

The pressure in the suction holes 1802 of the substrate holding portion 1801 is reduced via the vacuum line 1807 to cause the substrate holding portion 1801 to chuck the bonded substrate stack 50. The chuck mechanism of the substrate holding portion 1809 may be actuated at this time.

The rotation source (not shown) is actuated to transmit the rotational force to the rotating shaft 1804. The rotating shaft 1804, substrate holding portion 1801, bonded substrate stack 50, and substrate holding portion 1809 rotate integrally.

While keeping the shutter 1812 closed, a pump (not shown) connected to the nozzle 1811 is actuated to feed a high-pressure jet medium (e.g., water) to the nozzle 1811. A high-pressure jet is ejected from the nozzle 1811. When the jet stabilizes, the shutter 1812 is opened. The jet ejected from the nozzle 1811 is continuously injected into the porous layer of the bonded substrate stack 50 to start separating the bonded substrate stack 50.

When the outer peripheral portion of the bonded substrate stack 50 is separated, the separated portions warp and are spaced apart from each other. The separated portion is chucked by the substrate holding portion 1801. When the entire outer peripheral portion of the bonded substrate stack 50 is separated, the lower substrate of the bonded substrate stack 50 is chucked by the substrate holding portion 1801 in a shade form. In this state, since the force for holding the bonded substrate stack 50 is sufficient, holding by the substrate holding portion 1809 can be canceled by moving the substrate holding portion 1809 upward.

When separation of the bonded substrate stack 50 is ended, the shutter 1812 is closed, and the pump connected to the nozzle 1811 is stopped to stop jet injection into the bonded substrate stack 50. Rotation of the bonded substrate stack 50 is stopped by stopping driving the rotating shaft 1804.

In a state wherein the chuck mechanisms of the substrate holding portions 1809 and 1801 are actuated, i.e., the substrate holding portion 1809 is caused to chuck the upper separated substrate, and the substrate holding portion 1801 is caused to chuck the lower separated substrate, the substrate holding portion 1809 is moved upward by the driving mechanism 1810. The two separated substrates are spaced apart from each other.

The robot hand 400 receives the substrate held by the substrate holding portion 1809 and conveys the substrate to a predetermined position (e.g., a cassette).

Chuck of the substrate by the vacuum chuck mechanism of the substrate holding portion 1801 is canceled. The robot hand 400 is inserted between the substrate and the substrate holding portion 1801. The substrate is transferred from the substrate holding portion 1801 to the robot hand 400. The robot hand 400 conveys the substrate to a predetermined position (e.g., a cassette). The two separated substrates may be received by the robot hand in the reverse order or simultaneously received by two robot hands (not shown).

After the bonded substrate stack 50 is separated into two substrates, the jet medium is present between the two substrates. When the jet medium is a liquid (e.g., water), the surface tension is considerably large. Hence, to separate the two substrates with a small force, a jet is preferably supplied from the nozzle 1811 to the gap between the two substrates. In this case, the jet from the nozzle 1811 is stopped after the two substrates are separated. Instead, a mechanism for ejecting a jet used to separate the two substrates may be independently prepared.

16th Embodiment

Figure 22:
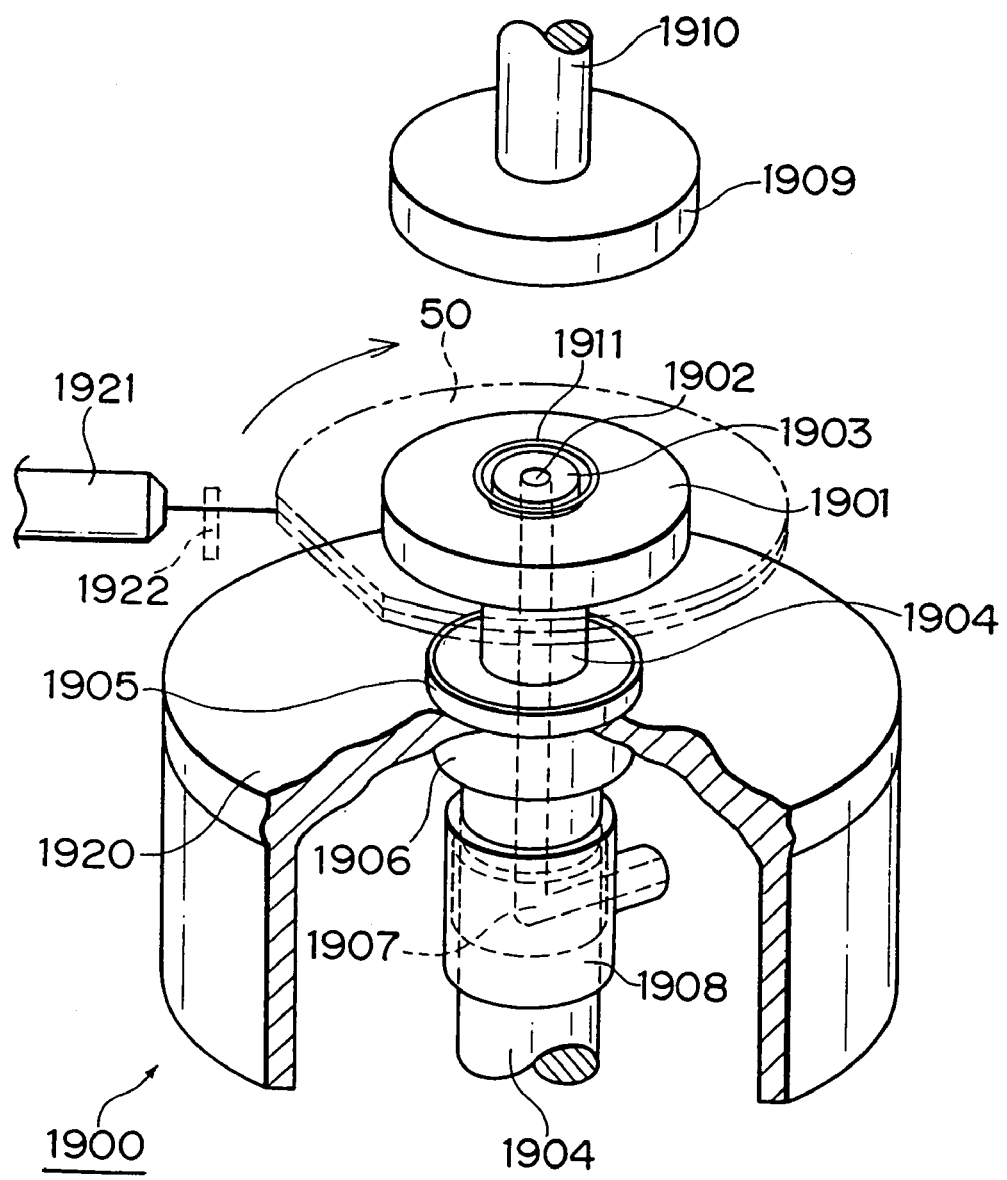
FIG. 22 is a view showing the schematic arrangement of a separating apparatus according to the 16th embodiment of the present invention.
Figure 23:
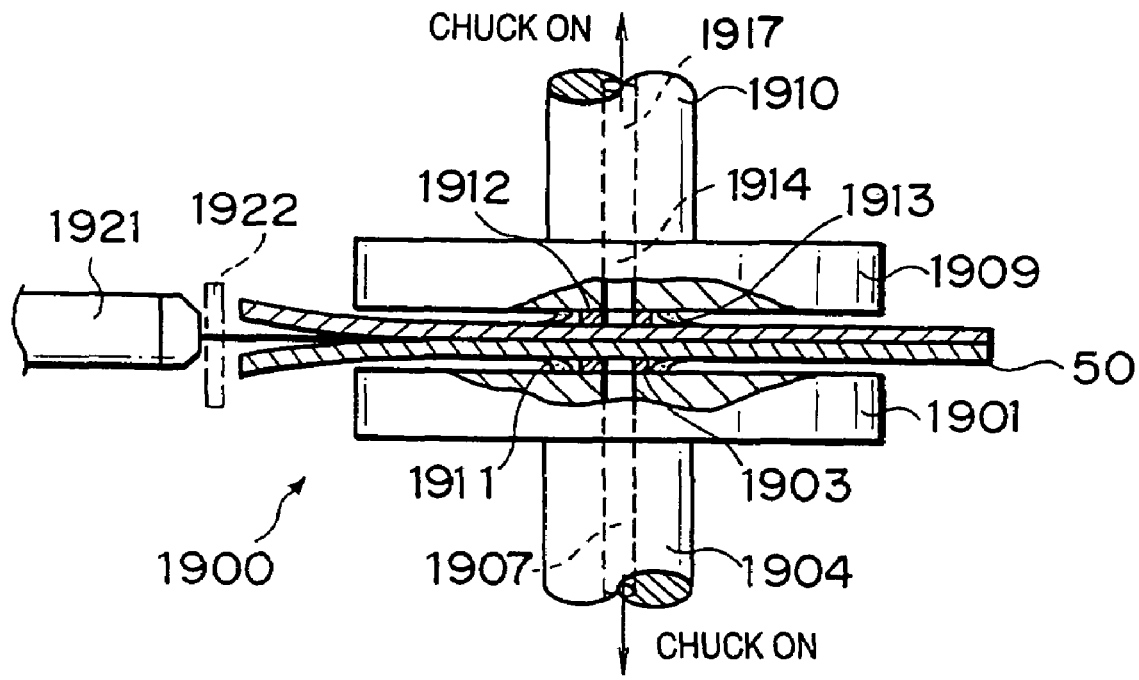
FIG. 23 is a view showing the schematic arrangement of the separating apparatus according to the 16th embodiment of the present invention.
Figure 24:
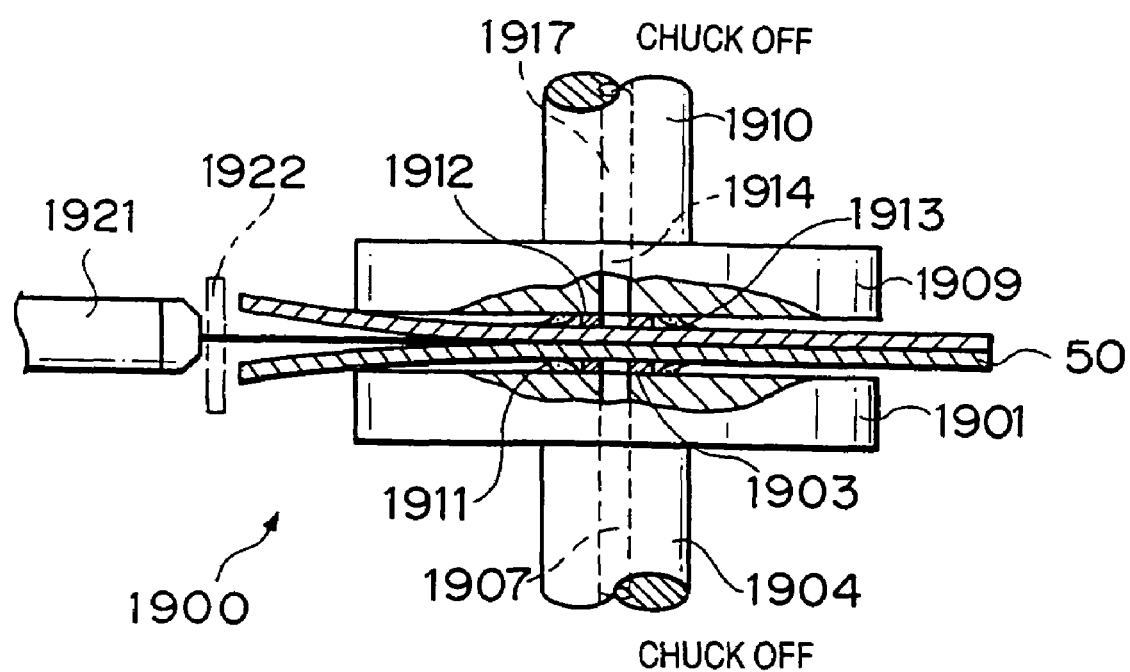
FIG. 24 is a view showing the schematic arrangement of the separating apparatus according to the 16th embodiment of the present invention.

FIGS. 22 to 24 are views showing the schematic arrangement of a separating apparatus according to the 16th embodiment of the present invention. A separating apparatus 1900 has a pair of substrate holding portions 1909 and 1901. The substrate holding portions 1909 and 1901 horizontally hold a bonded substrate stack 50 by sandwiching it from the upper and lower sides. A jet is ejected from a nozzle 1921 and injected to a portion near the porous layer of the bonded substrate stack 50, thereby separating the bonded substrate stack 50 into two substrates at the porous layer.

In the separating apparatus 1900, when the outer peripheral portion (portion around the central portion) of the bonded substrate stack 50 is to be separated, the bonded substrate stack 50 is preferably chucked by the substrate holding portions 1909 and 1901. When the central portion is to be separated, chuck of the bonded substrate stack 50 is preferably canceled. This effectively prevents any defects in separation. However, this embodiment does not negate the embodiments that have been described above. In the above-described embodiments as well, samples such as bonded substrate stacks can be separated at a high yield. The 16th embodiment intends to prevent any defects in separating the bonded substrate stack 50 under a specific condition using substrate holding portions having specific shapes and dimensions.

The lower substrate holding portion 1901 has a convex support portion 1903 for forming a gap between the bonded substrate stack 50 and the surface of the substrate holding portion 1901 to receive a robot hand 400. The support portion 1903 has a suction hole 1902 for vacuum-chucking the bonded substrate stack 50. The substrate holding portion 1901 has a shift prevention member 1911 around the support portion 1903. The shift prevention member 1911 formed from, e.g., rubber or a resin prevents the bonded substrate stack 50 from moving in the planar direction. With the shift prevention member 1911, the bonded substrate stack 50 can be held by a small press force or suction force.

The substrate holding portion 1901 is coupled to one end of a rotating shaft 1904. The rotating shaft 1904 is supported by a support table 1920 via a bearing 1906. The bearing 1906 has, at its upper portion, a sealing member 1905 for sealing the opening portion formed in the support table 1920 to pass the rotating shaft 1904. A vacuum line 1907 extends through the rotating shaft 1904. The vacuum line 1907 is connected to the suction hole 1902 of the substrate holding portion 1901. The vacuum line 1907 is also connected to an external vacuum line via a ring 1908. The rotating shaft 1904 is coupled to a rotation source (not shown) to be rotated by a rotational force applied from the rotation source.

The substrate holding portion 1909 is located above the substrate holding portion 1901. The substrate holding portion 1909 is driven by a driving mechanism 1910 to vertically move and also rotatably axially supported by the driving mechanism 1910.

The upper substrate holding portion 1909 has a convex support portion 1912 for forming a gap between the bonded substrate stack 50 and the surface of the substrate holding portion 1901 to receive the robot hand 400. The support portion 1912 has a suction hole 1914 for vacuum-chucking the bonded substrate stack 50. The substrate holding portion 1909 has a shift prevention member 1913 around the support portion 1912. The shift prevention member 1913 formed from, e.g., rubber or a resin prevents the bonded substrate stack 50 from moving in the planar direction. With the shift prevention member 1913, the bonded substrate stack 50 can be held by a small press force or suction force.

The nozzle 1921 is attached to, e.g., the support table 1920 via a support member (not shown). In the separating apparatus 1900, the position of the nozzle 1921 is controlled with reference to the position of the substrate holding portion 1901. A shutter 1922 is inserted between the nozzle 1921 and the substrate holding portion 1901. When the shutter 1922 is open, and a jet is ejected from the nozzle 1921, the jet can be injected into the bonded substrate stack 50. When the shutter 1922 is closed, jet injection into the bonded substrate stack 50 can be stopped.

Procedures of separation processing by the separating apparatus 1900 will be described below. First, the driving mechanism 1910 moves the substrate holding portion 1909 upward to form an appropriate gap between the substrate holding portions 1909 and 1901. In this state, the bonded substrate stack 50 is horizontally supported by the robot hand 400 from the lower side and placed on the support portion 1903 of the substrate holding portion 1901. The driving mechanism 1910 moves the substrate holding portion 1909 downward to cause it to press the bonded substrate stack 50. The bonded substrate stack 50 is pressed and held by the substrate holding portions 1909 and 1901 from both sides.

The bonded substrate stack 50 is vacuum-chucked by the vacuum chuck mechanisms of the substrate holding portions 1901 and 1909.

The rotation source (not shown) is actuated to transmit the rotational force to the rotating shaft 1904. The rotating shaft 1904, substrate holding portion 1901, bonded substrate stack 50, and substrate holding portion 1909 rotate integrally.

While keeping the shutter 1922 closed, a pump (not shown) connected to the nozzle 1921 is actuated to feed a high-pressure jet medium (e.g., water) to the nozzle 1921. A high-pressure jet is ejected from the nozzle 1921. When the jet stabilizes, the shutter 1922 is opened. As shown in FIG. 23, the jet ejected from the nozzle 1921 is continuously injected into the porous layer of the bonded substrate stack 50 to start separating the bonded substrate stack 50. In this state, the outer peripheral portion of the bonded substrate stack 50 is separated.

When the outer peripheral portion is separated, chuck of the bonded substrate stack 50 by the vacuum chuck mechanisms of the substrate holding portions 1901 and 1909 is canceled, as shown in FIG. 24. In this state, the bonded substrate stack 50 is completely separated. Under a specific condition, when the central portion of the bonded substrate stack 50 is to be separated, chuck of the bonded substrate stack 50 is canceled, thereby preventing any defects in the substrate in separation.

When separation of the bonded substrate stack 50 is ended, the shutter 1922 is closed, and the pump connected to the nozzle 1921 is stopped to stop jet injection into the bonded substrate stack 50. Rotation of the bonded substrate stack 50 is stopped by stopping driving the rotating shaft 1904.

The vacuum chuck mechanisms of the substrate holding portions 1901 and 1909 are actuated. The upper separated substrate is chucked by the substrate holding portion 1909, and the lower separated substrate is chucked by the substrate holding portion 1901. The substrate holding portion 1909 is moved upward by the driving mechanism 1910. The two separated substrates are spaced apart from each other.

The robot hand 400 is inserted between the substrate and the substrate holding portion 1909. The substrate is chucked by the robot hand 400. Chuck by the vacuum chuck mechanism of the substrate holding portion 1909 is canceled. The substrate is transferred from the substrate holding portion 1909 to the robot hand 400. The robot hand 400 conveys the substrate to a predetermined position (e.g., a cassette).

The robot hand 400 is inserted between the substrate and the substrate holding portion 1901. The substrate is chucked by the robot hand 400. Chuck by the vacuum chuck mechanism of the substrate holding portion 1901 is canceled. The substrate is transferred from the substrate holding portion 1901 to the robot hand 400. The robot hand 400 conveys the substrate to a predetermined position (e.g., a cassette). The two separated substrates may be received by the robot hand in the reverse order or simultaneously received by two robot hands (not shown).

After the bonded substrate stack 50 is separated into two substrates, the jet medium is present between the two substrates. When the jet medium is a liquid (e.g., water), the surface tension is considerably large. Hence, to space the two substrates apart from each other with a small force, a jet is preferably supplied from the nozzle 1921 to the gap between the two substrates. In this case, the jet from the nozzle 1921 is stopped after the two substrates are spaced apart from each other. Instead, a mechanism for ejecting a jet used to space the two substrates apart from each other may be independently prepared.

17th Embodiment

Figure 25:
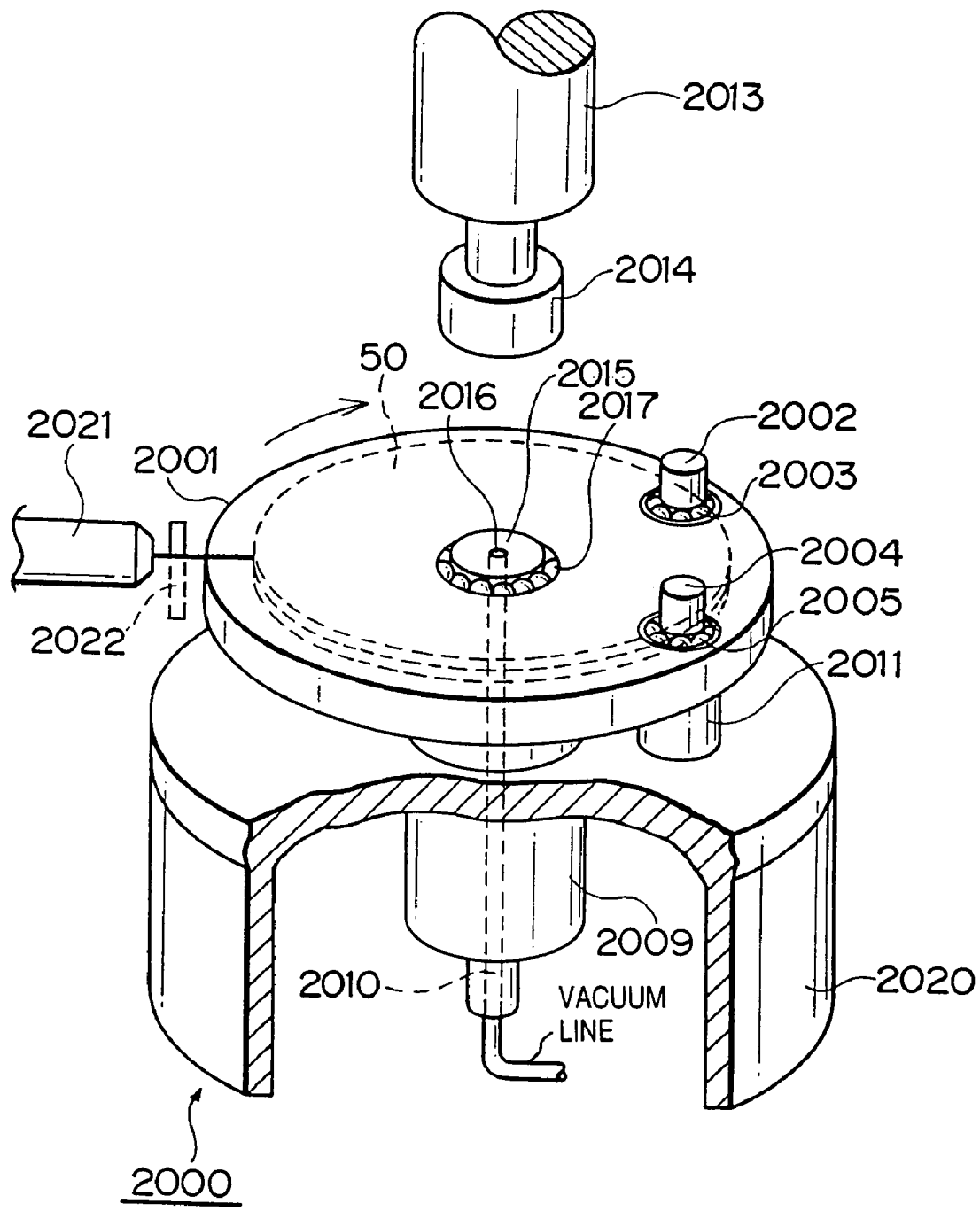
FIG. 25 is a view showing the schematic arrangement of a separating apparatus according to the 17th embodiment of the present invention.
Figure 26:
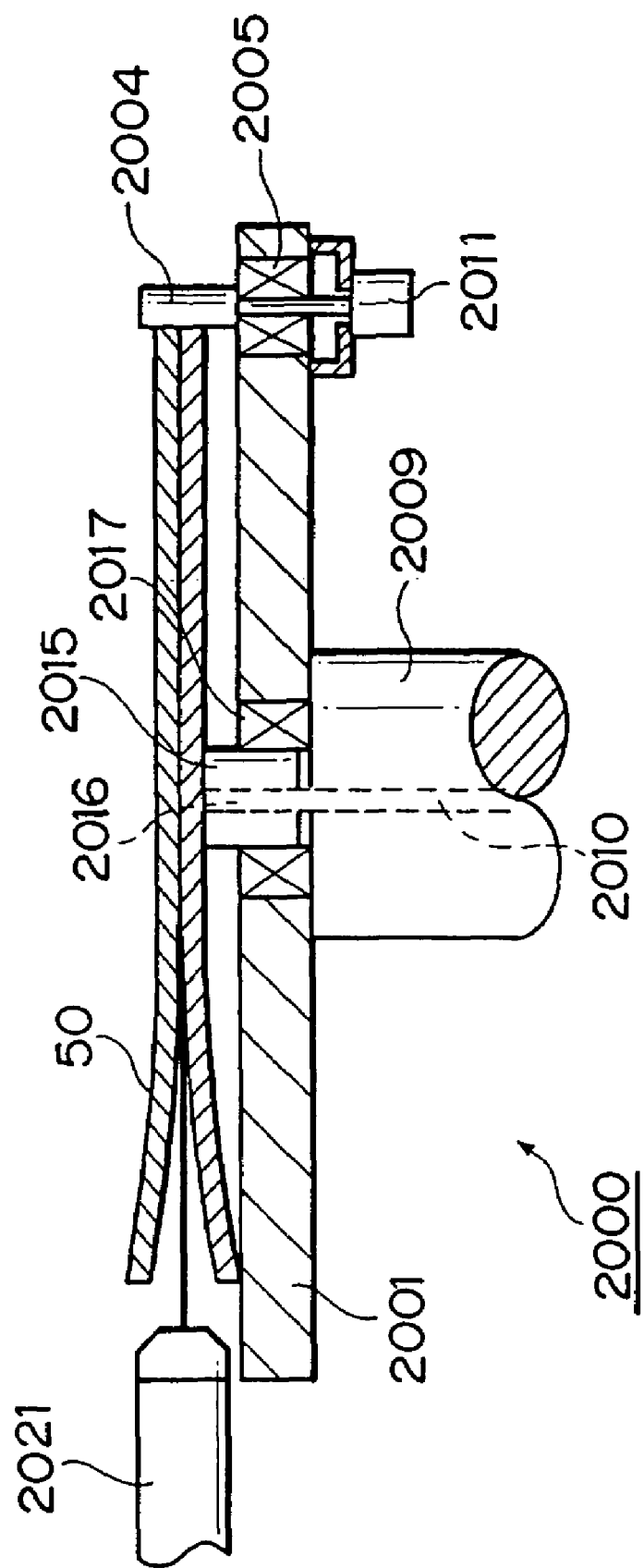
FIG. 26 is a view showing the schematic arrangement of the separating apparatus according to the 17th embodiment of the present invention.

FIGS. 25 and 26 are views showing the schematic arrangement of a separating apparatus according to the 17th embodiment of the present invention. In a separating apparatus 2000, a convex support portion 2015 for supporting the central portion of a bonded substrate stack 50, one or a plurality of rotational force transmission rollers 2004 for transmitting a rotational force to the edge portion of the bonded substrate stack 50 to rotate the bonded substrate stack 50, and one or a plurality of guide rollers 2002 for regulating movement of the bonded substrate stack 50 in the planar direction horizontally hold the bonded substrate stack 50 while rotating it. A jet is ejected from a nozzle 2021 and injected to a portion near the porous layer of the bonded substrate stack 50, thereby separating the bonded substrate stack 50 into two substrates at the porous layer.

The central support portion 2015 is rotatably axially supported by a table 2001 via a bearing 2017. The support portion 2015 has a suction hole 2016 for vacuum-chucking the bonded substrate stack 50. The table 2001 is fixed to a support table 2020 via a support member 2009. A vacuum line 2010 extends through the support member 2009. When the pressure in the suction hole 2016 is reduced via the vacuum line 2010, the bonded substrate stack 50 can be chucked on the central support portion 2015.

The rotational force transmission roller 2004 is rotatably axially supported by the table 2001 via a bearing 2005 and also coupled to the rotating shaft of a rotation source 2011. When the rotation source 2011 rotates the rotational force transmission roller 2004, the bonded substrate stack 50 rotates. A plurality of rotational force transmission rollers 2004 may be arranged. Especially, when the bonded substrate stack 50 has an orientation flat, at least two rotational force transmission rollers 2004 are required to continuously rotate the bonded substrate stack 50. The rotational force transmission roller 2004 is preferably located on the opposite side of the nozzle 2021. In this case, since the bonded substrate stack 50 is pressed by the jet ejected from the nozzle 2021, the frictional force acting between the bonded substrate stack 50 and the rotational force transmission roller 2004 becomes large, and the bonded substrate stack 50 can be efficiently rotated.

The guide roller 2002 is rotatably axially supported by the table 2001 via a bearing 2003. A plurality of guide rollers 2002 are preferably arranged to stably hold the bonded substrate stack 50.

Each of the rotational force transmission roller 2004 and guide roller 2002 can have an engaging portion (e.g., a groove) conforming to the shape of the edge portion of the bonded substrate stack 50. Such an engaging portion effectively prevents, e.g., vertical swing of the bonded substrate stack 50.

The nozzle 2021 is attached to, e.g., the support table 2020 via a support member (not shown). In the separating apparatus 2000, the position of the nozzle 2021 is controlled with reference to the position of the central support portion 2015. A shutter 2022 is inserted between the nozzle 2021 and the table 2001. When the shutter 2022 is open, and a jet is ejected from the nozzle 2021, the jet can be injected into the bonded substrate stack 50. When the shutter 2022 is closed, jet injection into the bonded substrate stack 50 can be stopped.

A substrate holding portion 2014 is located above the central support portion 2015. The substrate holding portion 2014 is driven by a driving mechanism 2013 to move in the vertical direction. The substrate holding portion 2014 has a chuck mechanism for chucking a separated substrate.

Procedures of separation processing by the separating apparatus 2000 will be described below. First, the bonded substrate stack 50 is horizontally supported by a robot hand 400 from the lower side and placed on the support portion 2015 at the center of the table 2001. At this time, the bonded substrate stack 50 is preferably positioned by bringing it into contact with rollers 2002 and 2004. In this state, the vacuum chuck mechanism of the central support portion 2015 is preferably actuated to cause it to chuck the bonded substrate stack 50.

The rotation source 2011 is actuated to rotate the rotational force transmission roller 2004. The rotational force is transmitted to the bonded substrate stack 50, so the bonded substrate stack 50 rotates together with the central support portion 2015.

While keeping the shutter 2022 closed, a pump (not shown) connected to the nozzle 2021 is actuated to feed a high-pressure jet medium (e.g., water) to the nozzle 2021. A high-pressure jet is ejected from the nozzle 2021. When the jet stabilizes, the shutter 2022 is opened. The jet ejected from the nozzle 2021 is continuously injected into the porous layer of the bonded substrate stack 50 to start separating the bonded substrate stack 50.

When separation of the bonded substrate stack 50 is ended, the shutter 2022 is closed, and the pump connected to the nozzle 2021 is stopped to stop jet injection into the bonded substrate stack 50. The operation of the rotation source 2011 is also stopped.

The substrate holding portion 2014 is moved downward by the driving mechanism 2013 to abut against the upper separated substrate. The chuck mechanism of the substrate holding portion 2014 is actuated to chuck the upper separated substrate. In this state, the substrate holding portion 2014 is moved upward by the driving mechanism 2013. The two separated substrates are spaced apart from each other.

The robot hand 400 receives the substrate held by the substrate holding portion 2014 and conveys the substrate to a predetermined position (e.g. a cassette).

Chuck of the substrate by the vacuum chuck mechanism of the central support portion 2015 is canceled. The robot hand 400 is inserted between the substrate and the substrate central support portion 2015. The substrate is transferred from the central support portion 2015 to the robot hand 400. The robot hand 400 conveys the substrate to a predetermined position (e.g., a cassette). The two separated substrates may be received by the robot hand in the reverse order or simultaneously received by two robot hands (not shown).

After the bonded substrate stack 50 is separated into two substrates, the jet medium is present between the two substrates. When the jet medium is a liquid (e.g., water), the surface tension is considerably large. Hence, to space the two substrates apart from each other with a small force, a jet is preferably supplied from the nozzle 2021 to the gap between the two substrates. In this case, the jet from the nozzle 2021 is stopped after the two substrates are spaced apart from each other. Instead, a mechanism for ejecting a jet used to space the two substrates apart from each other may be independently prepared.

In the above separation processing, the bonded substrate stack 50 is separated without pressing it by the substrate holding portion 2014. However, the bonded substrate stack 50 may be separated while being pressed by the substrate holding portion 2014. In this case, the driving mechanism 2013 preferably rotatably supports the substrate holding portion 2014.

18th Embodiment

Figure 27:
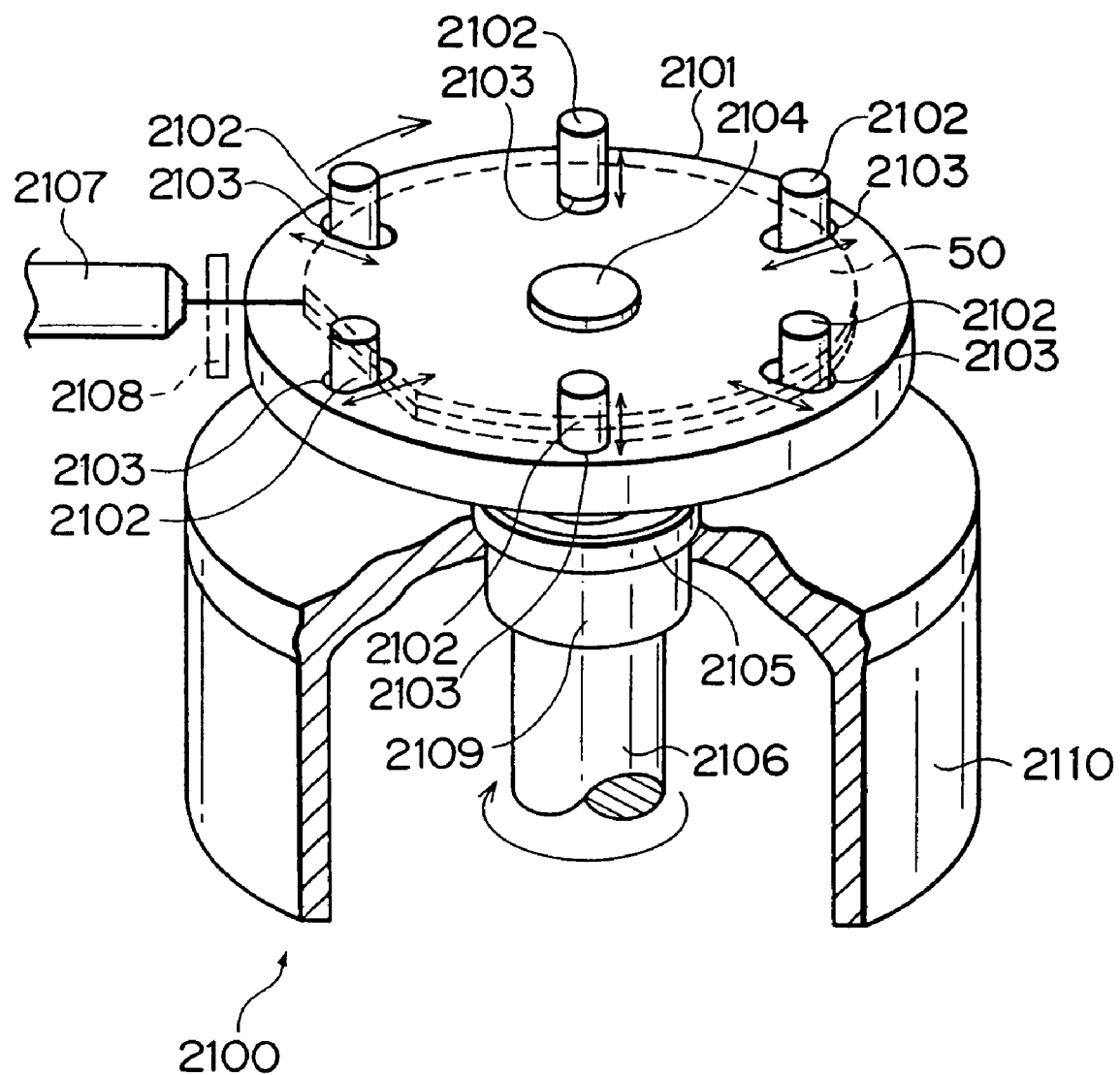
FIG. 27 is a view showing the schematic arrangement of a separating apparatus according to the 18th embodiment of the present invention.

FIG. 27 is a view showing the schematic arrangement of a separating apparatus according to the 18th embodiment of the present invention. A separating apparatus 2100 has a plurality of chuck pins 2102 for chucking the outer peripheral portion of a bonded substrate stack 50. The plurality of chuck pins 2102 horizontally hold the bonded substrate stack 50. A jet is ejected from a nozzle 2107 and injected to a portion near the porous layer of the bonded substrate stack 50, thereby separating the bonded substrate stack 50 into two substrates at the porous layer.

The separating apparatus 2100 has a table 2101. The table 2101 has the plurality of chuck pins 2102 for supporting the outer peripheral portion of the bonded substrate stack 50. The number of chuck pins 2102 is preferably three or more. When the bonded substrate stack 50 has an orientation flat, the number of chuck pins 2102 is preferably four or more. Each of the chuck pins 2102 can have an engaging portion (e.g., a groove) conforming to the shape of the edge portion of the bonded substrate stack 50. Such an engaging portion effectively prevents, e.g., vertical swing of the bonded substrate stack 50.

The table 2101 has a driving mechanism for moving the chuck pins 2102 in the radial direction (toward the center or toward the outer periphery) of the table 2101 along moving guides 2103 formed in the table 2101. To hold the bonded substrate stack 50, first, the bonded substrate stack 50 is placed on the table 2101. After this, the chuck pins 2102 are moved toward the center of the table 2101, thereby supporting the bonded substrate stack 50 by the chuck pins 2102. A driving mechanism for moving not all the chuck pins 2102 but only some of the chuck pins 2102 may be employed.

The table 2101 preferably has a convex support portion 2104 for forming a gap between the bonded substrate stack 50 and the surface of the table 2101 to receive a robot hand 400.

The table 2101 is coupled to one end of a rotating shaft 2106. The rotating shaft 2106 is supported by a support table 2110 via a bearing 2109. The bearing 2109 has, at its upper portion, a sealing member 2105 for sealing the opening portion formed in the support table 2110 to pass the rotating shaft 2106. The rotating shaft 2106 is coupled to a rotation source (not shown) to be rotated by the rotational force transmitted from the rotation source.

The nozzle 2107 is attached to, e.g., the support table 2110 via a support member (not shown). In the separating apparatus 2100, the position of the nozzle 2107 is controlled with reference to the position of the table 2101. A shutter 2108 is inserted between the nozzle 2107 and the table 2101. When the shutter 2108 is open, and a jet is ejected from the nozzle 2107, the jet can be injected into the bonded substrate stack 50. When the shutter 2108 is closed, jet injection into the bonded substrate stack 50 can be stopped.

Procedures of separation processing by the separating apparatus 2100 will be described below. First, the chuck pins 2102 are moved toward the outer periphery by the driving mechanism to form a space on the table 2101 where the bonded substrate stack 50 is to be placed.

The bonded substrate stack 50 is horizontally supported by the robot hand 400 from the lower side and placed on the support portion 2104 of the table 2101. The chuck pins 2102 are moved toward the center by the driving mechanism to fix the bonded substrate stack 50. According to the separating apparatus 2100, the bonded substrate stack 50 is positioned by moving the chuck pins 2102 toward the center.

The rotation source (not shown) is actuated to transmit the rotational force to the rotating shaft 2106. The table 2101 and bonded substrate stack 50 rotate together.

While keeping the shutter 2108 closed, a pump (not shown) connected to the nozzle 2107 is actuated to feed a high-pressure jet medium (e.g., water) to the nozzle 2107. A high-pressure jet is ejected from the nozzle 2107. When the jet stabilizes, the shutter 2108 is opened. The jet ejected from the nozzle 2107 is continuously injected into the porous layer of the bonded substrate stack 50 to start separating the bonded substrate stack 50.

When separation of the bonded substrate stack 50 is ended, the shutter 2108 is closed, and the pump connected to the nozzle 2107 is stopped to stop jet injection into the bonded substrate stack 50. Rotation of the bonded substrate stack 50 is stopped by stopping driving the rotating shaft 2106.

The robot hand 400 is inserted between the table 2101 and the lower substrate and chucks the substrate. Simultaneously, the upper substrate is chucked by another robot to space the two substrates apart from each other. The substrates are conveyed to predetermined positions (e.g., cassettes).

The separating apparatus 2100 may have a substrate transfer mechanism formed from the substrate holding portion 2014 and driving mechanism 2013 shown in FIG. 25 such that the two separated substrates are separated by the transfer mechanism.

After the bonded substrate stack 50 is separated into two substrates, the jet medium is present between the two substrates. When the jet medium is a liquid (e.g., water), the surface tension is considerably large. Hence, to space the two substrates apart from each other with a small force, a jet is preferably supplied from the nozzle 2107 to the gap between the two substrates. In this case, the jet from the nozzle 2107 is stopped after the two substrates are spaced apart from each other. Instead, a mechanism for ejecting a jet used to space the two substrates apart from each other may be independently prepared.

19th Embodiment

Figure 28:
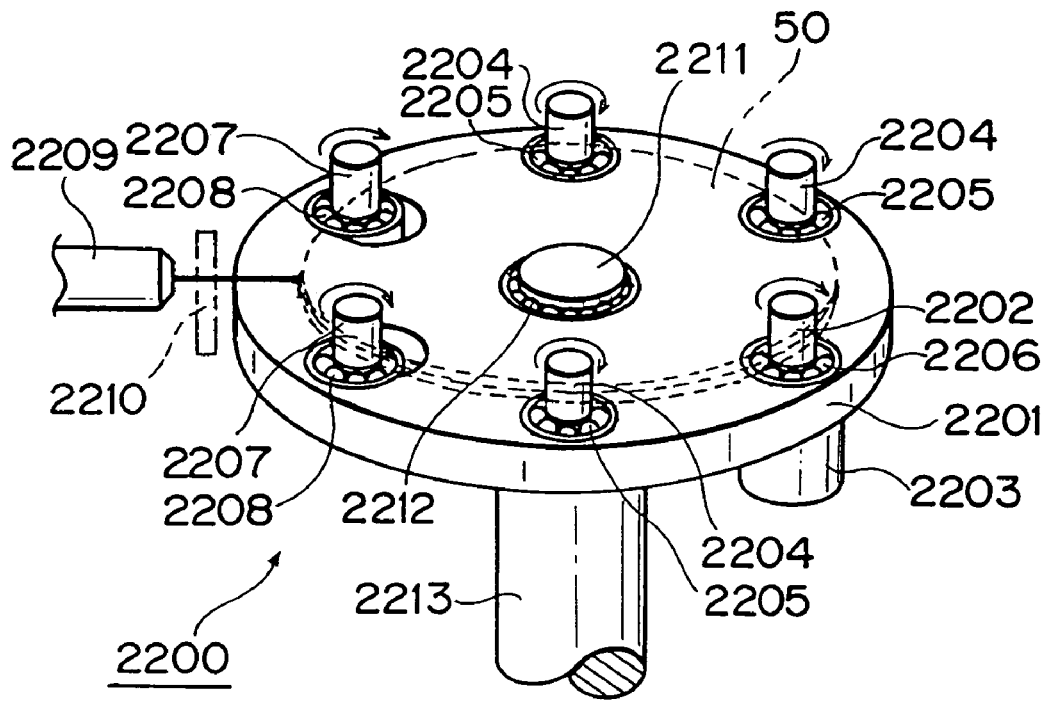
FIG. 28 is a view showing the schematic arrangement of a separating apparatus according to the 19th embodiment of the present invention.
Figure 29:
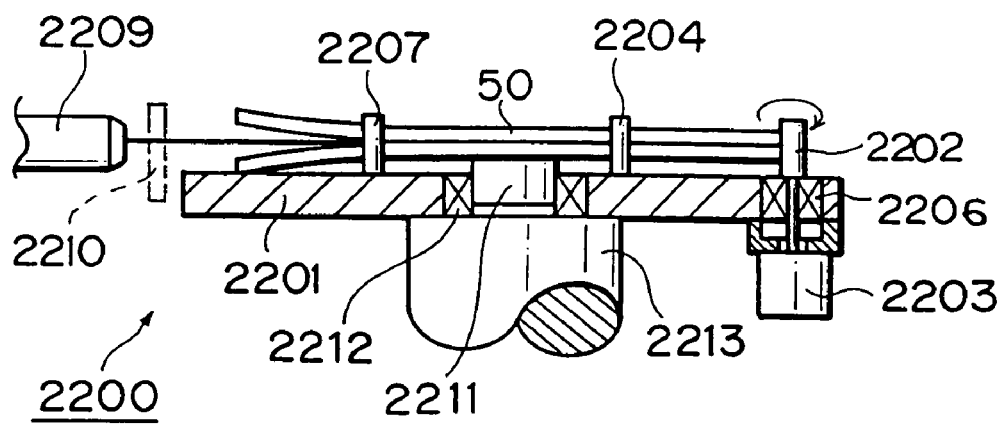
FIG. 29 is a view showing the schematic arrangement of the separating apparatus according to the 19th embodiment of the present invention.

FIGS. 28 and 29 are views showing the schematic arrangement of a separating apparatus according to the 19th embodiment of the present invention. In a separating apparatus 2200, one or a plurality of rotational force transmission rollers 2202 for transmitting a rotational force to the edge portion of a bonded substrate stack 50 to rotate the bonded substrate stack 50 and one or a plurality of guide rollers 2204 and 2207 for regulating movement of the bonded substrate stack 50 in the planar direction horizontally hold the bonded substrate stack 50 while rotating it. A jet is ejected from a nozzle 2209 and injected to a portion near the porous layer of the bonded substrate stack 50, thereby separating the bonded substrate stack 50 into two substrates at the porous layer.

The rotational force transmission roller 2202 is rotatably axially supported by a table 2201 via a bearing 2206 and also coupled to the rotating shaft of a rotation source 2203. When the rotation source 2203 rotates the rotational force transmission roller 2202, the bonded substrate stack 50 rotates. A plurality of rotational force transmission rollers 2202 may be arranged. Especially, when the bonded substrate stack 50 has an orientation flat, at least two rotational force transmission rollers 2202 are required to continuously rotate the bonded substrate stack 50.

Each of the guide rollers 2204 is rotatably axially supported by the table 2201 via a bearing 2205. Each of the guide rollers 2207 is rotatably axially supported by a bearing 2208. The table 2201 has a driving mechanism for moving the bearings 2208 in the radial direction (toward the center or toward the outer periphery) of the table 2201. To hold the bonded substrate stack 50, first, the bonded substrate stack 50 is placed on the table 2201. After this, the guide rollers 2207 are moved toward the center of the table. The table 2201 is supported on a support table 2213.

The table 2201 preferably has a convex support portion 2211 for forming a gap between the bonded substrate stack 50 and the surface of the table 2201 to receive a robot hand 400. The support portion 2211 is preferably rotatably axially supported by the table 2201 via, e.g., a bearing 2212 not to impede rotation of the bonded substrate stack 50.

The nozzle 2209 is attached to, e.g., the table 2201 via a support member (not shown). In the separating apparatus 2200, the position of the nozzle 2209 is controlled with reference to the position of the table 2201. A shutter 2210 is inserted between the nozzle 2209 and the table 2201. When the shutter 2210 is open, and a jet is ejected from the nozzle 2209, the jet can be injected into the bonded substrate stack 50. When the shutter 2210 is closed, jet injection into the bonded substrate stack 50 can be stopped.

Procedures of separation processing by the separating apparatus 2200 will be described below. First, the guide rollers 2207 are moved toward the outer periphery by the driving mechanism to form a space on the table 2101 where the bonded substrate stack 50 is to be placed.

The bonded substrate stack 50 is horizontally supported by the robot hand 400 from the lower side and placed on the central support portion 2211 of the table 2201. The guide rollers 2207 are moved toward the center to fix the bonded substrate stack 50. According to the separating apparatus 2200, the bonded substrate stack 50 is positioned by moving the guide rollers 2207 toward the center.

The rotation source 2203 is actuated to transmit the rotational force to the rotational force transmission roller 2202, so the bonded substrate stack 50 rotates.

While keeping the shutter 2210 closed, a pump (not shown) connected to the nozzle 2209 is actuated to feed a high-pressure jet medium (e.g., water) to the nozzle 2209. A high-pressure jet is ejected from the nozzle 2209. When the jet stabilizes, the shutter 2210 is opened. The jet ejected from the nozzle 2209 is continuously injected into the porous layer of the bonded substrate stack 50 to start separating the bonded substrate stack 50.

When separation of the bonded substrate stack 50 is ended, the shutter 2210 is closed, and the pump connected to the nozzle 2209 is stopped to stop jet injection into the bonded substrate stack 50. Rotation of the bonded substrate stack 50 is stopped by stopping driving the rotation source 2203.

The robot hand 400 is inserted between the table 2201 and the lower substrate and chucks the substrate. Simultaneously, the upper substrate is chucked by another robot to space the two substrates apart from each other. The substrates are conveyed to predetermined positions (e.g., cassettes).

The separating apparatus 2200 may have a substrate spacing mechanism formed from the substrate holding portion 2014 and driving mechanism 2013 shown in FIG. 25 such that the two separated substrates are separated by the spacing mechanism.

After the bonded substrate stack 50 is separated into two substrates, the jet medium is present between the two substrates. When the jet medium is a liquid (e.g., water), the surface tension is considerably large. Hence, to space the two substrates apart from each other with a small force, a jet is preferably supplied from the nozzle 2209 to the gap between the two substrates. In this case, the jet from the nozzle 2209 is stopped after the two substrates are spaced apart from each other. Instead, a mechanism for ejecting a jet used to space the two substrates apart from each other may be independently prepared.

20th Embodiment

Figure 30:
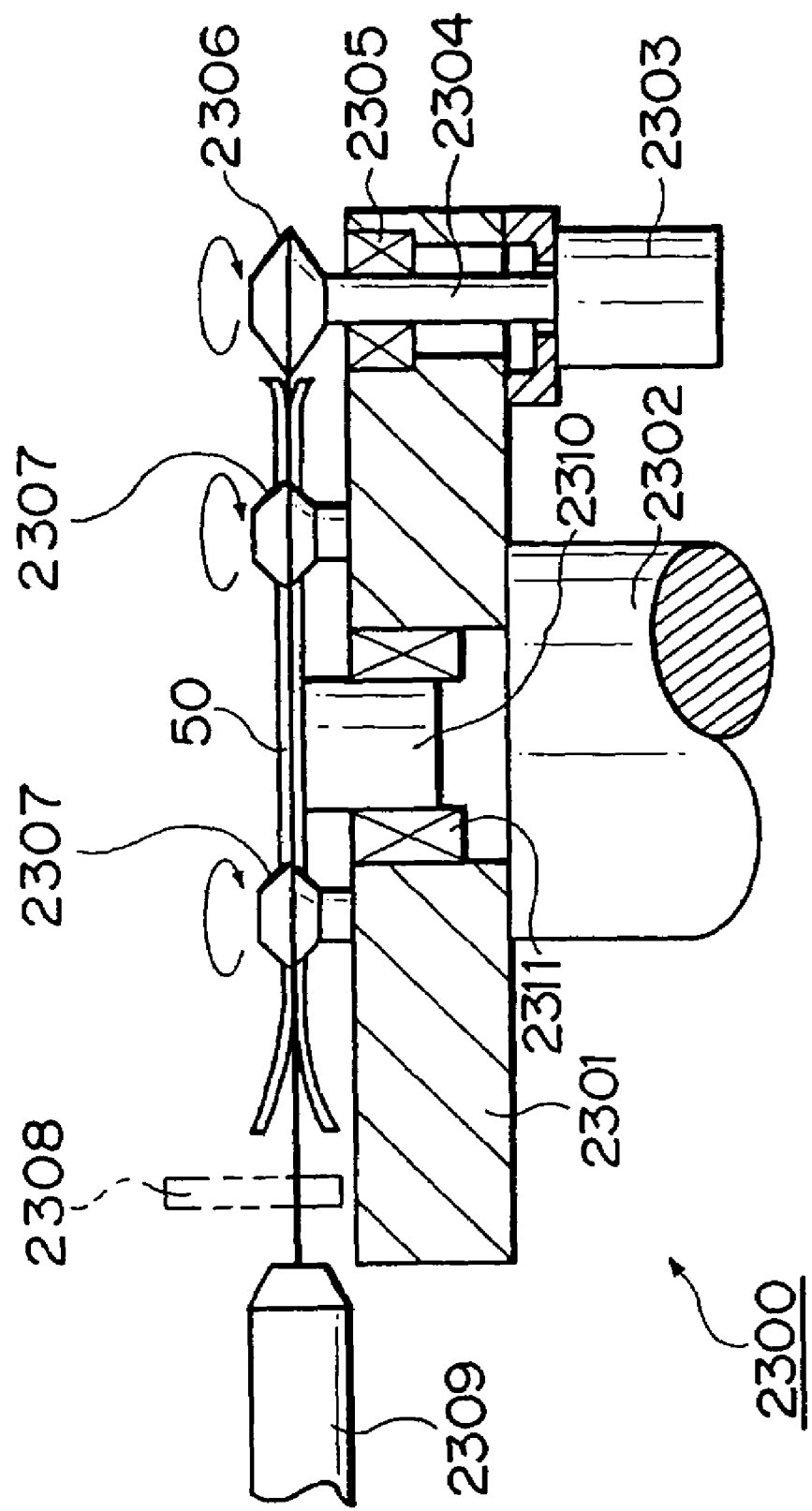
FIG. 30 is a view showing the schematic arrangement of a separating apparatus according to the 20th embodiment of the present invention.

FIG. 30 is a view showing the schematic arrangement of a separating apparatus according to the 20th embodiment of the present invention. In a separating apparatus 2300, one or a plurality of rotational force transmission members 2306 for transmitting a rotational force to a bonded substrate stack 50 from its edge portion and one or a plurality of guide members 2307 for regulating movement of the bonded substrate stack 50 in the planar direction horizontally hold the bonded substrate stack 50 while rotating it. A jet is ejected from a nozzle 2309 and injected to a portion near the porous layer of the bonded substrate stack 50, thereby separating the bonded substrate stack 50 into two substrates at the porous layer. Each of the rotational force transmission member 2306 and guide member 2307 preferably has a shape (rhombic shape) obtained by, e.g., bonding the bottom portions of two cones.

The rotational force transmission member 2306 is rotatably axially supported by a table 2301 via a bearing 2305 and also coupled to the rotating shaft of a rotation source 2303. When the rotation source 2303 rotates the rotational force transmission member 2306, the bonded substrate stack 50 rotates. A plurality of rotational force transmission members 2306 may be arranged. Especially, when the bonded substrate stack 50 has an orientation flat, at least two rotational force transmission members 2306 are required to continuously rotate the bonded substrate stack 50. The guide member 2307 is rotatably axially supported by the table 2301 via a bearing (not shown). A plurality of guide members 2307 may be arranged.

The separating apparatus 2300 has a driving mechanism (not shown) for moving the rotational force transmission member 2306 and/or the guide member 2307 in the radial direction (toward the center or toward the outer periphery) of the table 2301.

When a member having a shape obtained by bonding the bottom portions of two cones, as described above, is employed as the rotational force transmission member 2306 or guide member 2307, the bonded substrate stack 50 can be held by inserting the outer peripheral portion of the member into the bonding surfaces of the bonded substrate stack 50 or already separated portions. This prevents, e.g., vertical swing of the bonded substrate stack 50 and also allows the already separated portions of the bonded substrate stack 50 to warp and be spaced apart from each other. As a result, the bonded substrate stack 50 can be stably held, and the separation efficiency can be increased.

The table 2301 preferably has a convex support portion 2310 for forming a gap between the bonded substrate stack 50 and the surface of the table 2301 to receive a robot hand 400. The support portion 2310 is preferably rotatably axially supported by the table 2301 via, e.g., a bearing 2311 not to impede rotation of the bonded substrate stack 50.

The nozzle 2309 is attached to, e.g., the table 2301 via a support member (not shown). In the separating apparatus 2300, the position of the nozzle 2309 is controlled with reference to the position of the table 2301. A shutter 2308 is inserted between the nozzle 2309 and the bonded substrate stack 50. When the shutter 2308 is open, and a jet is ejected from the nozzle 2309, the jet can be injected into the bonded substrate stack 50. When the shutter 2308 is closed, jet injection into the bonded substrate stack 50 can be stopped.

Procedures of separation processing by the separating apparatus 2300 will be described below. First, the rotational force transmission member 2306 and/or guide member 2307 is moved toward the outer periphery to form a space on the table 2301 where the bonded substrate stack 50 is to be placed.

The bonded substrate stack 50 is horizontally supported by the robot hand 400 from the lower side and placed on the central support portion 2310 of the table 2301. The rotational force transmission member 2306 and/or guide member 2307 is moved toward the center to fix the bonded substrate stack 50. With this operation, the bonded substrate stack 50 is positioned.

The rotation source 2303 is actuated to rotate the rotational force transmission member 2306. The bonded substrate stack 50 rotates.

While keeping the shutter 2308 closed, a pump (not shown) connected to the nozzle 2309 is actuated to feed a high-pressure jet medium (e.g., water) to the nozzle 2309. A high-pressure jet is ejected from the nozzle 2309. When the jet stabilizes, the shutter 2308 is opened. The jet ejected from the nozzle 2309 is continuously injected into the porous layer of the bonded substrate stack 50 to start separating the bonded substrate stack 50.

When separation of the bonded substrate stack 50 is ended, the shutter 2308 is closed, and the pump connected to the nozzle 2309 is stopped to stop jet injection into the bonded substrate stack 50. Rotation of the bonded substrate stack 50 is stopped by stopping driving the rotation source 2303.

The robot hand 400 is inserted between the table 2301 and the lower substrate and chucks the substrate. Simultaneously, the upper substrate is chucked by another robot to space the two substrates apart from each other. The substrates are conveyed to predetermined positions (e.g., cassettes).

The separating apparatus 2300 may have a substrate spacing mechanism formed from the substrate holding portion 2014 and driving mechanism 2013 shown in FIG. 25 such that the two separated substrates are separated by the spacing mechanism.

After the bonded substrate stack 50 is separated into two substrates, the jet medium is present between the two substrates. When the jet medium is a liquid (e.g., water), the surface tension is considerably large. Hence, to space the two substrates apart from each other with a small force, a jet is preferably supplied from the nozzle 2309 to the gap between the two substrates. In this case, the jet from the nozzle 2309 is stopped after the two substrates are spaced apart from each other. Instead, a mechanism for ejecting a jet used to space the two substrates apart from each other may be independently prepared.

21st Embodiment

Figure 40:
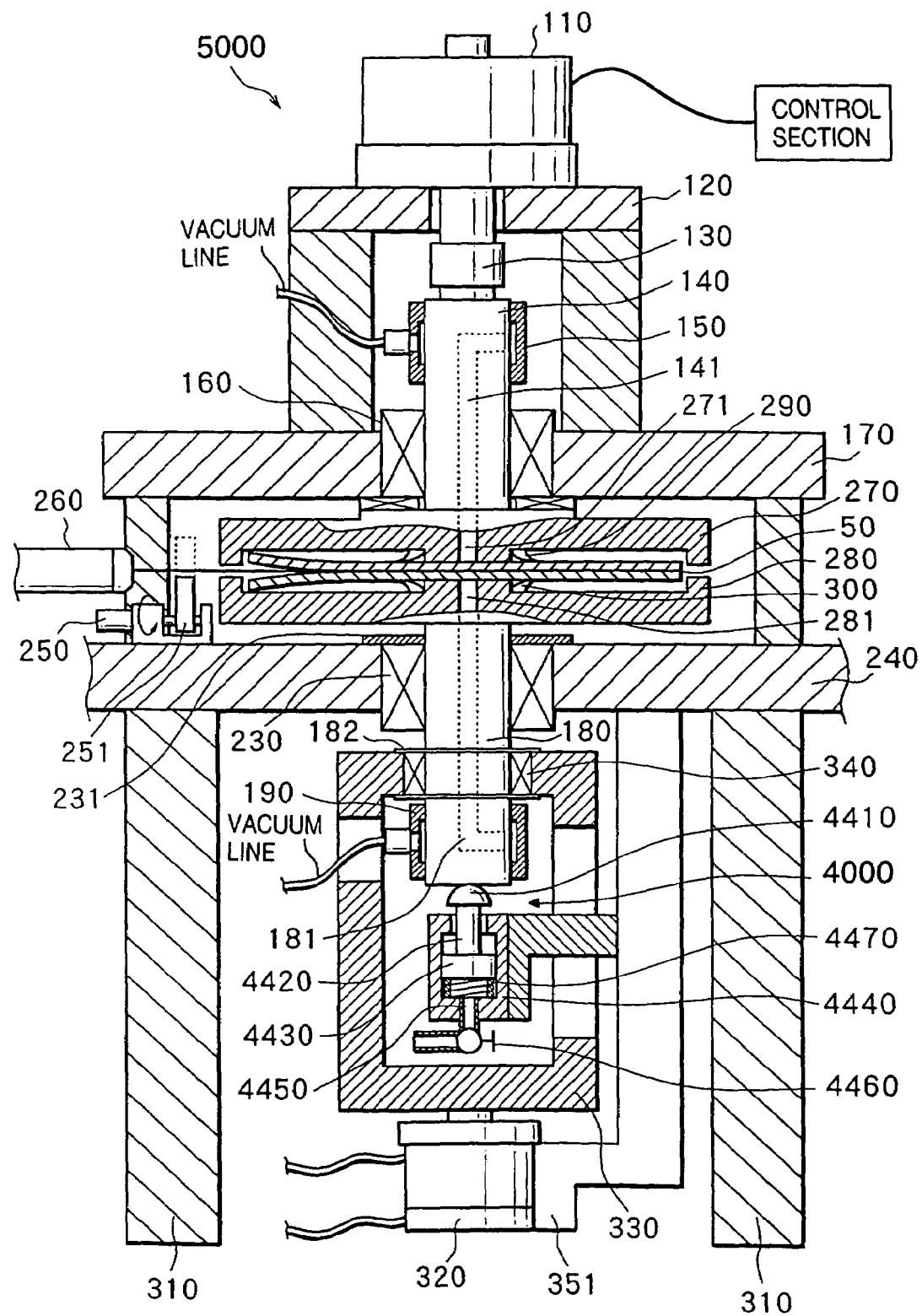
FIG. 40 is a view showing the schematic arrangement of a separating apparatus according to the 21st embodiment of the present invention.

FIG. 40 is a view showing the schematic arrangement of a separating apparatus according to the 21st embodiment of the present invention. The same reference numerals as in other drawings substantially denote the same constituent elements in FIG. 40.

A separating apparatus 5000 has a pair of substrate holding portions 270 and 280. The substrate holding portions 270 and 280 horizontally hold and rotate a bonded substrate stack 50 by sandwiching it from the upper and lower sides. A jet is ejected from a nozzle 260 and injected to a portion near the porous layer of the bonded substrate stack 50, thereby separating the bonded substrate stack 50 into two substrates at the porous layer.

The upper substrate holding portion 270 is coupled to one end of a rotating shaft 140. The other end of the rotating shaft 140 is coupled to the rotating shaft of a motor 110 via a coupling 130. The motor 110 and rotating shaft 140 may be coupled not via the coupling 130 but via, e.g., a belt or another mechanism. The motor 110 is fixed to a support member 120 fixed on an upper table 170. The motor is controlled by a control section.

A vacuum line 141 for vacuum-chucking the bonded substrate stack 50 on the substrate holding portion 270 extends through the rotating shaft 140. The vacuum line 141 is connected to an external vacuum line via a ring 150. The external vacuum line has a solenoid valve (not shown). The solenoid valve is ON/OFF-controlled by the control section as needed. The substrate holding portion 270 has a suction hole 271 for vacuum-chucking the bonded substrate stack 50. The suction hole 271 is connected to the vacuum line 141. The suction hole 271, vacuum line 141, and solenoid valve construct the vacuum chuck mechanism of the substrate holding portion 270. The rotating shaft 140 is supported by the upper table 170 via a bearing 160.

The lower substrate holding portion 280 is coupled to a rotating shaft 180. The rotating shaft 180 is supported by a lower table 240 via a reciprocal/rotational guide 230. The lower table 240 has, at its upper portion, a sealing member 231 for preventing the jet medium from entering the reciprocal/rotational guide 230.

The rotating shaft 180 is coupled to the piston rod of an air cylinder 320 via a coupling 330 having a radial bearing 340 for rotatably axially supporting the rotating shaft 180. The rotating shaft 180 has a flange 182 for regulating the positional relationship between the rotating shaft 180 and the coupling 330. Hence, when the coupling 330 is driven upward or downward by the air cylinder 320, the rotating shaft 180 moves upward or downward accordingly. In addition, when separation of the bonded substrate stack 50 progresses, and the already separated portions warp in the axial direction of the bonded substrate stack 50 to move the lower substrate holding portion 280 and rotating shaft 180 downward, the coupling 330 moves downward accordingly.

The separating apparatus 5000 has an abrupt operation prevention mechanism 4000 which prevents the lower substrate holding portion 280 and rotating shaft 180 from abruptly moving downward (i.e., in the direction in which they are separated from the upper substrate holding portion 270) during separation of the bonded substrate stack 50, and also allows the lower substrate holding portion 280 and rotating shaft 180 to moderately move. The abrupt operation prevention mechanism 4000 is supported by a support member 351 fixed on the lower table 240.

Figure 41:
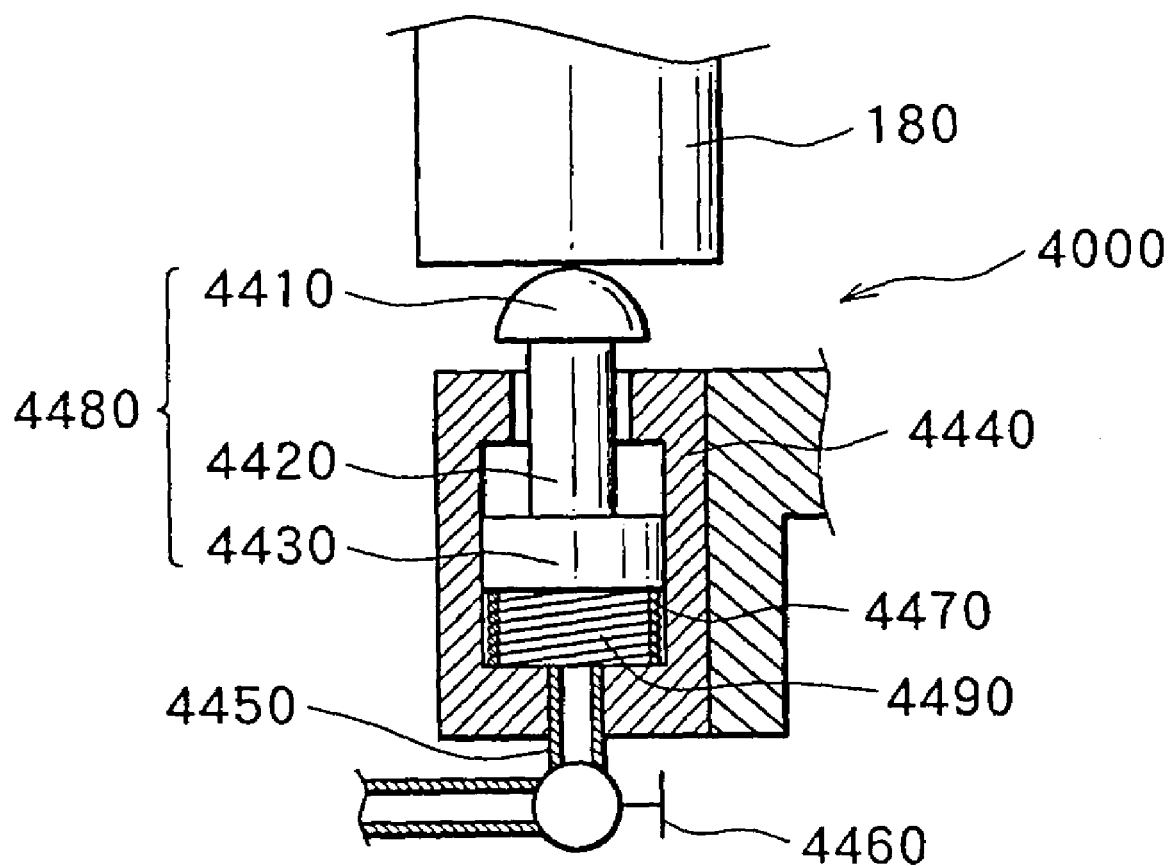
FIG. 41 is a view showing the arrangement of an abrupt operation prevention mechanism using a damper mechanism.

The abrupt operation prevention mechanism 4000 is formed from, e.g., a damper mechanism. FIG. 41 is a view showing the arrangement of the abrupt operation prevention mechanism 4000 using a damper mechanism. The abrupt operation prevention mechanism 4000 of this example has a frame member (e.g., a cylinder) 4440, movable portion 4480, restoring portion 4470, channel 4450, and valve 4460.

The movable portion 4480 has a piston (partition plate) 4430 which forms a pressure chamber 4490 between the piston and the inner wall of the frame member 4440, a piston rod 4420, and a contact member 4410. These members have an integrated structure. The pressure chamber 4490 communicates with one end of the valve 4460 via the channel 4450. Before the start of separation processing of the bonded substrate stack 50, the pressure chamber 4490 is filled with a fluid (e.g., a gas such as air or a liquid such as oil). The piston 4430 has an area sufficiently larger than the sectional area of the channel 4450.

The other end of the valve 4460 is connected to a vessel storing, e.g., a fluid. The volume of this vessel is preferably sufficiently larger than that of the pressure chamber 4490. When air at the atmospheric pressure is used as the fluid, the other end of the valve 4460 may be open to the air. The valve 4460 preferably has a function of adjusting the opening degree (flow rate).

In separation processing of the bonded substrate stack 50, already separated portions of the bonded substrate stack 50 warp in the axial direction of the bonded substrate stack 50 due to the pressure of the jet medium continuously injected into the gap formed by separation. The lower substrate holding portion 280 and rotating shaft 180 receive a force in the direction in which they are spaced apart from the upper substrate holding portion 270, i.e., downward. Hence, the movable portion 4480 of the abrupt operation prevention mechanism 4000 also receives the downward force from the rotating shaft 180.

At this time, the abrupt operation prevention mechanism 4000 generates a reaction against the force applied from the rotating shaft 180. The magnitude of this reaction depends on the acceleration of the lower substrate holding portion 280 and rotating shaft 180, i.e., the acceleration of the movable portion 4480.

More specifically, the abrupt operation prevention mechanism 4000 has the channel 4450 for discharging the fluid from the pressure chamber 4490 and the valve 4460 for adjusting the fluid discharge amount. As the movable portion 4480 moves downward, the fluid in the pressure chamber 4490 is discharged. When the movable portion 4480 moderately moves downward, the fluid in the pressure chamber 4490 is discharged in accordance with the movement, and the pressure in the pressure chamber 4490 less increases. Hence, the reaction applied from the movable portion 4480 to the rotating shaft 180 is small. On the other hand, when the movable portion 4480 abruptly moves downward, discharge of the fluid in the pressure chamber 4490 cannot follow the movement, and the pressure in the pressure chamber 4490 abruptly increases. Hence, the reaction applied from the movable portion 4480 to the rotating shaft is large.

The abrupt operation prevention mechanism 4000 prevents the lower substrate holding portion 280 from abruptly moving downward but allows it to moderately move downward. In other words, the abrupt operation prevention mechanism 4000 prevents the bonded substrate stack 50 from abruptly warping in the axial direction but allows it to moderately warp.

When separation of one bonded substrate stack 50 is ended, and separation processing of the next bonded substrate stack 50 is to be executed, the lower substrate holding portion 280 and rotating shaft 180 are driven upward by the air cylinder 320 to hold the new bonded substrate stack 50. At this time, the restoring portion 4470 presses the movable portion 4480 upward to bring the contact member 4410 of the movable portion 4480 into contact with the rotating shaft 180.

The restoring portion 4470 extends the piston 4430 to fill the pressure chamber 4490 with the fluid or fills the pressure chamber 4490 with the fluid to extend the piston 4430. In the arrangement shown in FIG. 41, the restoring portion 4470 comprises a spring. The piston 4430 is extended by the restoring force of the spring. With this operation, the pressure chamber 4490 is filled with the fluid via the channel 4450 and valve 4460.

Figure 42:
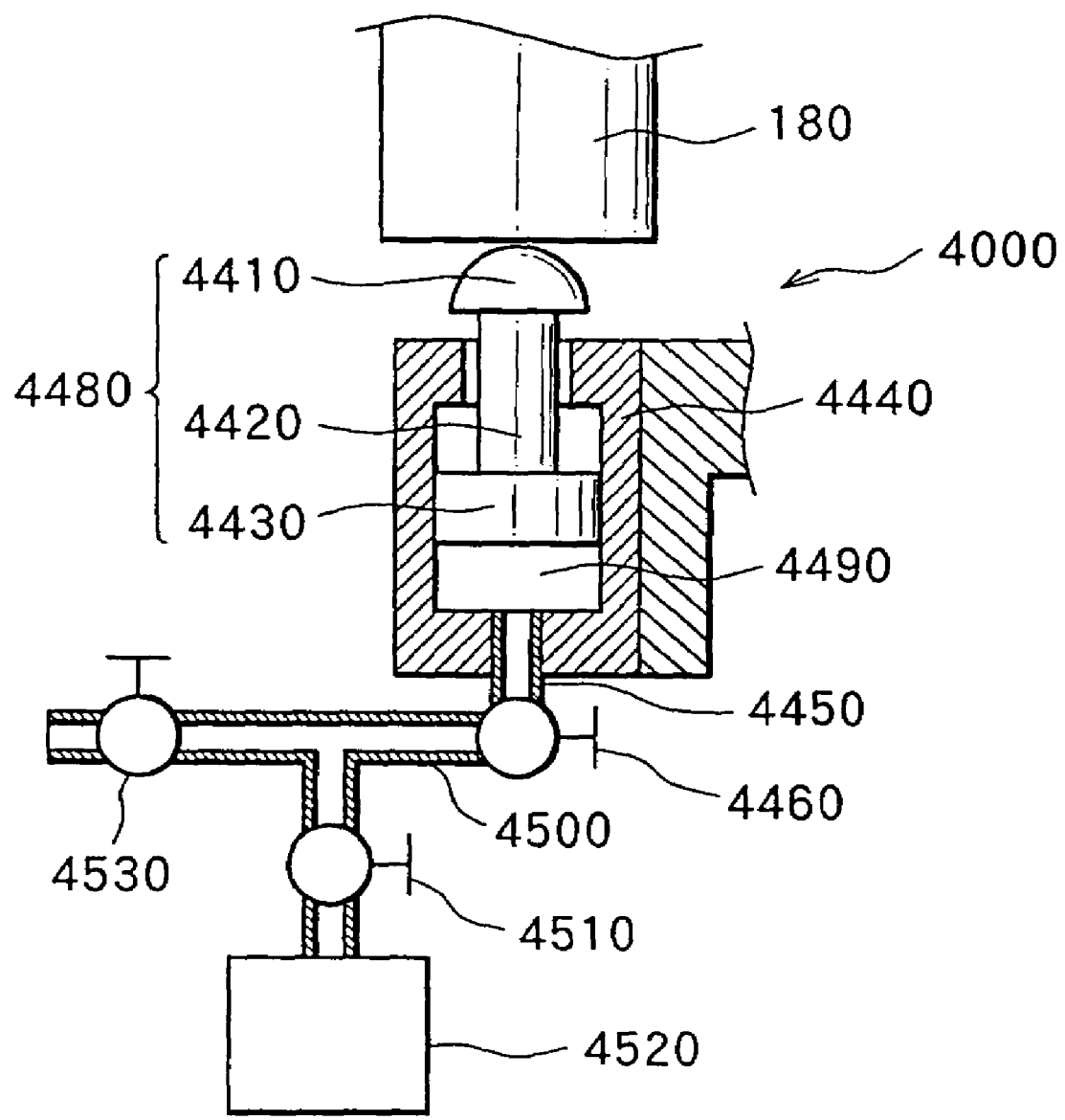
FIG. 42 is a view showing the first modification of the abrupt operation prevention mechanism shown in FIG. 41.
Figure 43:
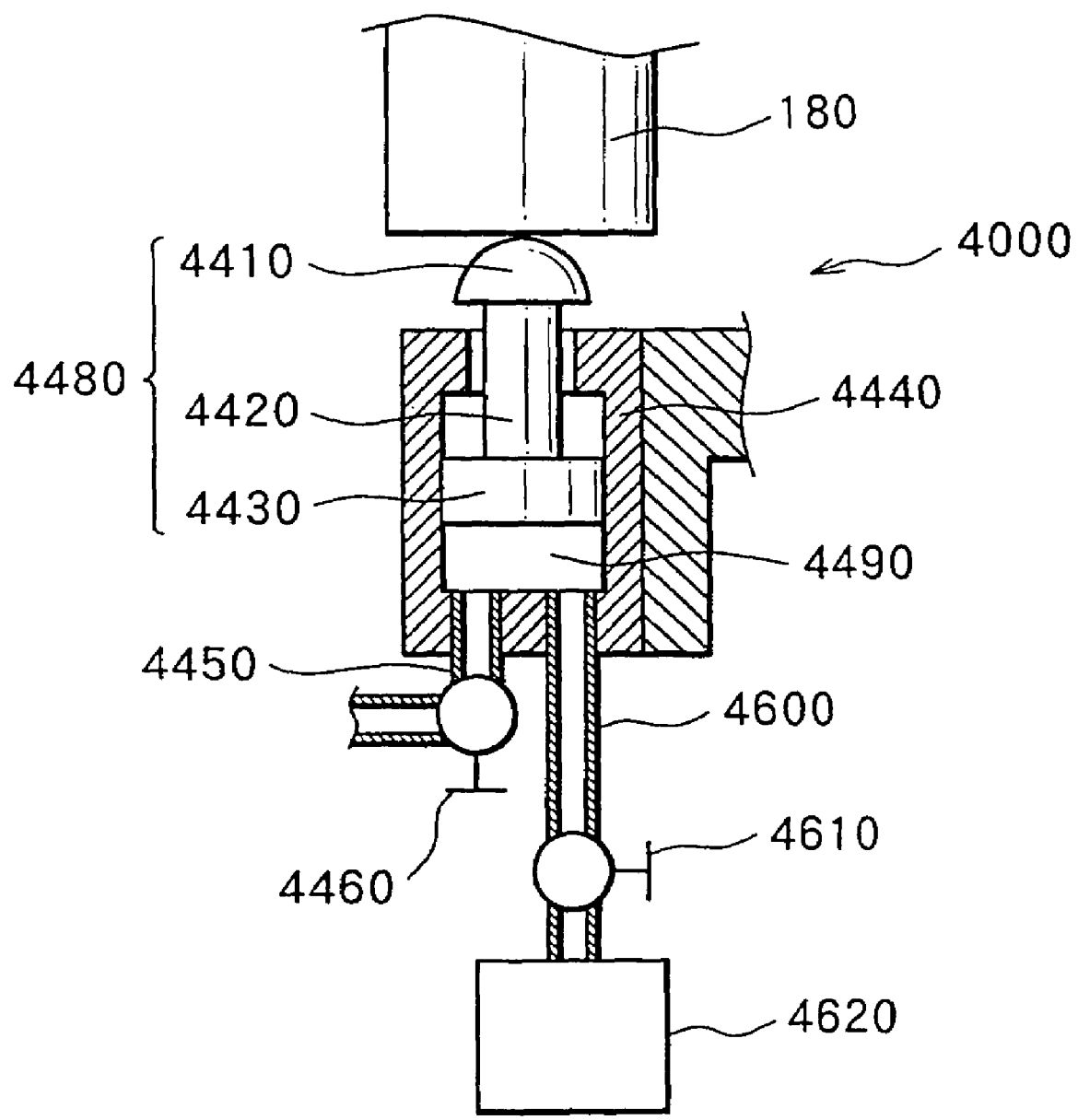
FIG. 43 is a view showing the second modification of the abrupt operation prevention mechanism shown in FIG. 41.

Conversely, another arrangement may be employed, in which the pressure chamber 4490 is filled with the fluid via the channel 4450 and valve 4460, as shown in FIG. 42, or the pressure chamber 4490 is filled with the fluid via another channel, as shown in FIG. 43, to extend the piston 4430.

FIG. 42 is a view showing a modification of the abrupt operation prevention mechanism 4000 shown in FIG. 41. FIG. 42 shows an abrupt operation prevention mechanism in which the pressure chamber 4490 is filled with the fluid via the channel 4450 used to discharge the fluid from the pressure chamber 4490. In the abrupt operation prevention mechanism 4000 with this arrangement, when separation processing is to be executed, a valve 4530 is opened, and a valve 4510 is closed to discharge the fluid in the pressure chamber 4490 via the channel 4450, valve 4460, channel 4500, and valve 4530. To extend the movable portion 4480, the valve 4530 is closed, and the valve 4510 is opened to fill the pressure chamber 4490 with the fluid by a pressure source 4520.

FIG. 43 is a view showing another modification of the abrupt operation prevention mechanism 4000 shown in FIG. 41. FIG. 43 shows an abrupt operation prevention mechanism having a channel 4600 for filling the pressure chamber 4490 with the fluid in addition to the channel 4450 used to discharge the fluid from the pressure chamber 4490. In the abrupt operation prevention mechanism 4000 with this arrangement, when separation processing is to be executed, the valve 4460 is adjusted to a desired opening degree, and a valve 4610 is closed to discharge the fluid in the pressure chamber 4490 via the channel 4450 and valve 4460. To extend the movable portion 4480, the valve 4460 is closed, and the valve 4610 is opened to fill the pressure chamber 4490 with the fluid by a pressure source 4620.

This abrupt operation prevention mechanism 4000 prevents the bonded substrate stack 50 from abruptly warping in the axial direction but allows it to moderately warp, as described above. The abrupt operation prevention mechanism 4000 effectively prevents any defects on the first substrate side or second substrate side in separation processing of the bonded substrate stack 50 and, more particularly, at the final stage of separation processing. The reason for this will be described below.

Already separated portions of the bonded substrate stack 50 warp in the axial direction of the bonded substrate stack 50 due to the pressure of the jet medium injected between the already separated portions. In accordance with the degree of this warp, the lower substrate holding portion 280 moves in the direction in which it is separated from the upper substrate holding portion 270, i.e., downward. As separation progresses and reaches the central portion of the bonded substrate stack 50, the warp amount becomes large, and the moving amount of the lower substrate holding portion 280 increases accordingly.

When separation further progresses and reaches the final stage, the bonding force of the unseparated portions of the bonded substrate stack 50 (force for bonding the first substrate side and the second substrate side) abruptly becomes smaller than the separation force of the bonded substrate stack by the jet medium (force acting to peel the bonded substrate stack into two substrates).

In a separating apparatus without any abrupt operation prevention mechanism 4000, the bonding force cannot stand the separation force, and the lower substrate holding portion 280 instantaneously abruptly moves. At this time, the unseparated regions of the bonded substrate stack 50 are peeled at once, and this may generate a defect on the first or second substrate side.

The separating apparatus 5000 according to the 21st embodiment has the abrupt operation prevention mechanism 4000 that prevents the above-described abrupt operation of the substrate holding portion 280. As a consequence, any defect on the first or second substrate side can be prevented. The abrupt operation prevention mechanism 4000 allows the substrate holding portion 280 to moderately move in separation. Hence, already separated portions of the bonded substrate stack 50 warp in the axial direction of the bonded substrate stack 50 in separation, and the bonded substrate stack 50 can be efficiently separated.

The abrupt operation prevention mechanism 4000 preferably has a structure capable of preventing knocking when the movable portion 4480 moves, i.e., a structure having less frictional resistance. When knocking occurs, the lower substrate holding portion 280 moves stepwise. For this reason, separation of the bonded substrate stack 50 progresses stepwise, and this may generate a defect on the first or second substrate side.

The abrupt operation prevention mechanism 4000 is preferably coaxial with the rotating shaft 180. With this arrangement, the substrate holding portion 280 and substrate holding portion 280 can be smoothly rotated.

A vacuum line 181 for vacuum-chucking the bonded substrate stack 50 on the substrate holding portion 280 extends through the rotating shaft 180. The vacuum line 181 is connected to an external vacuum line via a ring 190. The external vacuum line has a solenoid valve (not shown) The solenoid valve is ON/OFF-controlled by the control section (not shown) as needed.

The substrate holding portion 280 has a suction hole 281 for vacuum-chucking the bonded substrate stack 50. The suction hole 281 is connected to the vacuum line 181. The suction hole 281, vacuum line 181, and solenoid valve construct the vacuum chuck mechanism of the substrate holding portion 280.

The lower table 240 is supported by a plurality of leg members 310. The upper table 170 is supported on the lower table 240.

The nozzle 260 is attached to, e.g., the lower table 240 via a support member (not shown). In the separating apparatus 5000 of the 21st embodiment, the position of the nozzle 260 is controlled with reference to the position of the upper substrate holding portion 270. A shutter 251 driven by a motor 250 is inserted between the nozzle 260 and the substrate holding portions 270 and 280. When the shutter 251 is open, and a jet is ejected from the nozzle 260, the jet can be injected into the bonded substrate stack 50. When the shutter 251 is closed, jet injection into the bonded substrate stack 50 can be stopped.

In the separating apparatus 5000, since the upper substrate holding portion 270 does not move in the vertical direction, an abrupt operation prevention mechanism for preventing the abrupt operation of the upper substrate holding portion 270 is unnecessary. However, when a substrate holding portion moving in the vertical direction is employed as the upper substrate holding portion 270, an abrupt operation prevention mechanism for preventing the abrupt operation of the upper substrate holding portion 270 is preferably prepared.

Procedures of separation processing of a bonded substrate stack by the separating apparatus 5000 will be described below. First, the air cylinder 320 retracts the piston rod to form an appropriate gap between substrate holding portions 270 and 280. In this state, the bonded substrate stack 50 is horizontally supported by the robot hand 400 from the lower side and inserted to a predetermined position between the substrate holding portions 270 and 280.

The air cylinder 320 extends the piston rod to move the lower substrate holding portion 280 upward. The substrate holding portion 280 presses and holds the bonded substrate stack 50.

The movable portion 4480 of the abrupt operation prevention mechanism 4000 is moved upward to abut the contact member 4410 of the movable portion 4480 against the lower end of the rotating shaft 180.

The motor 110 is actuated to transmit the rotational force to the rotating shaft 146. The rotating shaft 140, substrate holding portion 270, bonded substrate stack 50, substrate holding portion 280, and rotating shaft 180 rotate integrally.

While keeping the shutter 251 closed, a pump (not shown) connected to the nozzle 260 is actuated to feed a high-pressure jet medium (e.g., water) to the nozzle 260. A high-pressure jet is ejected from the nozzle 260. When the jet stabilizes, the shutter 251 is opened. The jet ejected from the nozzle 260 is continuously injected into the porous layer of the bonded substrate stack 50 to start separating the bonded substrate stack 50.

Separation of the bonded substrate stack 50 progresses spirally from the outer peripheral portion to the central portion. More specifically, separation of the bonded substrate stack 50 progresses such that the boundary between the already separated region (separated region) and the region that has not been separated (unseparated region) draws a spiral locus.

The separated region warps due to the pressure of the injected jet medium. When separation progresses, and the warp becomes large to some degree, the substrate holding portion 280 is pressed by the bonded substrate stack and starts moving downward. Movement of the substrate holding portion 280 is controlled by the abrupt operation prevention mechanism 4000, as described above. More specifically, the substrate holding portion 280 moderately moves but does not move abruptly. Hence, the above-described defect due to abrupt movement of the substrate holding portion 280 can be effectively prevented.

The characteristics of the abrupt operation prevention mechanism 4000 may be changed in accordance with the progress of separation by controlling the opening degree of the valve 4460 in accordance with the progress of separation. The opening degree of the valve 4460 may be adjusted in accordance with the characteristics (e.g., the diameter or thickness) of the bonded substrate stack 50 to be processed or separation processing condition (e.g., jet pressure or jet diameter).

When separation of the bonded substrate stack 50 is ended, the shutter 251 is closed, and the pump connected to the nozzle 260 is stopped to stop jet injection into the bonded substrate stack 50. The operation of the motor 110 is also stopped.

The vacuum chuck mechanisms of the substrate holding portions 270 and 280 are actuated (solenoid valves are open) to cause the substrate holding portion 270 to vacuum-chuck the upper separated substrate and the substrate holding portion 280 to vacuum-chuck the lower separated substrate.

The air cylinder 320 retracts the piston rod to form a predetermined gap between the substrate holding portions 270 and 280. The two separated substrates are spaced apart from each other.

The robot hand 400 is inserted between the substrate and the substrate holding portion 270. The robot hand 400 chucks the substrate. After that, chuck by the vacuum chuck mechanism of the substrate holding portion 270 is canceled. The substrate is transferred from the substrate holding portion 270 to the robot hand 400. The robot hand 400 conveys the substrate to a predetermined position (e.g., a cassette).

The robot hand 400 is inserted between the substrate and the substrate holding portion 280. The robot hand 400 chucks the substrate. After that, chuck by the vacuum chuck mechanism of the substrate holding portion 280 is canceled. The substrate is transferred from the substrate holding portion 280 to the robot hand 400. The robot hand 400 conveys the substrate to a predetermined position (e.g., a cassette). The two separated substrates may be received by the robot hand in the reverse order or simultaneously received by two robot hands (not shown).

After the bonded substrate stack 50 is separated into two substrates, the jet medium is present between the two substrates. When the jet medium is a liquid (e.g., water), the surface tension is considerably large. Hence, to space the two substrates apart from each other with a small force, a jet is preferably supplied from the nozzle 260 to the gap between the two substrates. In this case, the jet from the nozzle 260 is stopped after the two substrates are spaced apart from each other. Instead, a mechanism for ejecting a jet used to space the two substrates apart from each other may be independently prepared.

22nd Embodiment

Figure 31:
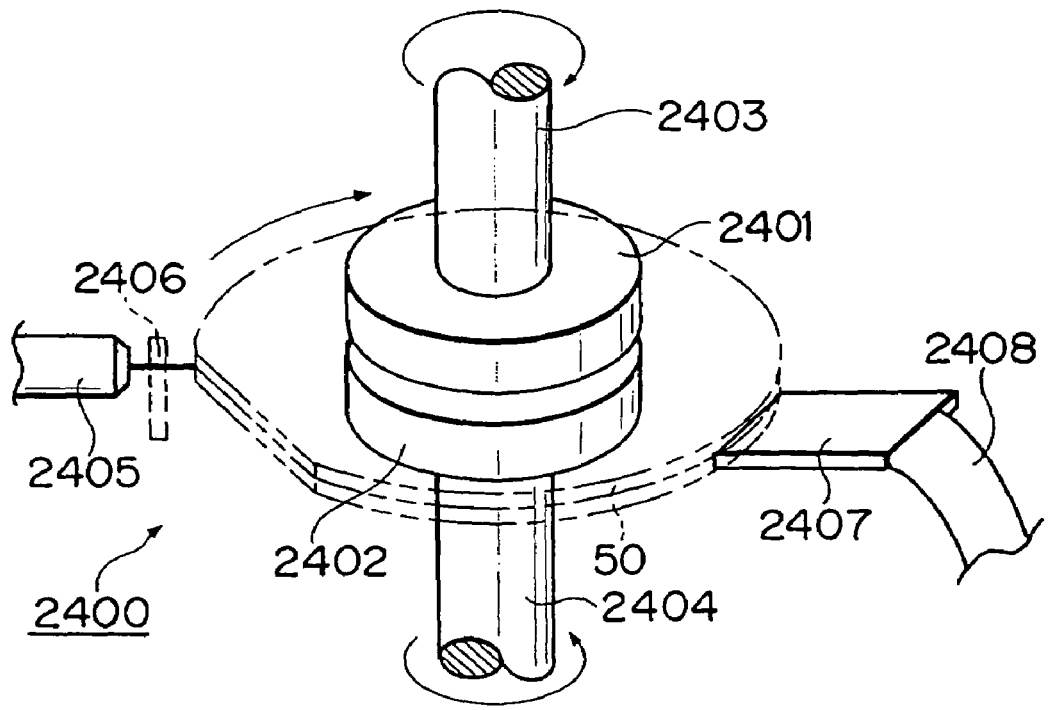
FIG. 31 is a view showing the schematic arrangement of a separating apparatus according to the 22nd embodiment of the present invention.
Figure 32:
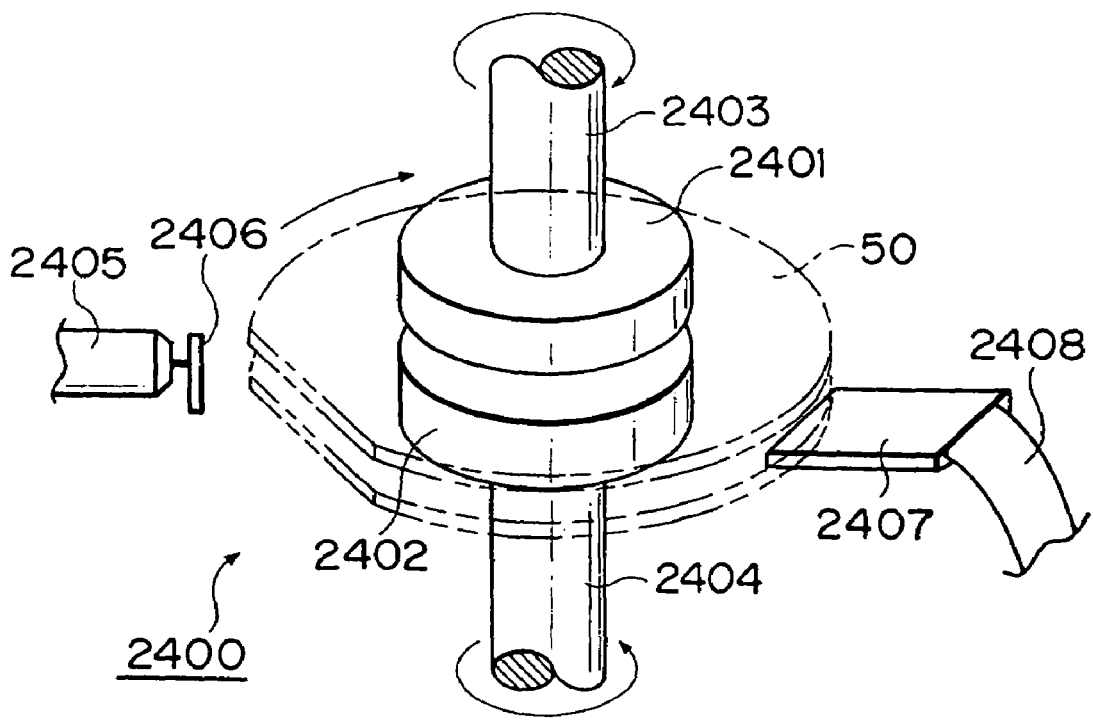
FIG. 32 is a view showing the schematic arrangement of the separating apparatus according to the 22nd embodiment of the present invention.

FIGS. 31 and 32 are views showing the schematic arrangement of a separating apparatus according to the 22nd embodiment of the present invention. A separating apparatus 2400 combines a separating apparatus represented by one of the above-described embodiments with a cleaning apparatus.

As a representative separating apparatus, a separating apparatus will be exemplified in which a pair of substrate holding portions 2401 and 2402 horizontally hold and rotate a bonded substrate stack 50, and a jet is ejected from a nozzle 2405 toward the porous layer of the bonded substrate stack 50, thereby separating the bonded substrate stack 50 into two substrates at the porous layer. In this separating apparatus, the substrate holding portions 2401 and 2402 are coupled to rotating shafts 2403 and 2404, respectively. A rotational force is transmitted to the substrate holding portions via at least one of the rotating shafts.

A shutter 2406 is inserted between the nozzle 2405 and the substrate holding portions 2401 and 2402. The shutter 2406 need not always be prepared. Jet injection into the bonded substrate stack 50 can be controlled not by using the shutter 2406 but by, e.g., moving the nozzle 2405 or controlling a pump connected to the nozzle 2405 (this also applies to the remaining embodiments).

The cleaning apparatus ejects a cleaning solution supplied from a supply line 2408 of the cleaning solution (e.g., water) from a cleaning nozzle 2407 to the bonded substrate stack 50.

An example of processing procedures by this separating apparatus will be described below. First, the pair of substrate holding portions 2401 and 2402 horizontally hold and rotate the bonded substrate stack 50. As shown in FIG. 31, a jet is ejected from the nozzle 2405, and the shutter 2406 is open. The jet is injected into the porous layer of the bonded substrate stack 50 to start separating the bonded substrate stack 50.

The bonded substrate stack 50 may be separated while the cleaning solution is ejected from the cleaning nozzle 2407 to clean the bonded substrate stack 50.

When separation of the bonded substrate stack 50 is ended, the shutter 2406 is closed. After that, jet ejection from the nozzle 2405 is stopped (operation of the pump is stopped).

As shown in FIG. 32, in the state wherein the substrate holding portions 2401 and 2402 are rotated or stopped, the separated substrates are chucked by the substrate holding portions 2401 and 2402 and spaced apart from each other.

The cleaning solution is ejected from the cleaning nozzle 2407 to clean the two separated substrates.

According to this separating apparatus, separation processing of the bonded substrate stack 50 and cleaning of the separated substrates can be efficiently performed.

23rd Embodiment

Figure 33:
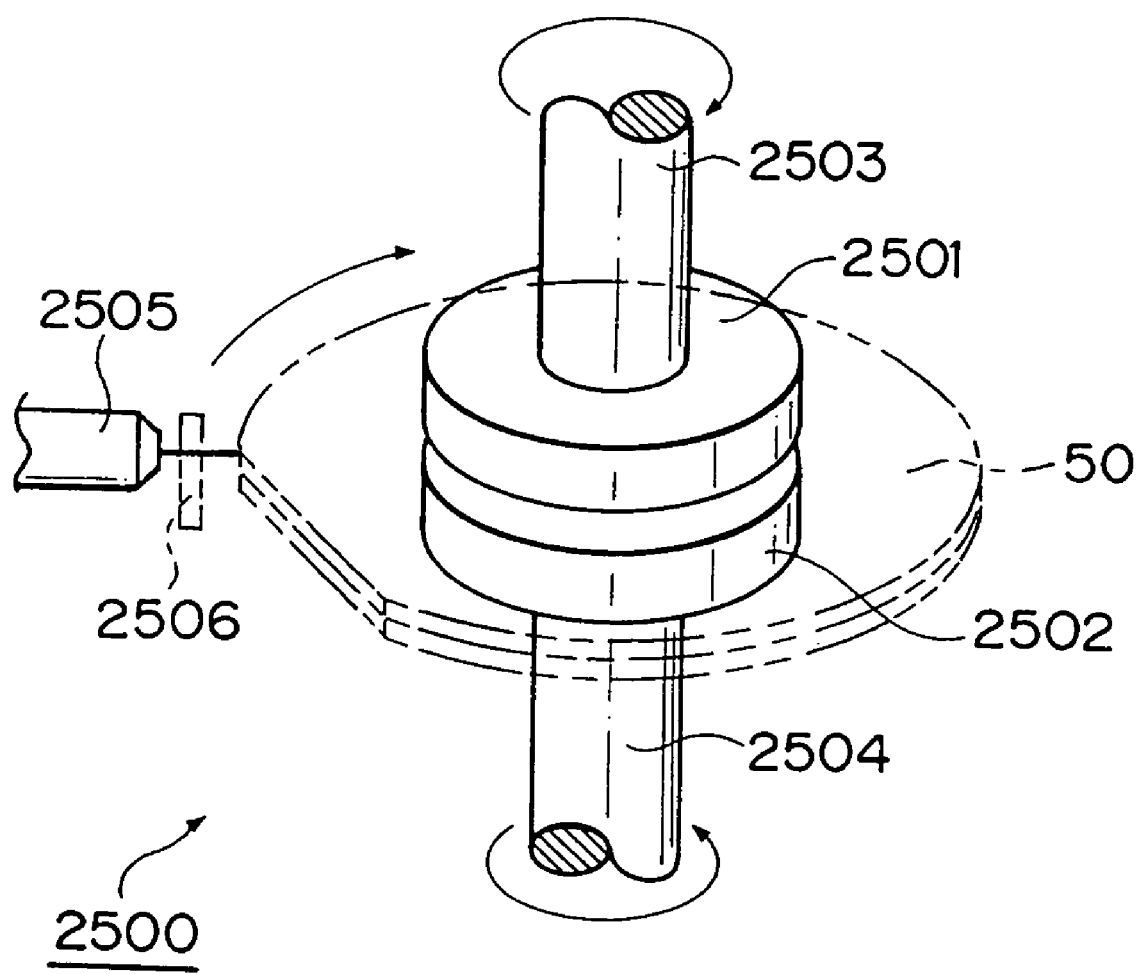
FIG. 33 is a view showing the schematic arrangement of a separating apparatus according to the 23rd embodiment of the present invention.
Figure 34:
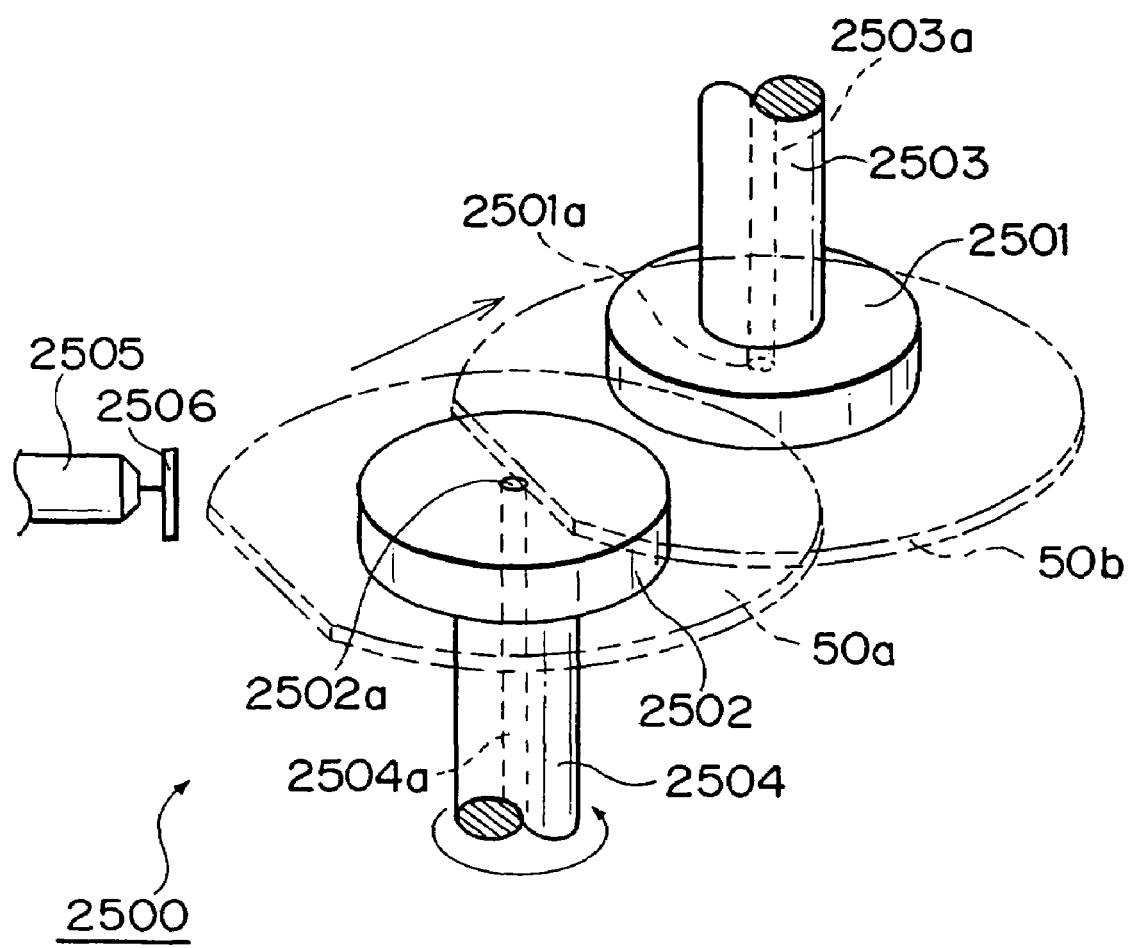
FIG. 34 is a view showing the schematic arrangement of a separating apparatus according to the 24th embodiment of the present invention.

FIGS. 33 and 34 are views showing the schematic arrangement of a separating apparatus according to the 23rd embodiment of the present invention. In a separating apparatus 2500, a pair of holding portions 2501 and 2502 horizontally hold a bonded substrate stack 50. After the bonded substrate stack 50 is separated into two substrates by a jet ejected from a nozzle 2505, one or both of the substrate holding portions 2501 and 2502 are moved in the horizontal direction to space the separated substrates apart from each other.

The substrate holding portions 2501 and 2502 are coupled to rotating shafts 2503 and 2504, respectively. A rotational force is transmitted to the substrate holding portions via at least one of the rotating shafts. The substrate holding portions 2501 and 2502 have suction holes 2501a and 2502a for vacuum-chucking the bonded substrate stack 50, respectively. The suction holes 2501a and 2502a are connected to vacuum lines 2503a and 2504a in the rotating shafts 2503 and 2504, respectively. A shutter 2506 is inserted between the nozzle 2505 and the substrate holding portions 2501 and 2502.

Procedures of separation processing by the separating apparatus 2500 will be described below. First, as shown in FIG. 33, the pair of substrate holding portions 2501 and 2502 horizontally hold the bonded substrate stack 50. At least one of the rotating shafts 2503 and 2504 is rotated to rotate the bonded substrate stack 50. Next, as shown in FIG. 33, a jet is ejected from the nozzle 2505, and the shutter 2506 is opened. The jet is injected into the porous layer of the bonded substrate stack 50 to start separating the bonded substrate stack 50.

When separation of the bonded substrate stack 50 is ended, the shutter 2506 is closed. After that, jet ejection from the nozzle 2505 is stopped (operation of the pump is stopped).

As shown in FIG. 34, in the state wherein the substrate holding portions 2501 and 2502 are rotated or stopped, one or both of the pair of substrate holding portions 2501 and 2502 are moved in the horizontal direction to space the separated substrates apart from each other. When one or both of the pair of substrate holding portions 2501 and 2502 are moved in the horizontal direction along the separated surface of the bonded substrate stack 50, the two substrates can be easily spaced apart from each other independently of the influence of the surface tension acting between the two substrates.

24th Embodiment

This embodiment provides various separating methods with an emphasis on the relationship between a bonded substrate stack and a nozzle for ejecting a jet in separation processing. Although the following separating methods are suitable for separating a horizontally held bonded substrate stack, they can be applied to separate a bonded substrate stack held at another angle (e.g., vertically).

In the first separating method, a jet is injected into the porous layer of a bonded substrate stack in parallel to the porous layer, and simultaneously, the bonded substrate stack is rotated about substantially the center of the bonded substrate stack, as described in the above embodiments.

Figure 35:
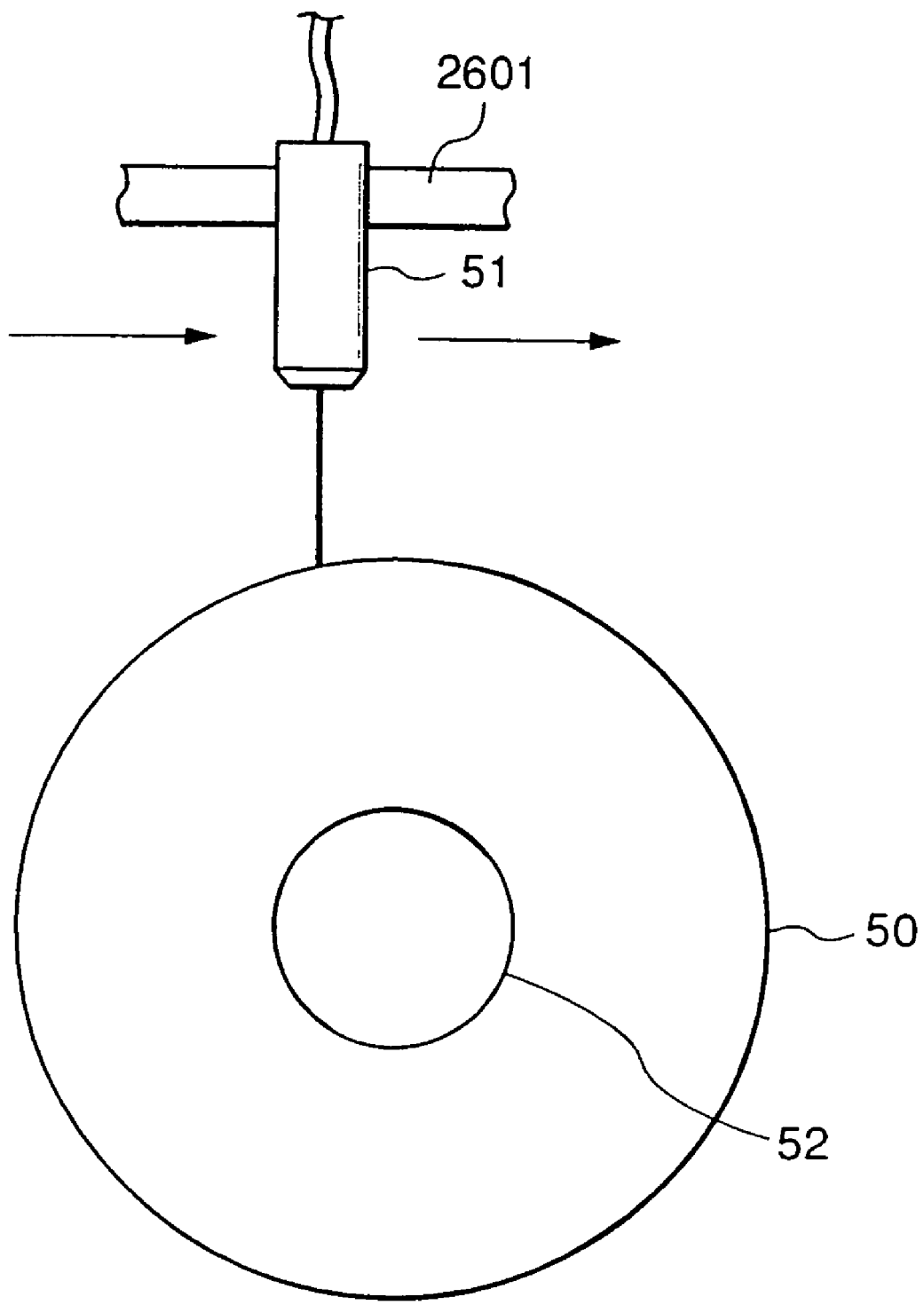
FIG. 35 is a view showing an example of various separating methods with an emphasis on the relationship between a bonded substrate stack and a nozzle for ejecting a jet.

In the second separating method, as shown in FIG. 35 (plan view), a jet is injected into the porous layer of a bonded substrate stack 50 in parallel to the porous layer, and simultaneously, a nozzle 51 is scanned along the porous layer by a driving mechanism 2601.

In the third separating method, as shown in FIG. 36 (plan view), a jet is injected into the porous layer of a bonded substrate stack 50 in parallel to the porous layer, and simultaneously, a table 2602 on which a holding portion 52 of the bonded substrate stack 50 is mounted is moved by a driving mechanism 2603 to scan the bonded substrate stack 50.

In the fourth separating method, as shown in FIGS. 37A and 37B (plan views), a jet is injected into the porous layer of a bonded substrate stack 50 in parallel to the porous layer, and simultaneously, a rotating shaft 2604 is pivoted to pivot the nozzle 51 fixed to the rotating shaft 2604 and scan the jet such that the jet draws a sector-shaped locus.

Figure 38:
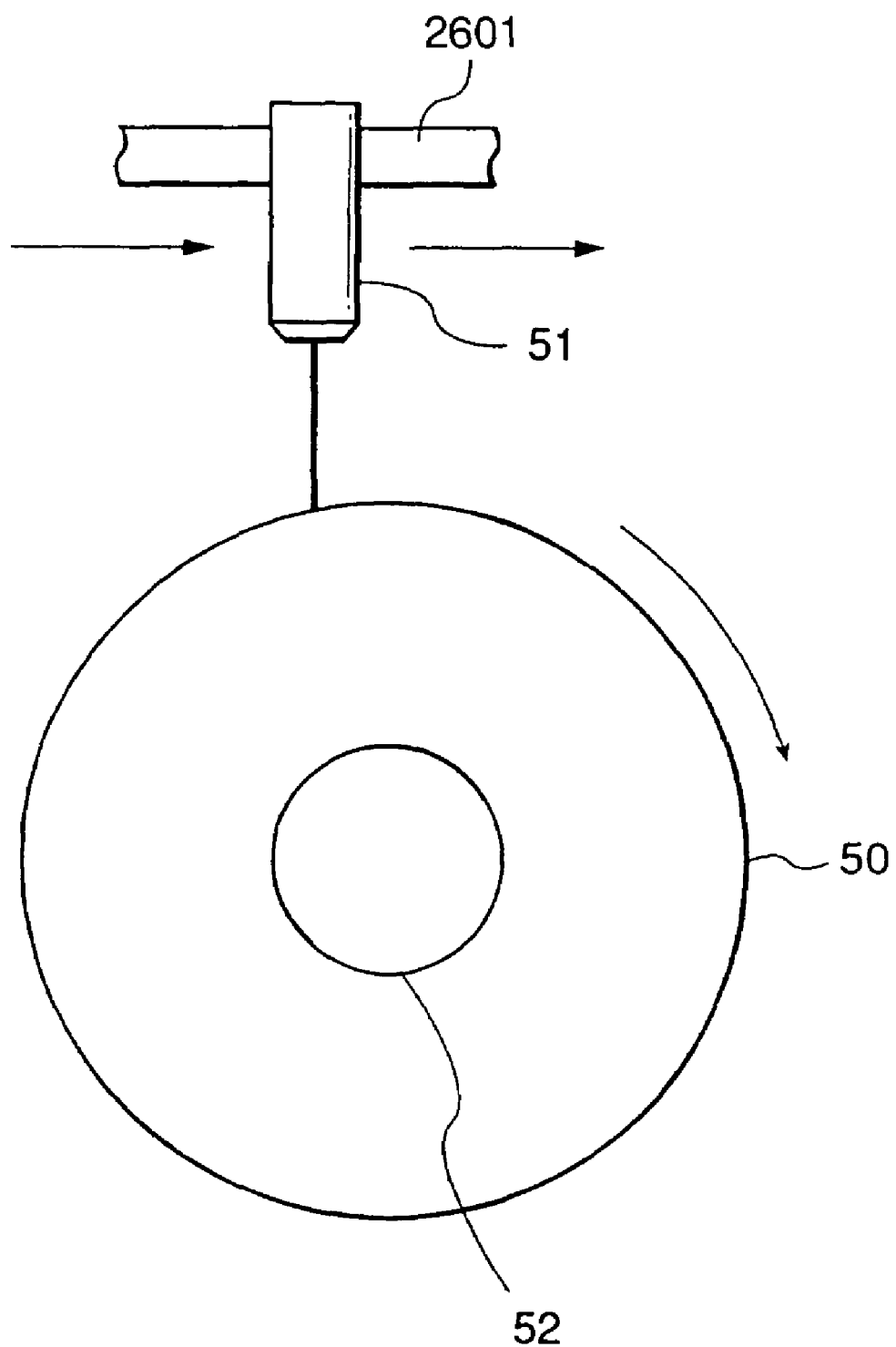
FIG. 38 is a view showing still another example of various separating methods with an emphasis on the relationship between a bonded substrate stack and a nozzle for ejecting a jet.

In the fifth separating method, as shown in FIG. 38 (plan view), a jet is injected into the porous layer of a bonded substrate stack 50 in parallel to the porous layer, and simultaneously, the nozzle 51 is scanned along the porous layer by the driving mechanism 2601 while the holding portion 52 is rotated to rotate the bonded substrate stack 50.

All the above separating methods can be applied to the separating apparatuses of the above embodiments. However, another separating method may be applied.

25th Embodiment

Figure 39:
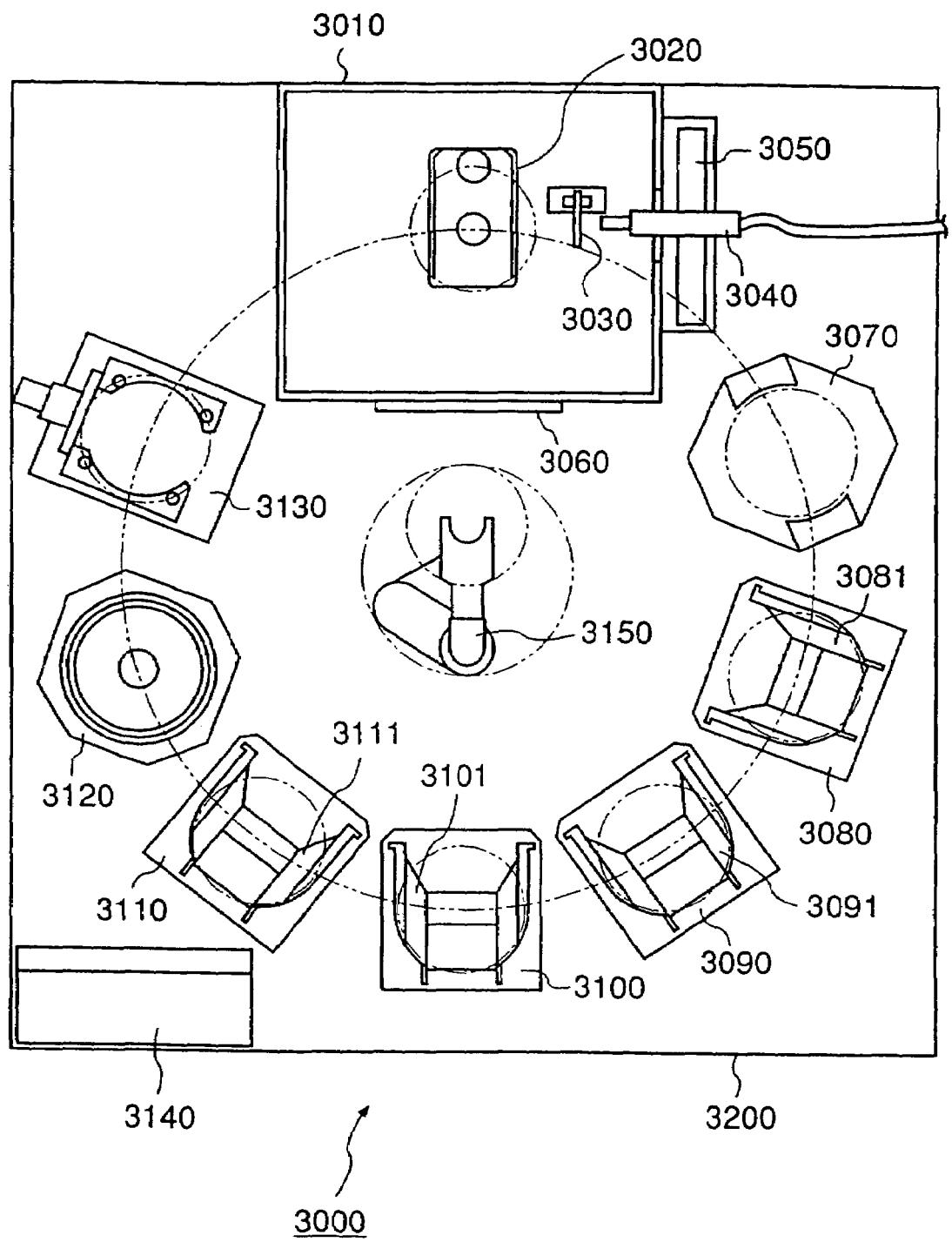
FIG. 39 is a plan view showing the schematic arrangement of a separating system according to the 25th embodiment of the present invention.

FIG. 39 is a plan view showing the schematic arrangement of a separating system according to the 25th embodiment of the present invention. A separating system 3000 of this embodiment has, as a separating apparatus 3020, a separating apparatus represented by one of the above embodiments.

A separating system 3000 has a scalar robot 3150 at a predetermined position (e.g., at the center) on a support table 3200. Various processing apparatuses are disposed around the scalar robot 3150 at substantially equidistant positions separated from the scalar robot 3150. More specifically, in this embodiment, a loader 3080, centering apparatus 3070, separating apparatus 3020, turning apparatus 3130, cleaning/drying apparatus 3120, third unloader 3110, second unloader 3100, and first unloader 3090 are disposed at substantially equidistant positions separated from the scalar robot 3150.

Before processing, a first cassette 3081 storing one or a plurality of bonded substrate stacks is placed on the loader 3080. Before processing, empty cassettes 3091, 3101, and 3111 are placed on the first unloader 3090, second unloader 3100, and third unloader 3110, respectively.

The centering apparatus 3070 receives a bonded substrate stack from the scalar robot 3150, executes processing (centering) for aligning the center of the bonded substrate stack at a predetermined position, and then transfers the bonded substrate stack to the scalar robot 3150.

The separating apparatus 3020 is disposed in a chamber 3010 to prevent the jet medium (e.g., water) to be described later from scattering to the peripheral portion. The chamber 3010 has a shutter 3060 through which the robot hand of the scalar robot 3150 enters/leaves the chamber. The separating apparatus 3020 has a nozzle 3040 for ejecting a jet. The position of the nozzle 3040 is controlled by an orthogonal robot 3050.

The turning apparatus 3130 rotates the upper substrate of two separated substrates through 180° to turn the substrate (direct the separated surface upward). The cleaning/drying apparatus 3120 cleans and dries separated substrates.

The separating system 3000 executes separation processing of a bonded substrate stack on the basis of an instruction from an operation panel 3140.

Procedures of separation processing by this processing system 3000 will be described below. First, the cassette 3081 storing bonded substrate stacks to be processed is placed at a predetermined position on the loader 3080 manually or automatically. The empty cassettes 3091, 3101, and 3111 are placed on the first unloader 3090, second unloader 3100, and third unloader 3110, respectively. In this embodiment, the cassette 3091 is used to store upper separated substrates, the cassette 3101 is used to store lower separated substrates, and the cassette 3111 is used to store bonded substrate stacks (or separated substrates) for which separation has failed. The cassette 3081 is placed on the loader 3080 such that the stored bonded substrate stacks become horizontal. The cassette 3091, 3101, and 3111 are placed on the first unloader 3090, second unloader 3100, and third unloader 3120, respectively, such that substrates can be stored in a horizontal state.

The scalar robot 3150 chucks the lowermost bonded substrate stack in the cassette 3081, extracts the bonded substrate stack, and transfers it to the centering apparatus 3070 while maintaining the horizontal state. The centering apparatus 3070 centers the bonded substrate stack and transfers it to the scalar robot 3150.

The shutter 3060 of the chamber 3010 is opened to transfer the centered bonded substrate stack from the scalar robot 3150 to the separating apparatus 3020 while maintaining the horizontal state. The bonded substrate stack has already been centered. For this reason, when the robot hand of the scalar robot 3150 is moved to a predetermined position to transfer the bonded substrate stack to the separating apparatus 3020, the bonded substrate stack can be positioned to the separating apparatus.

The shutter 3060 of the chamber 3010 is closed, and separation processing is executed by the separating apparatus 3020. More specifically, the separating apparatus 3020 ejects a jet from the nozzle 3040 to the porous layer of the bonded substrate stack while rotating the bonded substrate stack held in the horizontal state, and separates the bonded substrate stack into two substrates at the porous layer by the jet.

The shutter 3060 of the chamber 3010 is opened, and the scalar robot 3150 receives the upper separated substrate from the separating apparatus 3020 and transfers the substrate to the turning apparatus 3130. The scalar robot 3150 preferably receives the upper separated substrate and transfers it to the turning apparatus 3130 while chucking the upper portion of the substrate. With this arrangement, chips sticking to the separated surface rarely stick to the robot hand of the scalar robot 3150. The turning apparatus 3130 rotates the received substrate through 180°, i.e., turns the substrate and transfers it to the scalar robot 3150. In place of the turning apparatus 3130, a mechanism for rotating the robot hand of the scalar robot 3150 through 180° may be prepared, and the substrate may be turned by rotating the robot hand through 180°.

The scalar robot 3150 transfers the turned substrate to the cleaning/drying apparatus 3120. The scalar robot 3150 preferably receives the substrate from the turning apparatus 3130 and transfers the substrate to the cleaning/drying apparatus 3120 while supporting the substrate from the lower surface in the horizontal state. This prevents the substrate from dropping. The cleaning/drying apparatus 3120 cleans and dries the received substrate and transfers it to the scalar robot 3150 in the horizontal state.

The scalar robot 3150 stores the cleaned and dried substrate in the cassette 3091 on the first unloader 3090. The scalar robot 3150 preferably receives the substrate from the cleaning/drying apparatus 3120 and stores it in the cassette 3091 while supporting the substrate from the lower side in the horizontal state. This prevents the substrate from dropping.

The scalar robot 3150 receives the lower separated substrate from the separating apparatus 3020 and transfers the substrate to the cleaning/drying apparatus 3120. The scalar robot 3150 preferably receives the substrate and transfers it to the cleaning/drying apparatus 3120 while supporting the substrate from the lower side in the horizontal state. This prevents the substrate from dropping. The cleaning/drying apparatus 3120 cleans and dries the received substrate and transfers it to the scalar robot 3150 in the horizontal state.

The scalar robot 3150 stores the cleaned and dried substrate in the cassette 3111 on the second unloader 3100. The scalar robot 3150 preferably receives the substrate from the cleaning/drying apparatus 3120 and stores the substrate in the cassette 3111 while supporting the substrate from the lower side in the horizontal state. This prevents the substrate from dropping.

Operation of the separating system 3000 for one bonded substrate stack has been described above. In the separating system 3000, a plurality of bonded substrate stacks can be parallelly processed. For example, while the first bonded substrate stack is transferred from the centering apparatus 3070 to the separating apparatus 3020 and is being separated by the separating apparatus 3020, the second bonded substrate stack is extracted from the cassette 3081 on the loader 3080, transferred to the centering apparatus 3070, and centered. That is, in the separating system 3000, centering processing by the centering apparatus 3070, separation processing by the separating apparatus 3020, turning processing by the turning apparatus 3130, and cleaning/drying processing by the cleaning/drying apparatus 3120 can be parallelly executed.

In the separating system 3000, the scalar robot 3150 stores a substrate for which separation has failed in the cassette 3111 on the third unloader 3110 in accordance with an instruction input from the operator via the operation panel 3140. Instead of recognizing a separation failure in accordance with an instruction from the operator, a separation state monitor apparatus may be prepared to detect a separation failure.

According to this embodiment, since the bonded substrate stack or separated substrate is conveyed in the horizontal state, the scalar robot 3150 having a relatively simple structure can be employed as the conveyor mechanism.

In addition, according to this embodiment, since the apparatuses are disposed at substantially equidistant positions separated from the scalar robot 3150, the bonded substrate stack or separated substrate can be efficiently conveyed among the apparatuses.

According to the present invention, since the sample is horizontally held, drop of, e.g., a plate-like sample can be prevented, and separation processing can executed at a high yield.

The present invention is not limited to the above embodiments and various changes and modifications can be made within the spirit and scope of the present invention. Therefore, to apprise the public of the scope of the present invention, the following claims are made.

What is claimed is:

1. A separating apparatus for separating a plate shaped sample having a separation layer at the separation layer, comprising:

a holding mechanism having a convex support portion for holding the plate shaped sample at a central portion thereof;

an ejection portion for ejecting a fluid to the plate shaped sample held by said holding mechanism to separate the plate shaped sample at the separation layer using the fluid;

an abrupt operation prevention mechanism for preventing the plate shaped sample from abruptly warping in an axial direction due to a force of the fluid acting in the plate shaped sample while allowing the plate shaped sample to moderately warp when separating the plate shaped sample.

2. The apparatus according to claim 1, wherein said abrupt operation prevention mechanism comprises a damper mechanism.

3. The apparatus according to claim 1, further comprising a rotating mechanism for rotating said holding mechanism about an axis substantially perpendicular to a fluid ejection direction of said ejection portion when separating the plate shaped sample.

4. The apparatus according to claim 3, wherein said abrupt operation prevention mechanism is coaxial with said holding mechanism.

5. The apparatus according to claim 1, wherein said holding mechanism comprises a pair of sample holding portions for sandwiching and holding the plate shaped sample, at least one of said pair of sample holding portions can move in a direction substantially perpendicular to the fluid ejection direction of said ejection portion, and said abrupt operation prevention mechanism prevents said movable sample holding portion from abrupt movement while allowing said movable sample holding portion to moderately move when separating the plate shaped sample.

6. The apparatus according to claim 5, wherein said abrupt operation prevention mechanism comprises
   a movable portion which moves in contact with said movable sample holding portion, and
   a reaction generation portion for generating a reaction against a force applied from said movable sample holding portion to said movable portion.

7. The apparatus according to claim 6, wherein said movable portion smoothly moves.

8. The apparatus according to claim 6, wherein said movable portion comprises a piston, said reaction generation portion comprises a frame member constructing a pressure chamber for causing pressure to act on said piston, and said frame member has a channel for discharging a fluid from said pressure chamber.

9. The apparatus according to claim 8, wherein said abrupt operation prevention mechanism has a valve for controlling the fluid flowing through the channel.

10. The apparatus according to claim 8, wherein said abrupt operation prevention mechanism further comprises a restoring mechanism for extending said piston retracted into said frame member and simultaneously filling said pressure chamber with the fluid when separating the plate shaped sample.

11. The apparatus according to claim 10, wherein said restoring mechanism has a spring, and said piston is extended by a force of the spring to fill said pressure chamber with the fluid.

12. The apparatus according to claim 10, wherein said restoring mechanism comprises a filling mechanism for filing said pressure chamber with the fluid, and said piston is extended by filling said pressure chamber with the fluid by said filling mechanism.

13. The apparatus according to claim 1, wherein said holding mechanism further comprises a press mechanism for applying a press force to the plate shaped sample in a direction substantially perpendicular to the fluid ejection direction of said ejection portion when holding the plate shaped sample.

14. The apparatus according to claim 1, wherein said apparatus further comprises a driving portion for changing a position where the fluid ejected from said ejection portion is injected into the plate shaped sample, and the plate shaped sample is separated while changing the position.

15. The apparatus according to claim 14, wherein said driving portion comprises a motor for rotating the plate shaped sample about an axis substantially perpendicular to the fluid ejection direction of said ejection portion.

16. The apparatus according to claim 1, wherein the separation layer is a fragile layer.

17. The apparatus according to claim 16, wherein the fragile layer is a porous layer.

18. The apparatus according to claim 16, wherein the fragile layer is a microcavity layer.

19. The apparatus according to claim 1, wherein the plate shaped sample to be separated is a semiconductor substrate.

20. The apparatus according to claim 2, wherein the plate shaped sample to be separated is formed by bonding a first substrate and a second substrate.

21. The apparatus according to claim 1, wherein said holding mechanism comprises first and second sample holding portions for sandwiching and holding the plate shaped sample, said second sample holding portion is so supported that said second sample holding portion can move along an axis substantially perpendicular to the fluid ejection direction of said ejection portion and can rotate about the axis, and said abrupt operation prevention mechanism prevents said second sample holding portion from abrupt movement while allowing said second sample holding portion to moderately move when separating the plate shaped sample, and wherein the apparatus further comprises a driving portion for rotating said first sample holding portion about the axis to rotate the plate shaped sample, said second sample holding portion rotating with the plate shaped sample.

* * * * *